United States Patent
Kurihara et al.

[11] Patent Number: 5,859,960
[45] Date of Patent: Jan. 12, 1999

[54] SEMICONDUCTOR DISK APPARATUS HAVING A SEMICONDUCTOR MEMORY FOR A RECORDING MEDIUM

[75] Inventors: Takuya Kurihara; Yasuyoshi Sugesawa; Takashi Murayama; Hidetoshi Nishi, all of Yokohama, Japan

[73] Assignee: Fujitsu Limited, Kawasaki, Japan

[21] Appl. No.: 408,911

[22] Filed: Mar. 22, 1995

[30] Foreign Application Priority Data

May 18, 1994 [JP] Japan .................................. 6-103927

[51] Int. Cl.$^6$ ............................. G06F 11/00; G06F 11/20
[52] U.S. Cl. ............................. 395/182.05; 711/4; 711/5; 711/202; 711/206; 395/182.05; 395/183.01; 395/183.17
[58] Field of Search ............................. 395/427, 182.06, 395/185, 182.05, 183.01, 183.17; 341/95; 369/58; 711/41.5, 100, 202, 206

[56] References Cited

U.S. PATENT DOCUMENTS

| | | | |
|---|---|---|---|
| 4,148,098 | 4/1979 | McCreight et al. | 395/491 |
| 4,244,049 | 1/1981 | York et al. | 371/40 |
| 4,630,030 | 12/1986 | Roland | 341/95 |
| 4,754,396 | 6/1988 | Horst et al. | 395/680 |
| 4,870,643 | 9/1989 | Bultman et al. | 395/182.05 |
| 5,086,502 | 2/1992 | Peter | 395/182.06 |
| 5,276,867 | 1/1994 | Kenley et al. | 395/600 |
| 5,526,335 | 6/1996 | Masahiro | 369/58 |

FOREIGN PATENT DOCUMENTS

| | | |
|---|---|---|
| 0541992 | 5/1993 | European Pat. Off. . |
| 0541992A2 | 5/1993 | European Pat. Off. ......... G06F 12/06 |
| 3612730 | 8/1989 | Germany . |
| 61-165153 | 7/1986 | Japan . |
| 61-201356 | 9/1986 | Japan . |
| 62-19953 | 1/1987 | Japan . |
| 62-260223 | 11/1987 | Japan . |
| 267623 | 3/1990 | Japan . |
| 277927 | 3/1990 | Japan . |
| 3136169 | 6/1991 | Japan . |
| 3268020 | 11/1991 | Japan . |
| 4217017 | 8/1992 | Japan . |
| 4338815 | 11/1992 | Japan . |
| 695812 | 4/1994 | Japan . |

*Primary Examiner*—Eddie P. Chan
*Assistant Examiner*—Than V. Nguyen
*Attorney, Agent, or Firm*—Greer, Burns, & Crain, Ltd.

[57] ABSTRACT

Each semiconductor memory module is divided into a plurality of access control units, and a service adapter copies the contents of the memory of the semiconductor memory module in which a memory error has occurred, to a spare semiconductor memory module one access control unit at a time. It is thus possible to evacuate the contents of the memory of the semiconductor memory module in which the memory error has occurred without stopping the semiconductor disk apparatus simply by adding the spare semiconductor disk apparatus. Since the copying operation is executed one access control unit at a time, a resource manager can conduct exclusive control also one access control unit at a time. A host apparatus therefore can access an access control unit portion which is not the object of copying even in the process of copying. In other words, the copying operation exerts no deleterious influence on the access of the host apparatus.

11 Claims, 52 Drawing Sheets

FIG.2

| | | |
|---|---|---|
| RANGE 1 | LOGICAL ADDRESS | ←CTL |
| | PHYSICAL ADDRESS | |
| RANGE 2 | LOGICAL ADDRESS | |
| | PHYSICAL ADDRESS | |
| ⋮ | ⋮ | |
| RANGE n | LOGICAL ADDRESS | |
| | PHYSICAL ADDRESS | |

FIG.3

| RANGE | | VALID/INVALID |
|---|---|---|
| CYLINDER | TRACK | |
| | | |
| | | |
| | | |
| | | |
| | | |
| | | |
| | | |

CCT

FIG.7

| | | | | | | | | | | |
|---|---|---|---|---|---|---|---|---|---|---|
| CTLc | xxxx | MS3-00 | xxxx | MS3-01 | xxxx | MS3-02 | xxxx | MS3-03 | xxxx | MS3-04 | MS3
| | RANGE 11 | | RANGE 12 | | RANGE 13 | | RANGE 14 | | RANGE 15 | |

| | | | | | | | | | | |
|---|---|---|---|---|---|---|---|---|---|---|
| CTLb | xxxx | HS-00 | xxxx | HS-01 | xxxx | MS2-02 | xxxx | MS2-03 | xxxx | MS2-04 | MS2
| | RANGE 6 | | RANGE 7 | | RANGE 8 | | RANGE 9 | | RANGE 10 | |

| | | | | | | | | | | |
|---|---|---|---|---|---|---|---|---|---|---|
| CTLa | xxxx | MS1-00 | xxxx | MS1-01 | xxxx | MS1-02 | xxxx | MS1-03 | xxxx | MS1-04 | MS1
| | RANGE 1 | | RANGE 2 | | RANGE 3 | | RANGE 4 | | RANGE 5 | |

FIG.8

| RANGE 11 | RANGE 12 | RANGE 13 | RANGE 14 | RANGE 15 |
|---|---|---|---|---|
| xxxx MS3-00 | xxxx MS3-01 | xxxx MS3-02 | xxxx MS3-03 | xxxx MS3-04 |

CTLc — MS3

| RANGE 6 | RANGE 7 | RANGE 8 | RANGE 9 | RANGE 10 |
|---|---|---|---|---|
| xxxx HS-00 | xxxx HS-01 | xxxx HS-02 | xxxx HS-03 | xxxx HS-04 |

CTLb — MS2

| RANGE 1 | RANGE 2 | RANGE 3 | RANGE 4 | RANGE 5 |
|---|---|---|---|---|
| xxxx MS1-00 | xxxx MS1-01 | xxxx MS1-02 | xxxx MS1-03 | xxxx MS1-04 |

CTLa — MS1

FIG. 16

| RANGE 1 | xxxx |
|---|---|
| | MS1-00 |
| | INVALID |
| RANGE 2 | xxxx |
| | MS1-01 |
| | INVALID |
| RANGE 3 | xxxx |
| | MS1-02 |
| | INVALID |
| RANGE 4 | xxxx |
| | MS1-03 |
| | INVALID |
| RANGE 5 | xxxx |
| | MS1-04 |
| | INVALID |

CTLa

| RANGE 6 | xxxx |
|---|---|
| | MS2-00 |
| | INVALID |
| RANGE 7 | xxxx |
| | MS2-01 |
| | INVALID |
| RANGE 8 | xxxx |
| | MS2-02 |
| | INVALID |
| RANGE 9 | xxxx |
| | MS2-03 |
| | INVALID |
| RANGE 10 | xxxx |
| | MS2-04 |
| | INVALID |

CTLb

| RANGE 11 | xxxx |
|---|---|
| | MS3-00 |
| | INVALID |
| RANGE 12 | xxxx |
| | MS3-01 |
| | INVALID |
| RANGE 13 | xxxx |
| | MS3-02 |
| | INVALID |
| RANGE 14 | xxxx |
| | MS3-03 |
| | INVALID |
| RANGE 15 | xxxx |
| | MS3-04 |
| | INVALID |

CTLc

FIG. 17

| | CTLa | | CTLb | | CTLc |
|---|---|---|---|---|---|
| RANGE 1 | xxxx<br>MS1-00<br>INVALID | RANGE 6 | xxxx<br>MS2-00<br>HS-00 | RANGE 11 | xxxx<br>MS3-00<br>INVALID |
| RANGE 2 | xxxx<br>MS1-01<br>INVALID | RANGE 7 | xxxx<br>MS2-01<br>HS-01 | RANGE 12 | xxxx<br>MS3-01<br>INVALID |
| RANGE 3 | xxxx<br>MS1-02<br>INVALID | RANGE 8 | xxxx<br>MS2-02<br>HS-02 | RANGE 13 | xxxx<br>MS3-02<br>INVALID |
| RANGE 4 | xxxx<br>MS1-03<br>INVALID | RANGE 9 | xxxx<br>MS2-03<br>HS-03 | RANGE 14 | xxxx<br>MS3-03<br>INVALID |
| RANGE 5 | xxxx<br>MS1-04<br>INVALID | RANGE 10 | xxxx<br>MS2-04<br>HS-04 | RANGE 15 | xxxx<br>MS3-04<br>INVALID |

FIG.20

| RANGE 1 | xxxx |
| --- | --- |
| | MS1-00 |
| | INVALID |

| RANGE 2 | xxxx |
| --- | --- |
| | MS1-01 |
| | INVALID |

| RANGE 3 | xxxx |
| --- | --- |
| | MS1-02 |
| | INVALID |

| RANGE 4 | xxxx |
| --- | --- |
| | MS1-03 |
| | INVALID |

| RANGE 5 | xxxx |
| --- | --- |
| | MS1-04 |
| | INVALID |

| RANGE 6 | xxxx |
| --- | --- |
| | HS-00 |
| | MS2-00 |

| RANGE 7 | xxxx |
| --- | --- |
| | HS-01 |
| | MS2-01 |

| RANGE 8 | xxxx |
| --- | --- |
| | HS-02 |
| | MS2-02 |

| RANGE 9 | xxxx |
| --- | --- |
| | HS-03 |
| | MS2-03 |

| RANGE 10 | xxxx |
| --- | --- |
| | HS-04 |
| | MS2-04 |

| RANGE 11 | xxxx |
| --- | --- |
| | MS3-00 |
| | INVALID |

| RANGE 12 | xxxx |
| --- | --- |
| | MS3-01 |
| | INVALID |

| RANGE 13 | xxxx |
| --- | --- |
| | MS3-02 |
| | INVALID |

| RANGE 14 | xxxx |
| --- | --- |
| | MS3-03 |
| | INVALID |

| RANGE 15 | xxxx |
| --- | --- |
| | MS3-04 |
| | INVALID |

FIG.21

| RANGE 1 | RANGE 6 | RANGE 11 |
|---|---|---|
| xxxx | xxxx | xxxx |
| MS1-00 | HS-00 | MS3-00 |
| INVALID | INVALID | INVALID |

| RANGE 2 | RANGE 7 | RANGE 12 |
|---|---|---|
| xxxx | xxxx | xxxx |
| MS1-01 | HS-01 | MS3-01 |
| INVALID | INVALID | INVALID |

| RANGE 3 | RANGE 8 | RANGE 13 |
|---|---|---|
| xxxx | xxxx | xxxx |
| MS1-02 | HS-02 | MS3-02 |
| INVALID | INVALID | INVALID |

| RANGE 4 | RANGE 9 | RANGE 14 |
|---|---|---|
| xxxx | xxxx | xxxx |
| MS1-03 | HS-03 | MS3-03 |
| INVALID | INVALID | INVALID |

| RANGE 5 | RANGE 10 | RANGE 15 |
|---|---|---|
| xxxx | xxxx | xxxx |
| MS1-04 | HS-04 | MS3-04 |
| INVALID | INVALID | INVALID |

▨ DATA TO BE LOST

FIG. 33

| LOGICAL DRIVE 0 | LOGICAL DRIVE 1 | LOGICAL DRIVE 2 | LOGICAL DRIVE 3 | LOGICAL DRIVE 4 |
|---|---|---|---|---|
| CYLINDER ADDRESS 0 | CYLINDER ADDRESS 20 | CYLINDER ADDRESS 30 | CYLINDER ADDRESS 40 | CYLINDER ADDRESS 50 |
| NUMBER OF STORED CYLINDERS 20 | NUMBER OF STORED CYLINDERS 10 | NUMBER OF STORED CYLINDERS 10 | NUMBER OF STORED CYLINDERS 10 | NUMBER OF STORED CYLINDERS 10 |
| LOGICAL BLOCK 0 | LOGICAL BLOCK 10 | LOGICAL BLOCK 20 | LOGICAL BLOCK 30 | LOGICAL BLOCK 40 |
| NUMBER OF STORED BLOCKS 10 | NUMBER OF STORED BLOCKS 10 | NUMBER OF STORED BLOCKS 10 | NUMBER OF STORED BLOCKS 10 | NUMBER OF STORED BLOCKS 10 |

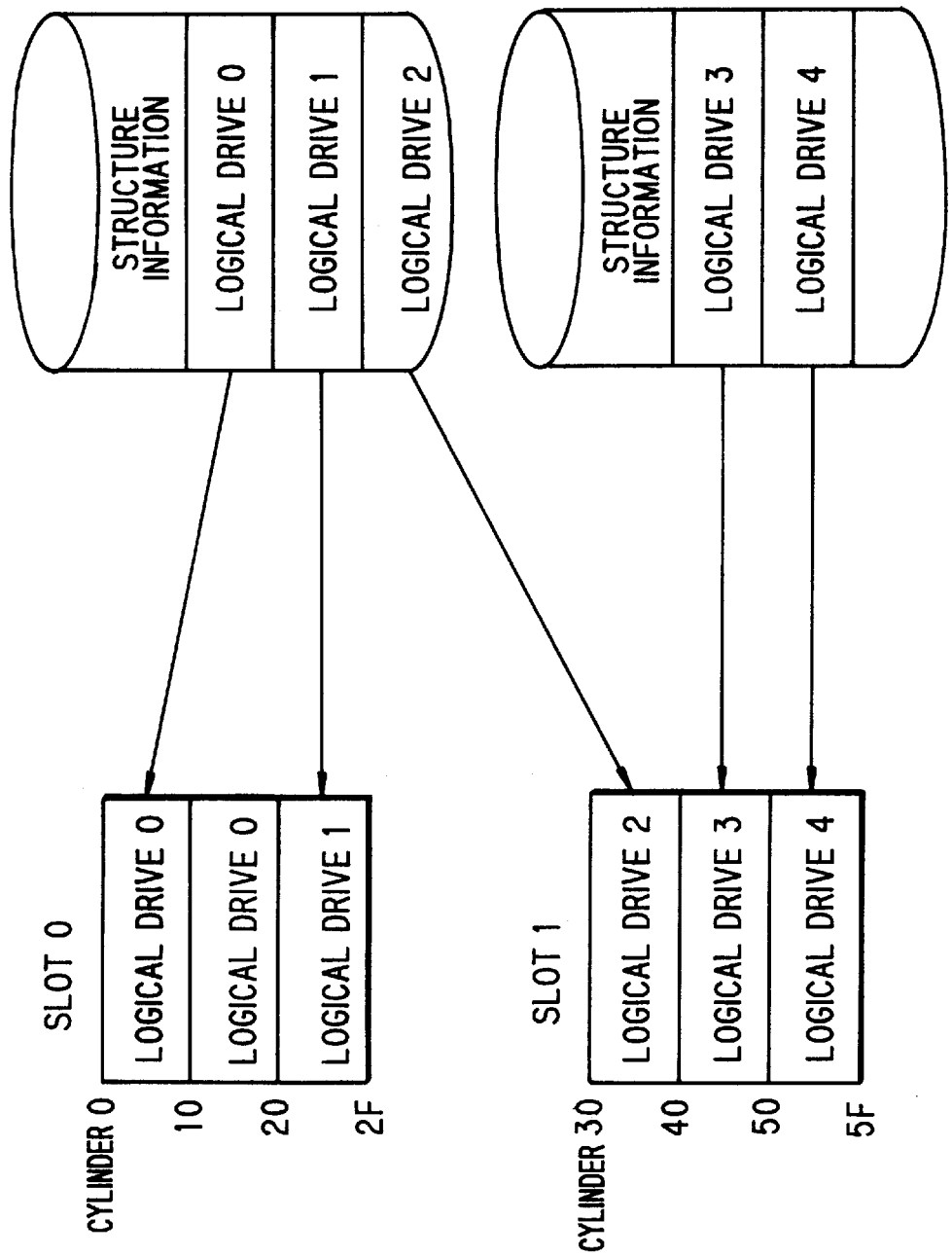

FIG. 36

FIXED MEMORY ADDRESS DEFINED BY STRUCTURE INFORMATION

| TRACK 0 | DIRECTORY | HA | R0-C | R0-D | R1-C | R1-K | R1-D | R2-C |
| TRACK 1 | DIRECTORY | HA | R0-C | R0-D | R1-C | R1-K | R1-D | R2-C |
| TRACK 2 | DIRECTORY | HA | R0-C | R0-D | R1-C | R1-K | R1-D | R2-C |

FIXED LENGTH

PHYSICAL STRUCTURE OF TRACK FIELD)

(LOGICAL STRUCTURE OF TRACK FIELD)

SEMICONDUCTOR DISK APPARATUS HAVING A SEMICONDUCTOR MEMORY FOR A RECORDING MEDIUM

BACKGROUND OF THE INVENTION

1. Field of the Invention

The present invention relates to a semiconductor disk apparatus and, more particularly, to a magnetic disk apparatus (DASD: Direct Access Storage Device) which enables high-speed access from a host apparatus without any mechanical operation by writing all the user data that are to be stored in the magnetic disc apparatus, in a semiconductor memory.

2. Description of the Related Art

A semiconductor disk apparatus is a disk apparatus which uses a semiconductor memory as a recording medium in place of a magnetic disk apparatus while maintaining the behavior (command code, data transfer method, etc.) of the magnetic disk apparatus. Therefore, the interface between the host apparatus (CPU) and the semiconductor disk control device is completely the same as the interface between the CPU and the magnetic disk control device. The semiconductor disk apparatus is advantageous in that it can be accessed instantaneously because it is not necessary to move the head unlike in the magnetic disk apparatus, and in that it is possible to utilize the software resources between the CPU and the magnetic disk control device as they are.

FIG. 57 shows the structure of such a semiconductor disk apparatus. The reference numeral 1a represents a CPU, 2 a semiconductor disk apparatus as a shared storage device (SSD), 3 a semiconductor disk control device, and 4 a semiconductor disk which is provided with a plurality of semiconductor memory modules (MS: Main Storage) 4a, 4b, 4c, ... and an extended storage adapter (ESA) 4s as a memory interface adapter for controlling the writing of data into and reading of data from the semiconductor memory modules. The reference numeral 5 denotes a maintenance panel or a personal computer.

In the semiconductor disk control unit 3, the reference numeral 3a represents a channel adapter CA having a single or a plurality of interfaces (host interfaces) between the channel adapter and the host apparatus CPU 1a. Although only one channel adapter 3a is shown in FIG. 57, a plurality of adapters are actually provided. The reference numeral 3b represents a resource manager RM provided with an exclusive control table (not shown) for executing exclusive control so as to allow another host interface to use a predetermines semiconductor memory module when no host interface is using the semiconductor memory module, while inhibiting any other host interface from using the semiconductor memory module when it is used by one host interface. Actually, the semiconductor memory module is divided into a plurality of logical drives, and the resource manager RM executes exclusive control for each drive. The reference numeral 3c denotes a service adapter SA for conducting initial microprogram loading processing (IML), state monitoring processing, and recovery processing at the time of a trouble for each unit, and 3d, 3e and 3f control storage portions for storing various control tables and programs.

First problem

In the semiconductor disk apparatus, a trouble in a semiconductor memory module is fatal. If a trouble generates in a semiconductor memory module in a conventional semiconductor disk apparatus, after data are evacuated, the power switch is turned off and the semiconductor memory module having the trouble is replaced by another semiconductor memory module. After replacing the semiconductor memory module, the power switch is turned on so as to activate the semiconductor disk apparatus and the data are restored. In this method, however, a device specially for evacuating data is necessary. In addition, since it is impossible to use the semiconductor disk apparatus while the power is off and when data are in the process of evacuation/restoration, the semiconductor disk apparatus cannot meet the demand for a non-stop apparatus. Although a method of replacing a semiconductor memory module having a trouble without stopping the semiconductor disk apparatus is proposed (Method of Maintaining Semiconductor Disk without Stopping the Semiconductor Disk Apparatus, Japanese Patent Laid-Open No. 268020/1991), it is disadvantageous in that a large-scale maintenance device for enabling maintenance of a semiconductor disk without stopping the semiconductor disk apparatus is required separately from the semiconductor disk apparatus.

Second problem

When the power of a semiconductor disk apparatus is turned off, the contents of the memories are lost. To prevent this, some semiconductor disk apparatuses have backup disk devices connected thereto. Each of the semiconductor memory modules which constitute a semiconductor disk apparatus is divided into a plurality of logical drives, and the host apparatus designates a logical drive by issuing a Start I/O command. If the designated logical drive is usable, the host apparatus accesses a predetermined position of the logical drive. The structure of the logical drive of such a semiconductor disk and the logical drive of a backup disk device have a one-to-one correspondence. However, if the size or the position of the logical drive of the semiconductor disk is changed, the structure of the logical drive of the semiconductor disk and the logical drive of the backup disk device does not correspond to one to one. For this reason, even if data are evacuated into the backup disk device before the structure of the semiconductor disk is changed, it is impossible to restore the data which is evacuated into the backup disk after the change in the structure of the logical drive of the semiconductor disk, so that the data before the change become invalid and cannot be used.

Third problem

Since a semiconductor disk apparatus emulates a magnetic disk apparatus, it has not only a user data portion provided in the actual device but also a control information portion called directory provided in each track. The semiconductor disk apparatus manages the address relative to the memory of the currently emulated record (user data) in the track field and each sector information, etc. by the directory.

When a channel adapter accesses the user data area of the designated track field, the channel adapter obtains the control information of the designated track field by taking the directory of the designated track into the channel adapter and accesses the user data in accordance with the control information. The directory is composed of (1) the record number of the last record that is written in the traffic field, (2) the sector directory and (3) the record directory. The sector directory is a table in which the ordinal number of the record which is read out first in set sector processing is written, and the record directory is a table in which the relative address (offset address) from the head of track to each record is written. The record directory is used in order to access a record field directly by the record number. By using such information, it is possible to directly move an orient (virtual head position) at the time of set sector processing and search ID processing, which enables high-speed access.

When the target directory portion cannot be read due to a 2-bit error of a memory or the like, all the user data of the track field which is controlled by the corresponding directory become inaccessible, so that the valid user data are actually lost. To prevent this, a data loss preventing mechanism is required which makes the user data accessible even when the directory cannot be read.

In a conventional semiconductor disk apparatus, when the track field designated by the firmware of a channel adapter is to be accessed, the directory in which the control information on the track field is written is generally first read before processing is started. Consequently, if it is impossible to read the directory, access to the track field is impossible because there is no recovery means for the collapsed directory. It is therefore necessary to initialize the collapsed directory by initializing the smallest unit (e.g, 1 cylinder) and make the directory valid in order to make the track, which cannot be read, reusable. Initialization, however, erases the user data in the initialized region, so that it is necessary to evacuate, in advance, the data in the region being initialized. The data in the track field which becomes inaccessible due to the collapse of the directory can only be read in accordance with a memory damp command which is prepared as one of the channel commands. For this reason, it is impossible to extract and reproduce the necessary part as the user data of the track field except by the user who knows the track format within the semiconductor disk apparatus. In other words, it is almost impossible to completely restore the original data.

Fourth problem

In a semiconductor disk apparatus, the data storage medium is a semiconductor memory chip. Therefore, the memory cost per bit in a semiconductor disk apparatus is higher than that in a magnetic disk apparatus. In addition, the storage capacity per semiconductor disk apparatus is smaller than that of a magnetic disk apparatus. In order to solve the problem of the storage capacity, a method of compressing data before writing and restoring the original data before reading is proposed. Such a data compression method, however, suffers from the problem that the size of compressed data is sometimes different from the original data size when the user data is reloaded. When the data size after the compression is smaller than the original data size, it is necessary to release the surplus region for the effective use of the memory. On the other hand, when the data size after the compression is larger, it is necessary to secure a new region before reloading. Such memory control is complicated, and it is conventionally impossible to control the release/allocation of the memory region for the purpose of effective utilization by a simple method.

SUMMARY OF THE INVENTION

Accordingly, it is a first object of the present invention to eliminate the above-described problems in the related art and to provide a semiconductor disk apparatus which is capable of replacing a semiconductor memory module in the process of operating the semiconductor disk apparatus without lowering the access speed and without the need for providing a special maintenance device.

It is a second object of the present invention to provide a semiconductor disk apparatus which is capable of restoring the data evacuated to a backup disk device before changing the structure of a semiconductor disk to the semiconductor disk after the change of the structure so as to use the user data before the change.

It is a third object of the present invention to provide a semiconductor disk apparatus which is capable of accessing a designated target record without using a directory when the directory cannot be read, and which is capable of reconstructing the directory.

It is a fourth object of the present invention to provide a semiconductor disk apparatus which is capable of effective use of a semiconductor memory by effectively releasing or allocating the memory region when data is compressed and written into the memory.

To achieve the first object, the present invention provides a semiconductor disk apparatus comprising: a plurality of semiconductor memory modules; a spare semiconductor memory module; a controller (channel adapter) for controlling the data writing and reading operations to a semiconductor memory module in accordance with an access command from a host apparatus; and a service adapter for detecting a memory error in each semiconductor memory module and copying the contents of the memory of the semiconductor memory module in which a memory error has occurred to the spare semiconductor memory module.

More specifically, each semiconductor memory module is divided into a plurality of access control units. The service adapter copies the contents of the memory of the semiconductor memory module in which a memory error has occurred to the spare semiconductor memory module one access control unit at a time. In this manner, it is possible to evacuate the contents of the memory of the semiconductor memory module in which a memory error has occurred, without stopping the semiconductor disk apparatus simply by adding the spare semiconductor disk apparatus, so that a large-scale maintenance device is obviated. Since the contents of the memory are copied one access control unit at a time, it is also possible to conduct exclusive control one access control unit at a time, so that the host apparatus can access the access control unit which is not the object of copying even if the service adapter is in the process of copying another access control unit. In other words, the copying operation exerts no deleterious influence on the access of the host apparatus.

To achieve the second object, the present invention provides a semiconductor disk apparatus comprising: a semiconductor disk to which a plurality of logical drives are allocated; a disk device to which a plurality of logical drives are allocated and which backs up the semiconductor disk; a disk adapter for evacuating the data of each logical drive which is stored in the semiconductor disk to the corresponding logical drive of the disk device and for restoring each data evacuated to the logical drive of the disk device to the corresponding logical drive of the semiconductor disk; a means for storing a first structure information table which shows the head address and the capacity of each logical drive of the semiconductor disk; a means for storing a second structure information table which shows the head address and the capacity of each logical drive of the disk device; an instructing means for instructing a change in the structure of the semiconductor disk and the restoration of the data evacuated to the disk device to the semiconductor disk; and a means for creating an address conversion table for converting a disk address into a semiconductor disk address for each logical drive by using the first structure information table and the second structure information table before a change when the first structure information table is changed on the basis of instruction as to a change in the structure.

More specifically, after the structure of the semiconductor disk is changed, the instructing means instructs the disk device to restore the data evacuated to the disk device to the semiconductor disk. When this instruction on the data restoration is issued, the address conversion table creating means creates an address conversion table for converting a disk address into a semiconductor disk address for each logic drive by using the structure information table of the semiconductor disk and the structure information table of the disk device. The disk adapter restores the data evacuated to each logical table of the disk device to the corresponding logical drive of the semiconductor disk by using the address conversion table. In this manner, it is possible to correctly restore the data evacuated to the disk device for backup before the change in the structure to the semiconductor disk after the change in the structure, and to use the user data before the change.

To achieve the third object, the present invention provides a semiconductor disk apparatus comprising: a semiconductor memory; and a control device (channel adapter) for controlling the operation of writing and reading a record to the semiconductor memory, adding control information restoring data necessary for restoring a part of the control information which is recorded in the directory, to the record, and storing the record in the semiconductor memory.

More specifically, the channel adapter controls the operation of writing and reading a record to the semiconductor memory module on the basis of the contents of the directory, and adds control information restoring data necessary for restoring a part of the control information which is recorded in the directory to the record before storing it. In this manner, even if the directory cannot be read, the channel adapter can access the record designated by the host apparatus by using the control information restoring data which is contained in each record, and it is also possible to reconstruct the directory.

To achieve the fourth object, the present invention provides a semiconductor disk apparatus comprising: a semiconductor disk including a control information storage region for storing the control information contained in a directory or a record, and a data storage region which is divided into a multiplicity of blocks and which stores the data portion contained in the record; a control device (channel adapter) which controls the operation of writing and reading the record to the semiconductor disk in accordance with the instruction from a host apparatus, and which includes a compression/restoration mechanism for compressing and restoring the data portion contained in the record; and a semiconductor memory controller for controlling the used/unused blocks.

More specifically, the semiconductor disk is divided into (1) the control information storage region for storing the control information contained in a directory or a record, and (2) the data storage region for storing the data portion of the record, and the data storage region is divided into a multiplicity of blocks. When the channel adapter receives a write command from the host apparatus, it compresses the data portion, and stores the compressed data portion in a predetermined block. The channel adapter also adds the block address of the block in which the data is stored to the control information, and stores the control information in the control information storage region without compression. In this manner, since the user data is compressed before storage, the memory is effectively used, while since the control information is not compressed, no restoration process is necessary, thereby shortening the data access time of the host apparatus.

At the time of rewriting a record, the channel adapter obtains the number Bo of blocks in which the data portion of the record before rewriting is stored and the number Bn of blocks necessary for storing compressed data being rewritten. If Bn=Bo, the compressed data is written in the blocks in which the original data portion is stored. If Bn>Bo, the channel adapter demands the semiconductor memory controller for blocks which are wanting, and writes the compressed data in the blocks in which the original data portion is stored and the blocks which are designated by the semiconductor memory controller. If Bn<Bo, the channel adapter reports the existence of surplus blocks to the semiconductor memory controller, and writes the compressed data in the blocks in which the original data portion is stored except in the surplus blocks.

Other features and advantages of the present invention will be apparent from the following description taken in conjunction with the accompanying drawings.

BRIEF DESCRIPTION OF THE DRAWINGS

FIG. 2 is an explanatory view of a control table:

FIG. 3 is an explanatory view of a copy management table;

FIG. 7 is an explanatory view of the contents of the control table (in the process of copying);

FIG. 8 is an explanatory view of the contents of the control table (after the end of the copying process);

FIG. 16 is an explanatory view of the contents of the control table (at the time of initiation);

FIG. 17 is an explanatory view of the contents of the control table (after the instruction to change the table);

FIG. 20 is an explanatory view of the contents of the control table (after the instruction to exchange the physical addresses);

FIG. 21 is an explanatory view of the contents of the control table (after the end of the copying process);

FIG. 33 is an explanatory view of an address conversion table;

FIG. 34 is an explanatory view of a user data restoration process;

FIG. 36 is an explanatory view of a track format in a semiconductor disk;

Figure 1:
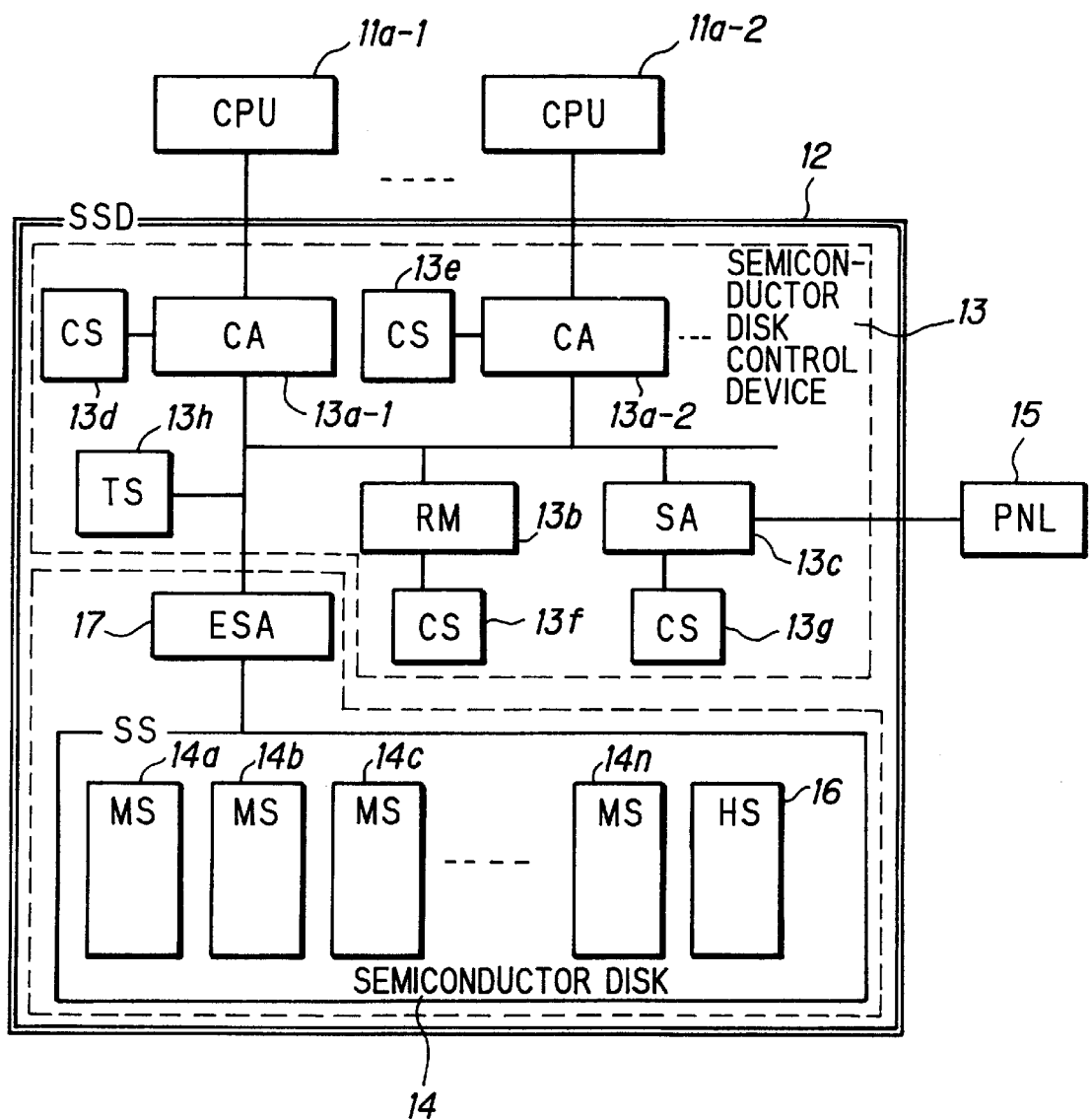
FIG. 1 shows the structure of a semiconductor disk apparatus (first embodiment) according to the present invention.

DESCRIPTION OF THE PREFERRED EMBODIMENTS (a) First embodiment
(a-1) Structure of semiconductor disk apparatus FIG. 1 shows the structure of a first embodiment of a semiconductor disk apparatus according to the present invention. The reference numerals 11a-1, 11a-2, . . . represent host apparatuses (CPU), 12 a semiconductor disk apparatus (SSD), 13 a semiconductor disk control unit, 14 a semiconductor disk, and 15 a maintenance panel (PNL) for issuing various instructions to a service adapter (which will be described later) so as to execute maintenance.

The semiconductor disk 14 includes a plurality of semiconductor memory modules (MS: Main Storage) 14a, 14b, 14c, . . . 14n for storing user data, a spare semiconductor memory module (HS: Hot Spare Memory) 16 for serving as a substitute of the semiconductor memory module until it is replaced by a new semiconductor memory module when an error is produced in the semiconductor memory module, and a memory interface adapter (ESP: Extended Storage Adapter) 17 for controlling the data writing/reading operation to each semiconductor memory module. Only one spare semiconductor memory module (HS) is shown, but a plurality of spare semiconductor memory modules (HS) may be provided.

Each semiconductor memory module is divided into a multiplicity of ranges (ranges 1 to n) with a predetermined size, for example, cylinder, which is a unit for exclusive control at the time of access from the CPU, as a unit. When a memory error occurs, the data in the semiconductor memory module is evacuated to the spare semiconductor memory module 16 one range at a time, and the size of the range also constitutes an access control unit.

For example, when an error generates in the semiconductor memory module 14a, it is replaced substantially by the following process.

(1) The contents of the memory of the semiconductor memory module 14a in which an error has occurred are evacuated to the spare semiconductor memory module (HS) 16 one access control unit at a time. Exclusive control is executed for each access control unit.

(2) After the end of evacuation, the spare semiconductor memory module 16 serves as a semiconductor memory module for storing user data.

(3) After all the access control units of the memory contents are evacuated, the semiconductor memory module 14a having the memory error is replaced by a new semiconductor memory module. Thereafter, the new semiconductor memory module 14a serves as a spare semiconductor memory module. In order to restore the semiconductor memory module 16 to the original position as a spare semiconductor memory module, the contents of the semiconductor memory module 16 are restored to the new semiconductor memory module 14a one access control unit at a time in the same way as (1).

In the semiconductor disk apparatus 13, the reference numerals 13a-1, 13a-2, . . . represent channel adapters (CA) having a single or a plurality of interfaces (host interfaces) to the host apparatuses (CPU)11a-1, 11a-2, . . . , 13b a resource manager (RM) which is provided with an exclusive control table (not shown) ECT for executing exclusive control so as to allow another unit to access a region of a predetermined semiconductor memory module when the region is not used by any unit, while inhibiting any other unit from accessing the semiconductor memory module when it is used by one unit. In this embodiment, the resource manager manages the used/unused region for each access control unit and executes exclusive control for each access control unit.

The reference numeral 13c denotes a service adapter (SA) for conducting initial microprogram loading processing (IML), situation monitoring processing, and recovery processing such as the exchange processing of the semiconductor memory module at the time of a trouble for each module, and 13d to 13g control storage portions CS for storing a control table CTL and various programs. In the control table CTL, the correspondence of the logical address (CCHH) and the physical address of the semiconductor disk for each range (access control unit) of each semiconductor memory module is stored, as shown in FIG. 2. The logical address is an address (e.g., cylinder/head number CCHH when designated by the data address of a magnetic disk), and the physical address is an actual address for accessing a semiconductor memory module in the semiconductor disk apparatus. Each module converts a logical address into a physical address by using the control table CTL.

The reference numeral 13h represents a storage portion TS for storing a copy management table CCT which shows whether a copy is successful (valid) or unsuccessful (invalid). The copy management table CCT manages the successful/unsuccessful copies for each collective data unit out of the data which are written into the semiconductor memory module. When data is failed in copying (when the data cannot be read due to a medium error, etc.), the corresponding portion is recorded as invalid. For example, successful/unsuccessful copies are managed for each track, as shown in FIG. 3. In the case of a semiconductor disk which emulates a magnetic disk, even if there is an error in a cylinder when data is copied one cylinder (access control unit) at a time, the cylinder is not invalid in whole. If the control table CCT records data for the track as invalid when there is an error in that track, minute data guarantee is enabled. If the data is managed for each record not for each track, data guarantee is enabled more minutely. The copy management table CCT may be provided at any place where the corresponding module can see and update the table CCT. For example, the copy table CCT may be disposed within the semiconductor memory module.

(a-2) Summary of first semiconductor memory module replacement control process

Figure 4:
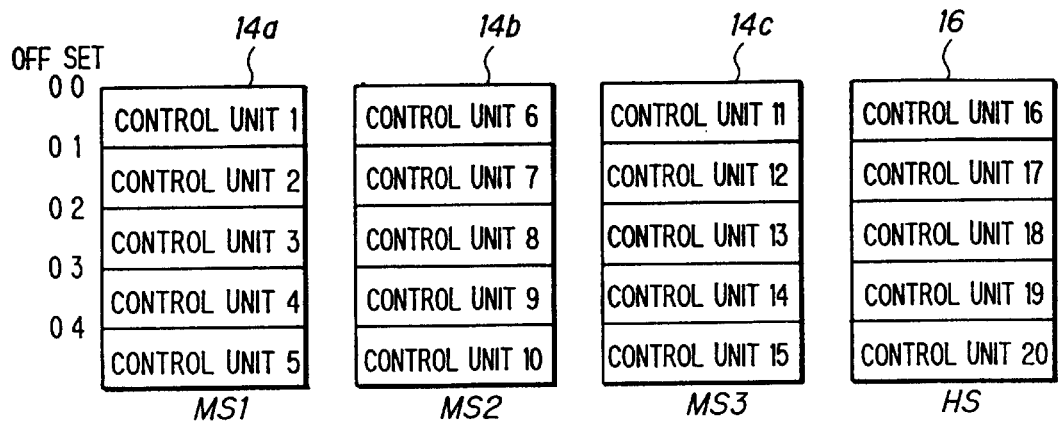
FIG. 4 show the structure of a semiconductor disk.
Figure 5:
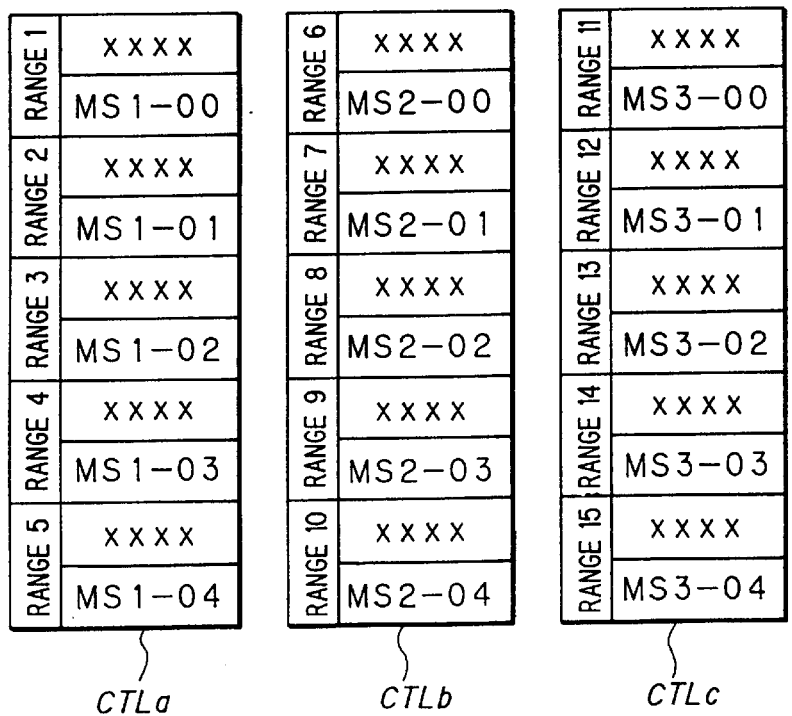
FIG. 5 is an explanatory view of the contents of the control table (at the time of initiation)

The semiconductor disk 14 is composed of three semiconductor memory modules (MS1–MS3) 14a to 14c and one spare semiconductor memory module (HS) 16, and each of the semiconductor memory modules is composed of five access control units, as shown in FIG. 4. FIG. 5 explains the contents of each control table CTL at the time of initiation. In FIG. 5, the symbol CTLa represents a control table portion for the semiconductor memory module 14a (MS1), CTLb a control table portion for the semiconductor memory module (MS2) 14b, and CTLc a control table portion for the semiconductor memory module (MS3) 14c. The symbol XXXX represents a logical address and MS1-00 the offset address 00 (see FIG. 4) of the semiconductor memory module (MS1) 14a, the same applying to MS1-00 to MS3-04.

Figure 6:
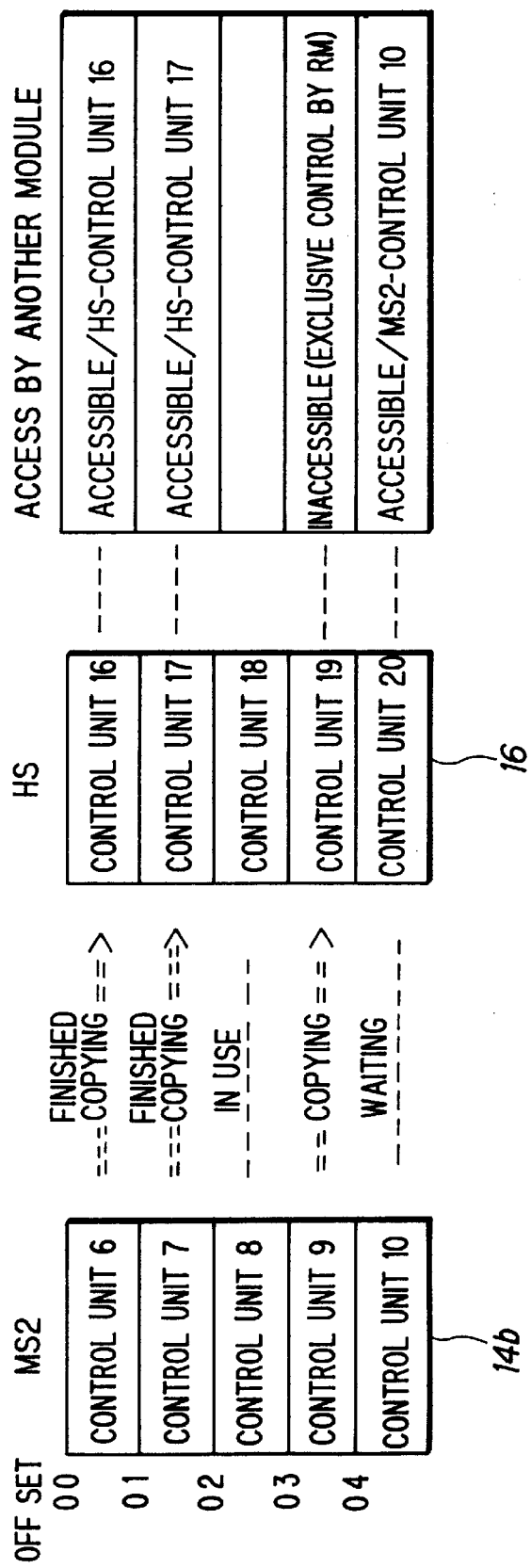
FIG. 6 is an explanatory view of a copying process.

When a memory error occurs in the semiconductor memory module (MS2) 14b, the data in the semiconductor memory module 14b are copied to the spare semiconductor memory module 16 one access control unit at a time under the control of the service adapter SA. If it is assumed in the copying process that the first and second control units 6, 7 have already been copied, the third control unit 8 cannot be copied because it is in use by another module, the fourth control unit 9 is now in the process of copying and the last control unit is yet to be copied, as shown in FIG. 6, the contents of the control table CTL at this point of time are shown in FIG. 7. As shown in FIG. 7, the physical addresses of the control units (ranges) 6, 7 which have been copied are changed to the physical addresses of the spare semiconductor memory module 16 to which the data are copied (hereinafter the semiconductor memory module as the copy receiver will be referred to merely as "copy receiver").

Thereafter, the copying operation for each control unit is continued, and when the copying operation of all control units is finished, the contents of the control table CTL at this point of time are changed, as shown in FIG. 8. As shown in FIG. 8, the physical addresses of all control units (ranges) that have been copied are changed to the physical addresses of the copy receiver which is the spare semiconductor memory module 16.

(a-3) First semiconductor memory module replacement control process

Copying process

Figure 9:
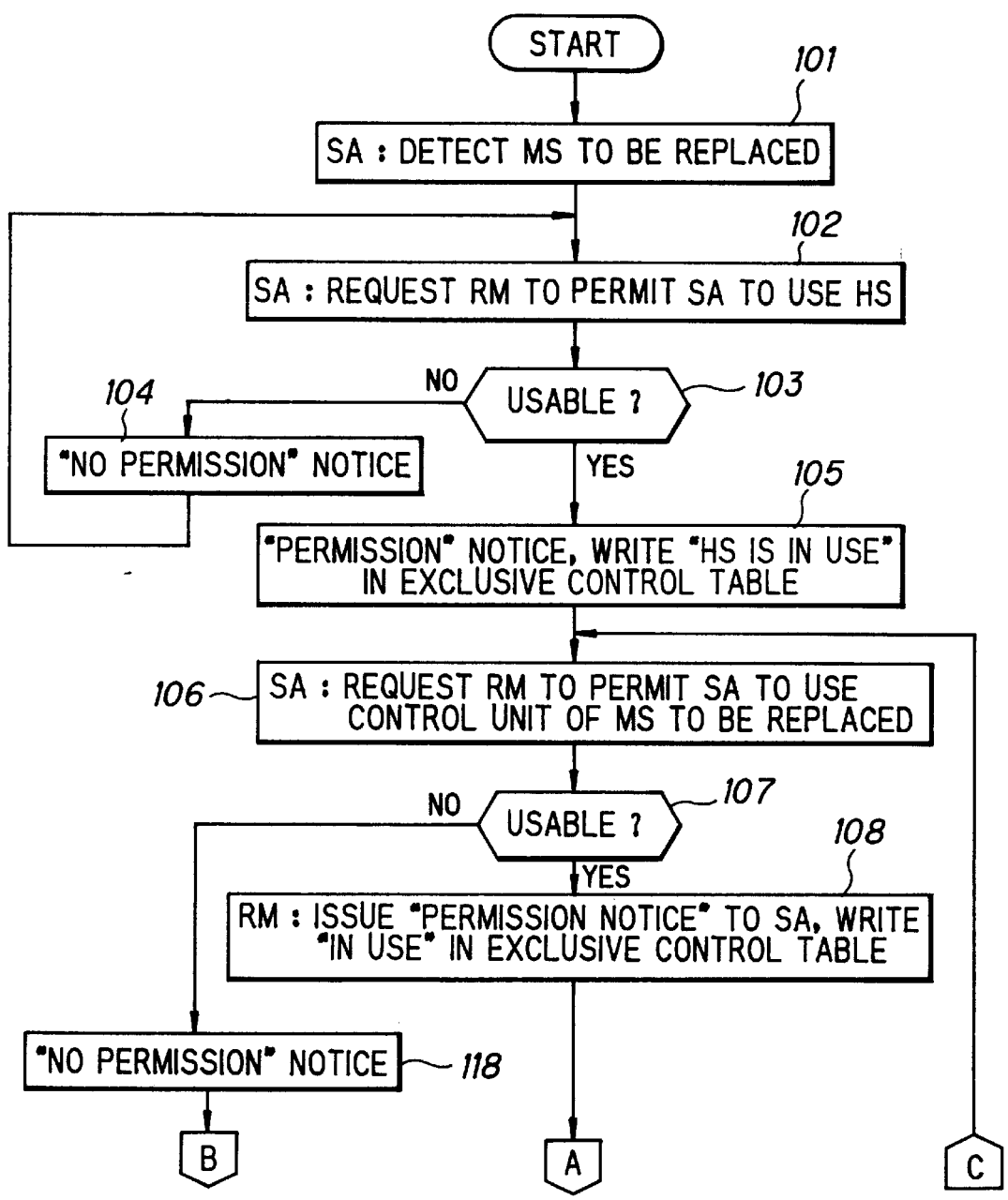
FIG. 9 is an explanatory view of a flow chart 1 of a copying process.
Figure 10:
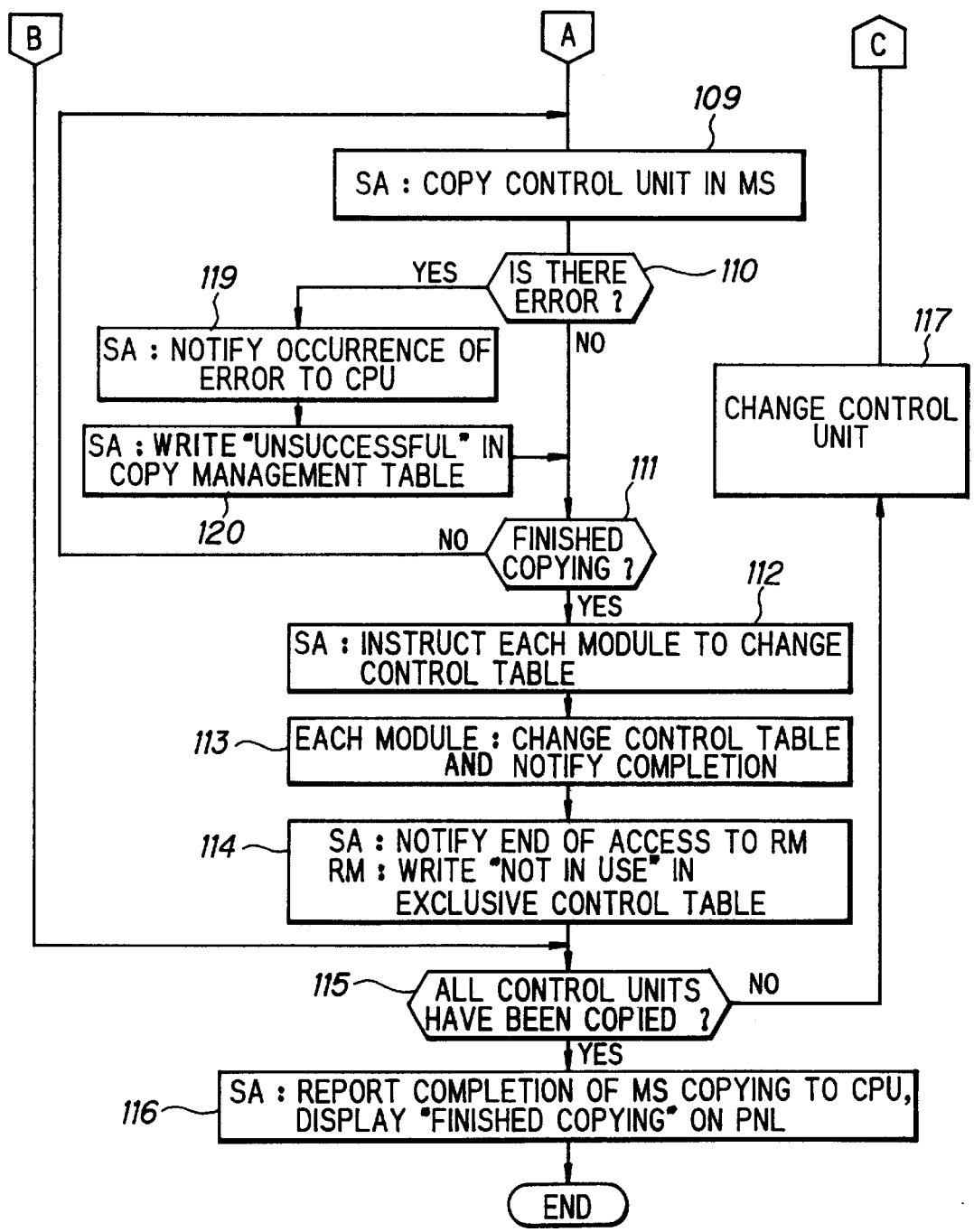
FIG. 10 is an explanatory view of a flow chart 2 of a copying process.

FIGS. 9 and 10 are flow charts of a copying process for copying the contents of the memory of a semiconductor memory module to a spare semiconductor memory module.

The service adapter (SA) 13 detects a semiconductor memory module, for example, 14b in which an error has occurred by the designation from the maintenance panel (PNL) 15 or error detection management (step 101). The service adapter SA constantly monitors each memory module so as to detect a memory error by sequentially reading the data therein one address at a time (patrol). Since a 1-bit error can be restored to the original data, it is not immediately judged to be the occurrence of an error, but when a 1-bit error is detected more than a preset number of times, it is judged to be the occurrence of an error. On the other hand, a 2-bit error is immediately notified to the service adapter SA by a memory interface adapter (ESP) 17.

When the service adapter SA detects the semiconductor memory module in which a memory error has occurred, it asks the resource manager (RM) 13b for permission to use the spare semiconductor memory module (HS) 16 (step 102). This step is necessary in order to confirm that the spare semiconductor memory module HS is not in use for the replacement of another semiconductor memory module MS. For example, if the semiconductor disk apparatus 13 is duplicated, there is a case where another service adapter SA is in the process of replacement.

The resource manager RM issues a "no permission" notice to the service adapter SA when the spare semiconductor memory module HS is in use (steps 103, 104). In this case, the service adapter SA waits until permission to use the spare semiconductor memory module HS is issued. If the spare semiconductor memory module HS is not in use, the resource manager RM issues permission to use it to the service adapter SA and writes that the spare semiconductor memory module HS is in use in the exclusive control table ECT within the resource manager RM (step 105).

The service adapter SA then asks the resource manager RM for permission to use a first access control unit of the semiconductor memory module in which an error has occurred (step 106).

If it is usable, the resource manager RM issues permission to the service adapter SA and writes that the first access control unit is in use in the exclusive control table ECT (steps 107. 108).

When the service adapter SA receives the permission, it begins to copy the control unit (step 109). If the copying operation is finished without any error (steps 110, 111), the service adapter SA instructs each of the modules 13a-1, 13a-2, 13b, etc. to change the contents of the control table CTL in the control storage portion CS which may be referred to as the control memory (step 112). More specifically, the service adapter SA instructs each module to change the physical address of the control unit 6 to HS-00 in the control table CTLb.

Each module changes the contents of the control table CTL of the control memory CS as instructed and reports the completion of the changing operation to the service adapter SA (step 113). The service adapter SA also changes the contents of the control table CTL of its own control memory CS.

When the service adapter SA receives report of the completion of the changing operation from all modules, the service adapter SA reports the end of access to the resource manager RM. The resource manager RM then writes that the first access control unit is not in use (step 114). The service adapter SA then judges whether or not all control units in the semiconductor memory module 14b have been finished copying (step 115).

If the answer is in the affirmative, the service adapter SA reports the completion of the copying operation to the host apparatus CPU via the channel adapter CA, and displays that the copying operation is finished on the maintenance panel PNL (step 116), thereby finishing the copying process. When the copying process is finished, a maintenance man replaces the semiconductor memory module (MS) 14b in which the error has occurred 14b by a new semiconductor memory module.

If the answer is in the negative at the step 115, the control unit as an object of copying is changed to another control unit which has not been copied (step 117), and the processing at the step 106 and thereafter is repeated.

If the first access control unit is in use at the step 107, the resource manager RM issues a "no permission" notice to the service adapter SA (step 118). The service adapter SA skips processing to the step 115 and repeats the processing at the step 115 and thereafter.

Figure 11A:
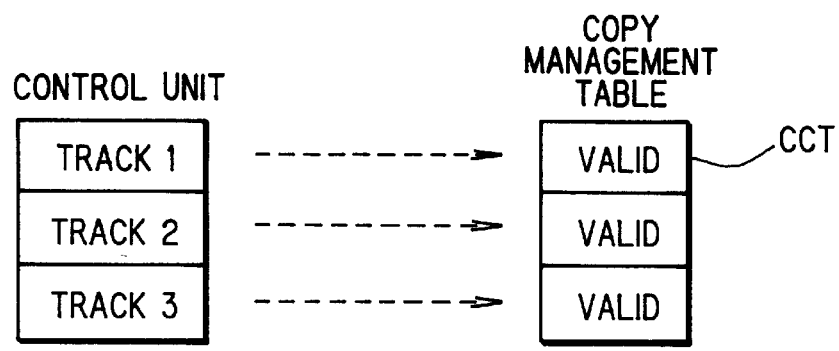
FIGS. 11A and 11B are explanatory views of the copy management table showing the successful/unsuccessful copies.
Figure 11B:
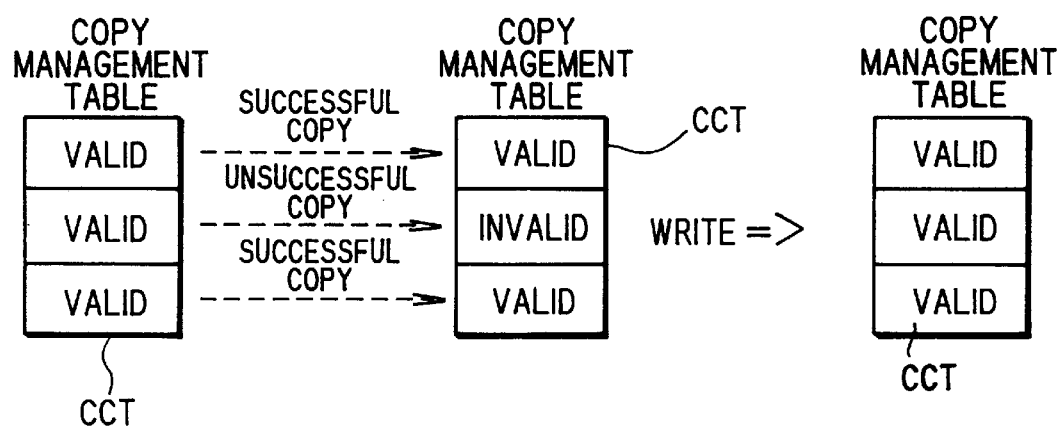

If an error occurs in a certain track during copying at the step 110, the service adapter SA notifies the occurrence of an error to the host apparatus CPU via the channel adapter CA (step 119), and writes that copy is unsuccessful in the corresponding track of the copy management table CCT (step 120). Thereafter, the processing at the step 111 and thereafter is repeated. FIGS. 11A and 11B are explanatory views of the copy management table CCT showing the successful/unsuccessful copies, and show the part of the copy management table for the control unit 6 (the first access control unit of the semiconductor memory module 14b). The control unit 6 is here assumed to be composed of three tracks 1 to 3.

FIG. 11A shows the case in which the control unit 6 is copied without occurrence of an error in any track, and "Valid" is written in the tracks 1 to 3 in the copy management table CCT. FIG. 11B shows the case in which an error occurs at the time of copying the track 2, and "Invalid" is written in the track 2 of the copy management table CCT and "Valid" is written in the tracks 1 and 3. If data is written in the track in which copy is unsuccessful, the track becomes "Valid", so that the copy management table CCT is renewed.

Processing after replacement of semiconductor memory module

Figure 12:
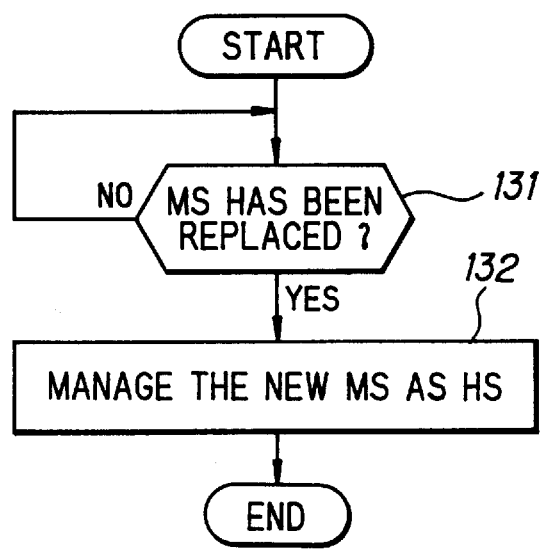
FIG. 12 is flow chart of a processing after the replacement of a semiconductor memory module.

FIG. 12 is a flow chart of processing after the replacement of a semiconductor memory module.

Figure 13:
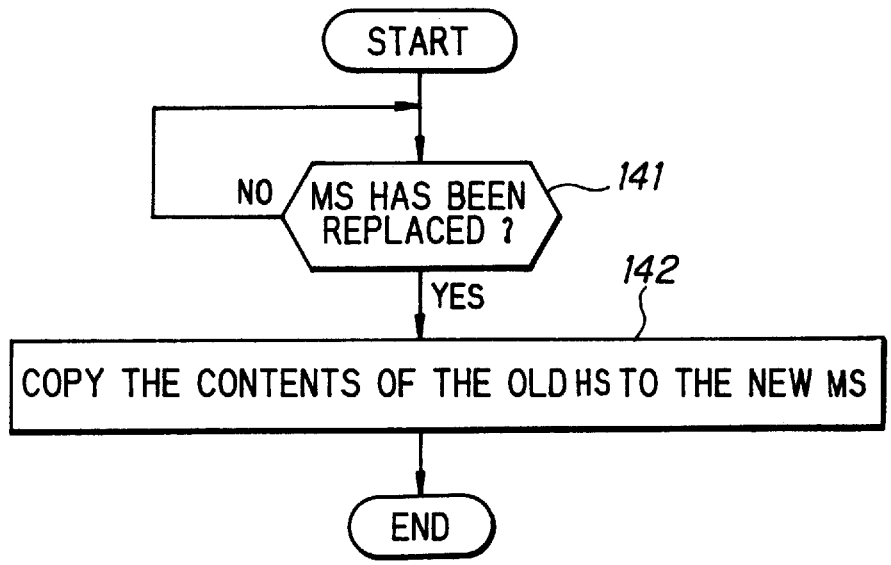
FIG. 13 is a flow chart of another processing after the replacement of a semiconductor memory module.

When the maintenance man replaces the semiconductor memory module in which the error has occurred, the service adapter SA detects the end of replacement (step 131), and thereafter manages the new semiconductor memory module as a spare semiconductor memory module (step 131). It is possible to restore the semiconductor memory module 16 to the original position as a spare semiconductor memory module after replacement under the instruction from the maintenance man via the maintenance panel PNL. It is also possible to automatically restore the semiconductor memory module 16 to the original position as a spare semiconductor memory module after replacement. FIG. 13 is a flow chart of processing in such cases. When the service adapter SA detects the end of replacement (step 141), the data stored in the semiconductor memory module 16 is copied to the new semiconductor memory module 14b after replacement by the same processing as the above-described copying process (step 142).

Accessing process using copy management table

Figure 14:
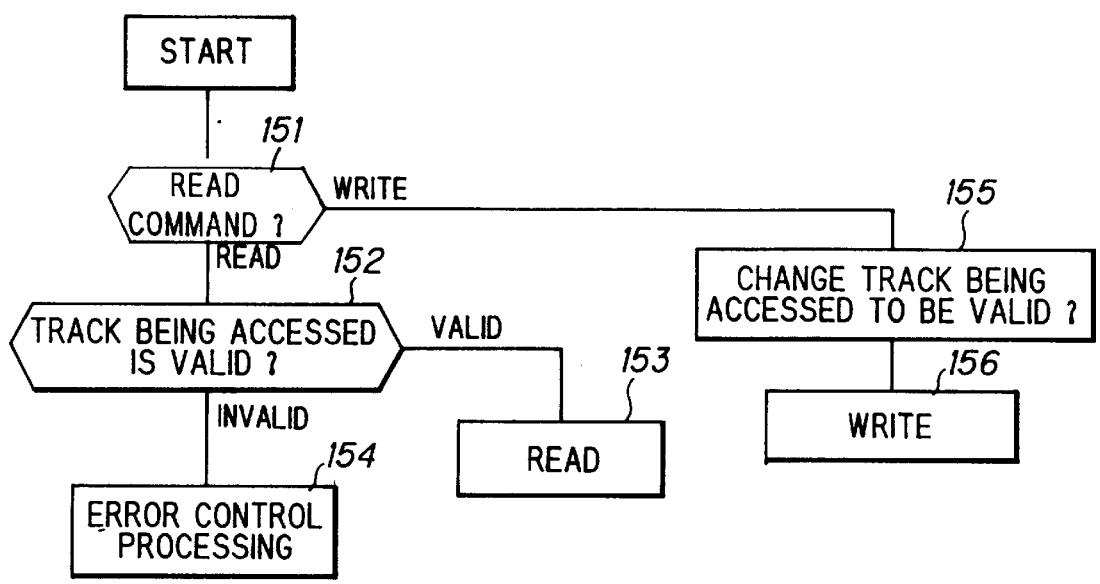
FIG. 14 is a flow chart of an accessing process using a copy management table.

Each module refers to the copy management table CCT at the time of reading a record from a semiconductor memory module. FIG. 14 is a flow chart of an accessing process using a copy management table CCT.

Judgment is first made as to whether a record is to be read or written (step 151), and in the case of reading the record, whether the track being accessed is valid or invalid is judged (step 152) by reference to the copy management table CCT (step 152). If the track is valid, the record is read out of the track (step 153), and if the track is invalid, error control processing is executed (step 154). In the case of writing, if the track being accessed is invalid, the track is changed to be valid (step 155) and thereafter the record is written in the track (step 156).

As described above, it is possible to evacuate the contents of the memory of the semiconductor memory module in which a memory error has occurred without stopping the semiconductor disk apparatus simply by adding the spare semiconductor disk apparatus, so that a large-scale maintenance device is obviated. Since the semiconductor memory module is minutely divided into access control units and the contents of the memory are copied one access control unit at a time, it is possible to conduct exclusive control one access control unit at a time, so that the host apparatus can access the access control unit which is not the object of copying even if the service adapter is in the process of copying another access control unit. In other words, the copying operation exerts no deleterious influence on the access of the host apparatus.

In addition, since every time the copy of one access control unit is finished, the service adapter SA changes the physical address in the control table CTL provided in the channel adapter CA, etc. to the physical address of the copy receiver, it is possible to access the copied access control unit (in the spare semiconductor memory module) immediately after the copy.

Furthermore, the copy management table CCT for recording whether or not copy has been normally finished for each access control unit is provided, and each module including the channel adapter CA, etc. refers to the copy management table at the time of reading data. When the region (track) being accessed is normal, the module accesses the region. On the other hand, if the region is abnormal, the module judges it as an error. As a result, when an error occurs during copying, the erroneous data is not read, thereby preventing malfunction.

(a-4) Summary of second semiconductor memory module replacement control process

Figure 15:
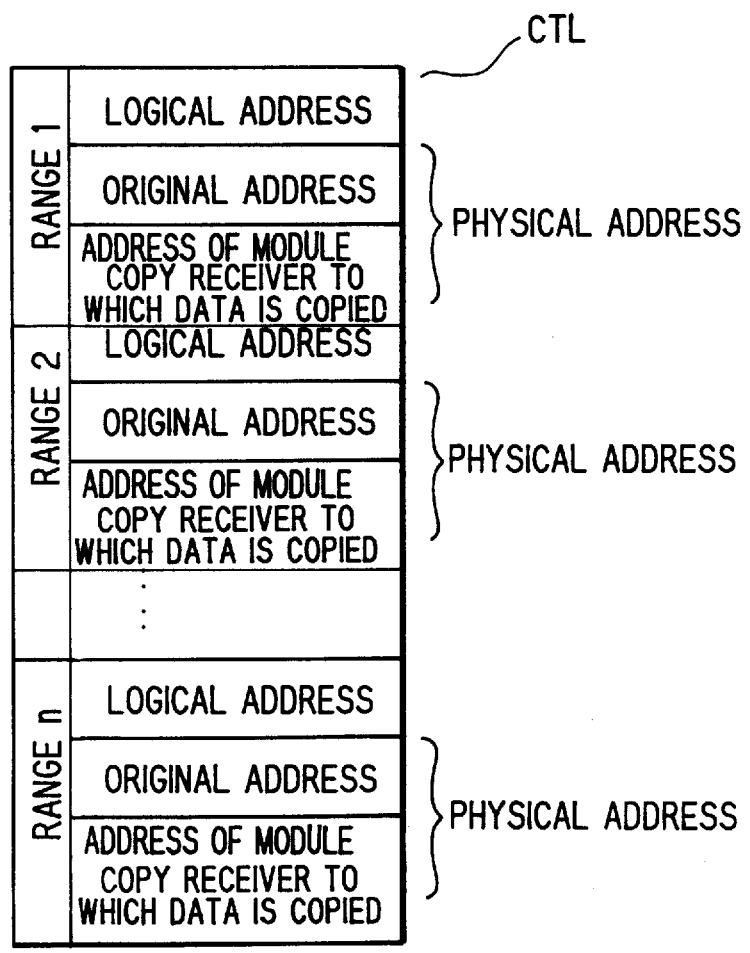
FIG. 15 shows another structure of a control table.

The first semiconductor memory module replacement control process is executed when the control table CTL has the structure shown in FIG. 2. The control table CTL may have the structure shown in FIG. 15. The control table CTL is provided with fields for (1) the logical address (CCHH), (2) the original physical address of the semiconductor disk and (3) the physical address of a copy receiver for each range (access control unit) of each semiconductor memory module. The logical address is an address (e.g., cylinder/head number CCHH when designated by the data address of a magnetic disk), and the original physical address is an actual address for accessing a semiconductor memory module in the semiconductor disk apparatus. Ordinarily, only the logical address and the original physical address are written in correspondence with each other for each range, and the physical address of a copy receiver is regarded as invalid (a mark or the like is written).

The semiconductor disk 14 is composed of three semiconductor memory modules (MS1–MS3) 14a to 14c and one spare semiconductor memory module (HS) 16, and each of the semiconductor memory modules 14a to 14c is composed of five access control units, as shown in FIG. 4. FIG. 16 explains the contents of each control table CTL at the time of initiation. In FIG. 16, the symbol CTLa represents a control table portion for the semiconductor memory module (MS1) 14a, CTLb a control table portion for the semiconductor memory module (MS2) 14b, and CTLc a control table portion for the semiconductor memory module (MS3) 14c. The symbol XXXX represents a logical address and MS1-00 the offset address 00 (see FIG. 4) of the semiconductor memory module (MS1) 14a, the same applying to MS1-00 to MS3-04.

When a memory error occurs in the semiconductor memory module (MS2) 14b, the data in the semiconductor memory module 14b are copied to the spare semiconductor memory module 16 one access control unit at a time under the control of the service adapter SA. In this case, the service adapter SA instructs each module to change the contents of the control table prior to the copying process. Namely, the service adapter SA instructs each module to change the contents of the control table so that both (1) the original physical address and (2) the physical address of a copy receiver corresponds to each logic address of the semiconductor memory module in which the error has occurred. The control table CTL of each module is thus updated as shown in FIG. 17.

Figure 18:
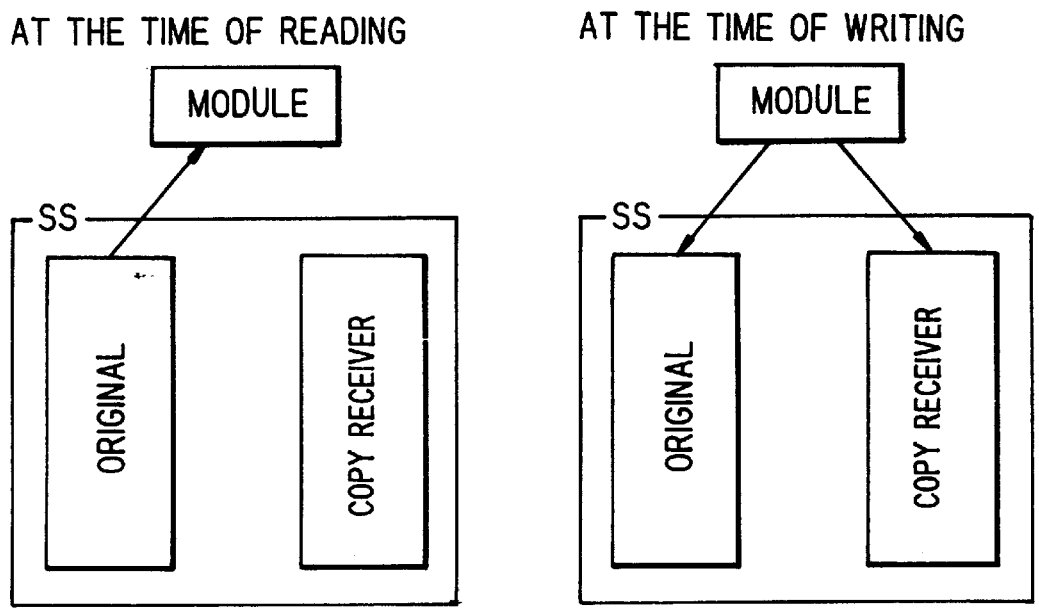
FIG. 18 is am explanatory view of a forking process

The service adapter SA also instructs each module including the channel adapter CA, etc. to execute a forking process at the time of accessing the semiconductor memory module 14b. The forking process is a process in which as shown in FIG. 18 data is read out of the area designated by the original physical address and data is written in the two storage areas designated by the original physical address and the physical address of the copy receiver.

Figure 19:
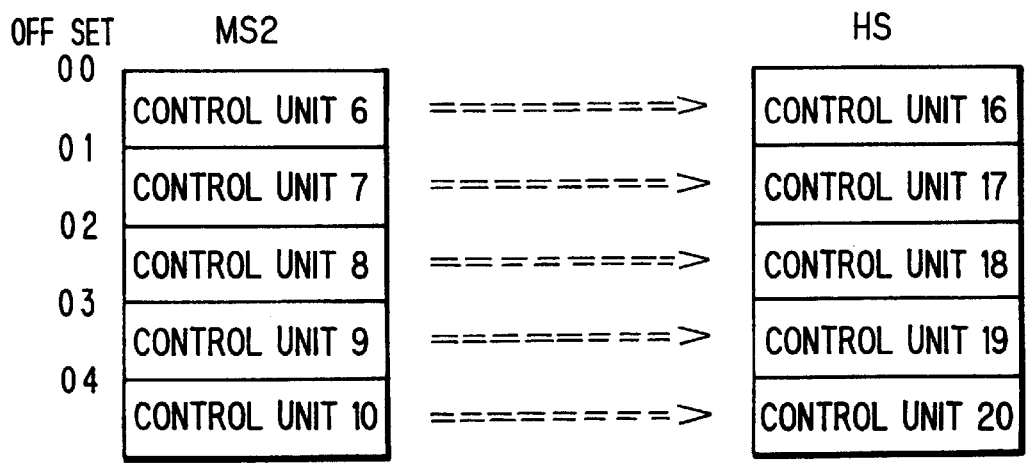
FIG. 19 is an explanatory view of a copying process

Thereafter, the copying operation for each control unit is executed, as shown in FIG. 19, and when the copying operation of all control units is finished, the service adapter SA instructs each module to exchange the original physical address with the physical address of the copy receiver in the control table CTL. The control table CTL of each module is thus changed as shown in FIG. 20. The service adapter SA then notifies the end of the forking process to each module and instructs each module to render the fields for the physical addresses of the copy receiver invalid, thereby ending the copying process. The resulting control table CTL of each module is shown in FIG. 21. As shown in FIG. 21, the original physical address is changed to the physical address of the copy receiver (the spare semiconductor memory module 16) in each range of the semiconductor memory module 14b.

(a-5) Second semiconductor memory module replacement control process

Copying process

Figure 22:
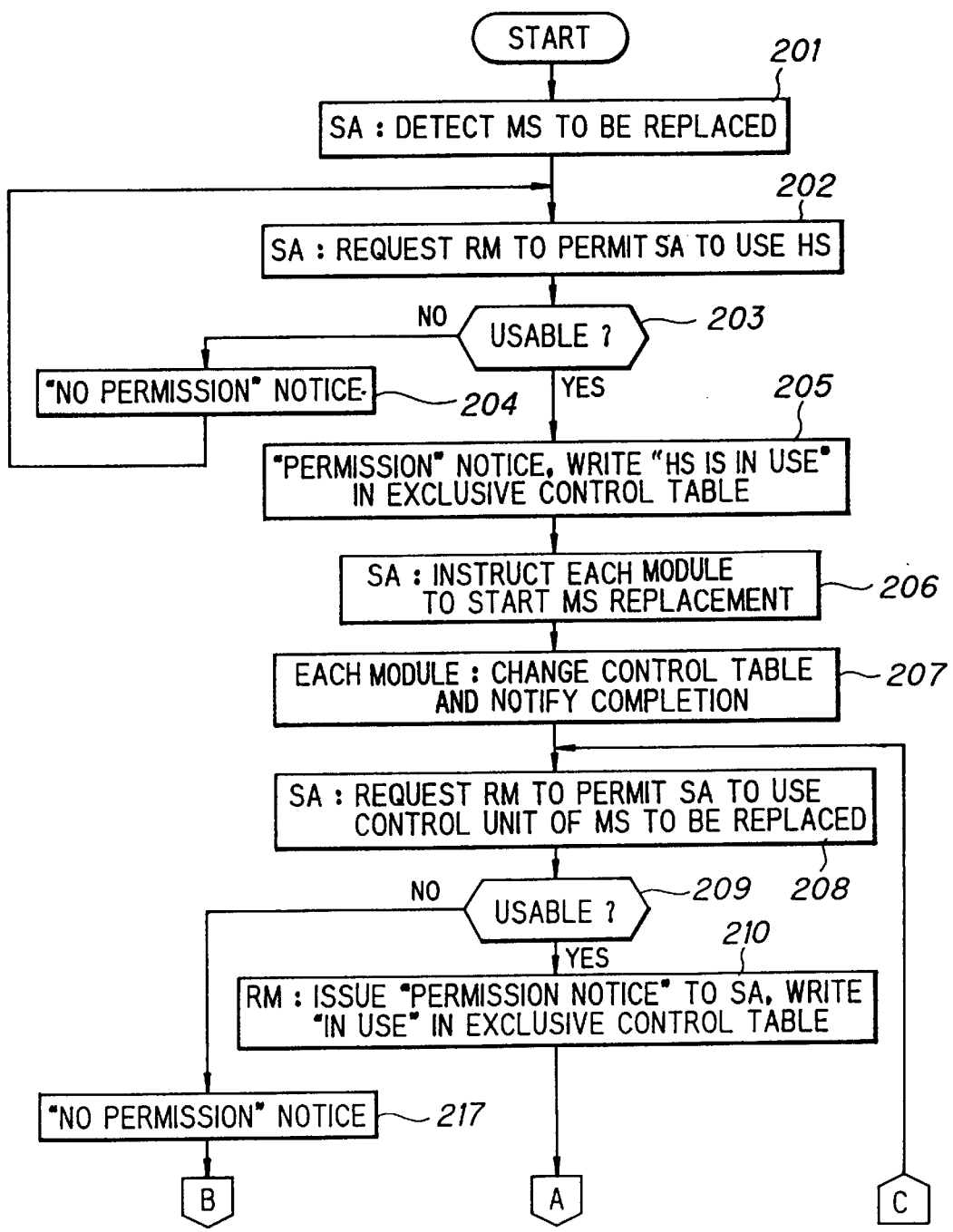
FIG. 22 is an explanatory view of a flow chart 1 of a copying process.
Figure 23:
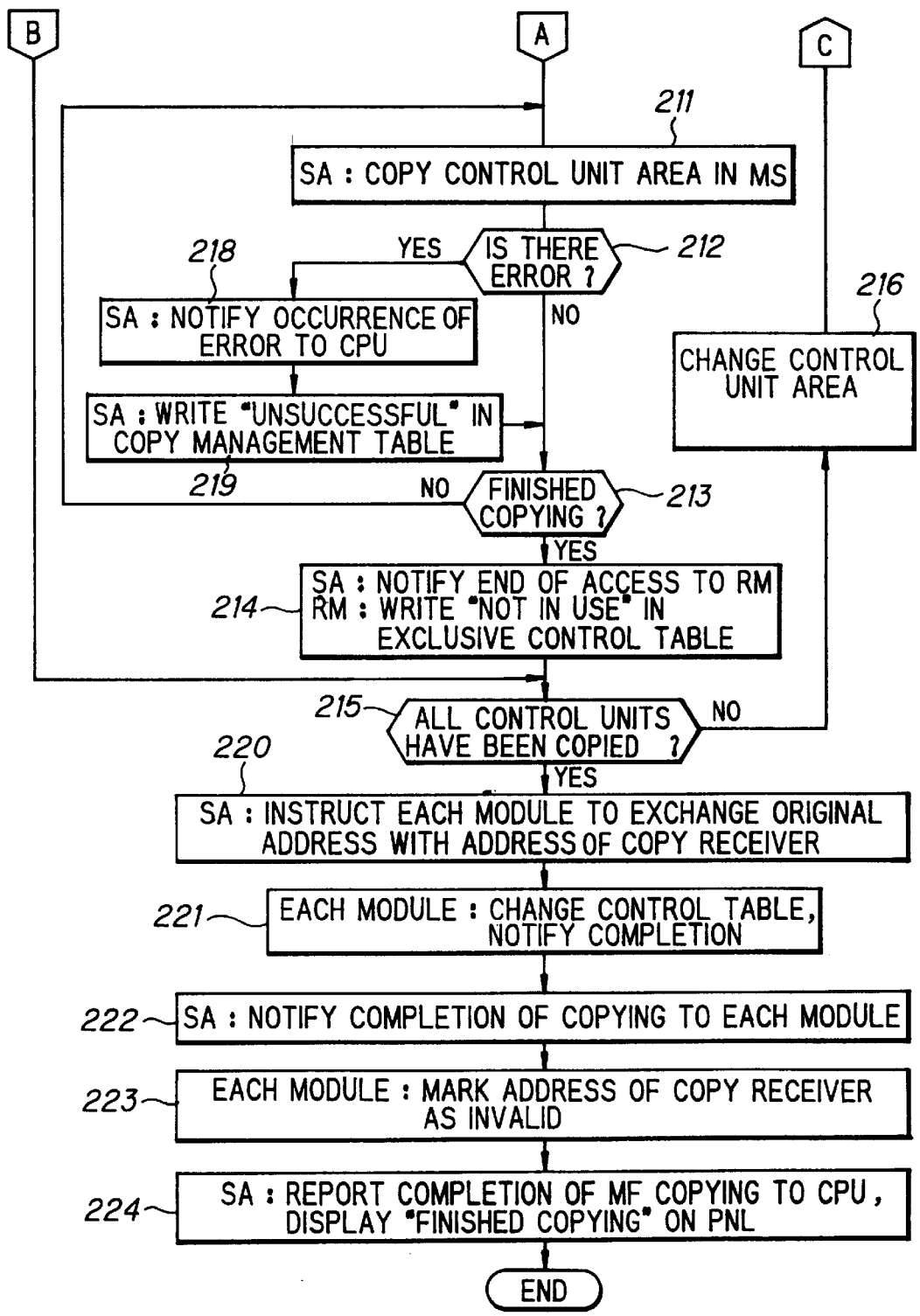
FIG. 23 is an explanatory view of a flow chart 2 of a copying process.

FIGS. 22 and 23 are flow charts of a copying process for copying the contents of the memory of a semiconductor memory module to a spare semiconductor memory module. The control table CTL has the structure shown in FIG. 16.

The service adapter (SA) 13 detects a semiconductor memory module, for example, 14b in which an error has occurred by the designation from the maintenance panel (PNL) 15 or error management (step 201).

When the service adapter SA detects the semiconductor memory module in which a memory error has occurred, it asks the resource manager (RM) 13b for permission to use the spare semiconductor memory module (HS) 16 (step 202). The resource manage RM issues a "no permission" notice to the service adapter SA when the spare semiconductor memory module HS is in use (steps 203, 204). In this case, the service adapter SA waits until permission to use the spare semiconductor memory module HS is issued. If the spare semiconductor memory module HS is not in use, the resource manager RM issues permission to use it to the service adapter SA and writes that the spare semiconductor memory module HS is in use in the exclusive control table ECT within the resource manager RM (step 205).

The service adapter SA then instructs each module including the channel adapter CA, etc. to start exchange of the semiconductor memory module 14b and a forking process (step 206). The service adapter SA also instructs each module to change the content of the control table CTL. In accordance with the instruction, each module changes the content of the control table CTL (see FIG. 17) and reports the completion of the changing operation to the service adapter SA (step 207).

When the service adapter SA receives the report of the completion of the changing operation from each module, the service adapter SA asks the resource manager RM for permission to use a first access control unit of the semiconductor memory module 14b in which an error has occurred (208).

If it is usable, the resource manager RM issues permission to the service adapter SA and writes that the first access control unit is in use in the exclusive control table ECT (steps 209, 210).

When the service adapter SA receives the permission, it begins to copy the control unit (step 211). If the copying operation is finished without any error (steps 212, 213), the service adapter SA reports the end of access to the resource manager. The resource manager RM then writes that the first access control unit is not in use (step 214). The service adapter SA judges whether or not all control units in the semiconductor memory module 14b have been finished copying (step 215).

If the answer is in the negative at the step 215, the control unit as an object of copying is changed to another control unit which has not been copied (step 216), and the processing at the step 208 and thereafter is repeated.

If the first access control unit is in use at the step 209, the resource manager RM issues a "no permission" notice to the service adapter SA (step 217). The service adapter SA skips processing to the step 215 and repeats the processing at the step 215 and thereafter.

If an error occurs in a certain track during copying at the step 212, the service adapter SA notifies the occurrence of an error to the host apparatus CPU via the channel adapter CA (step 218), and writes that copy is unsuccessful in the corresponding track of the copy management table CCT (step 219). Thereafter, the processing at the step 213 and thereafter is repeated.

If the answer is in the affirmative at the step 215, the service adapter SA instructs each of the modules 13a-1, 13a-2, 13b, etc. to exchange the original physical address with the physical address of the copy receiver in the table portion relating to the semiconductor memory module 14b (step 220). Each module changes the content of the control table CTL as instructed (see FIG. 20) and reports the completion of the changing operation to the service adapter SA (step 221). The service adapter SA notifies the end of the copying process and the forking process to each module (step 222), and then instructs each module to render the fields for the physical addresses of the copy receiver in the table portion CTLb relating to the semiconductor memory module 14b in valid (step 223). Each module changes the content of the control table CTL as instructed (see FIG. 21). The original physical address is thus changed to the physical address of the copy receiver which is the spare semiconductor memory module.

The service adapter SA reports the end of the copying operation to the host apparatus CPU via the channel adapter CA, and displays that the copying operation is finished on the maintenance panel PNL (step 224), thereby finishing the copying process. When the copying process is finished, a maintenance man replaces the semiconductor memory module (MS) 14b in which the error has occurred by a new semiconductor memory module.

As described above, it is possible to evacuate the contents of the memory of the semiconductor memory module in which a memory error has occurred without stopping the semiconductor disk apparatus simply by adding the spare semiconductor disk apparatus. In addition, each module including the channel adapter CA, etc. writes data in the two storage areas designated by the original physical address and the physical address of the copy receiver in accordance with the forking process, when the data are written in the semiconductor memory module which is in the process of copying. It is therefore possible to copy at high speed without the need for changing the control table every time one control unit is finished copying unlike in the first semiconductor memory module replacement control process.

Figure 24:
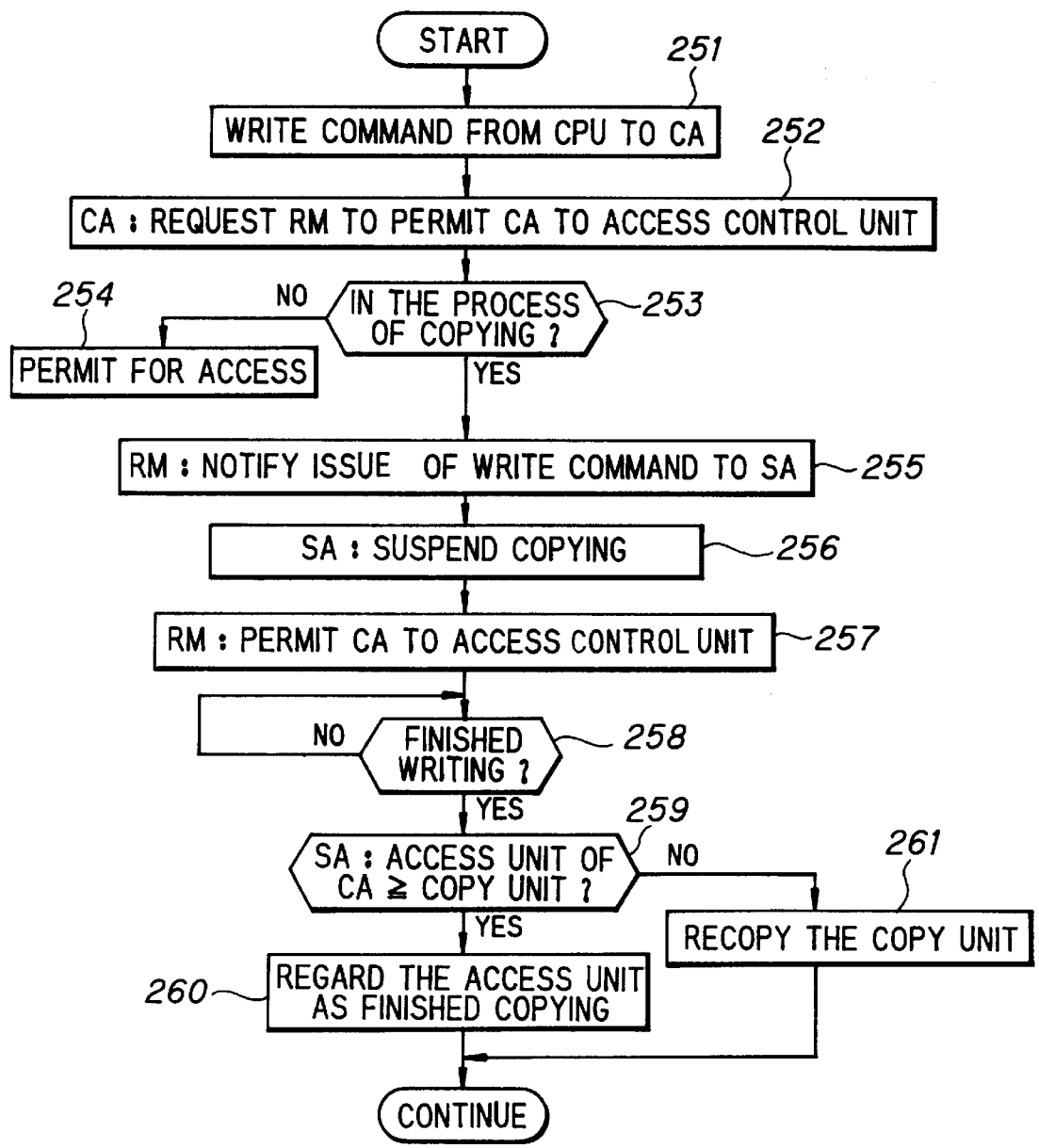
FIG. 24 is a flow chart of processing when a write command is issued to the control unit area in the process of copying.

Processing when a write command is issued to the control unit area in the process of copying The host apparatus CPU sometimes issues a write command to the control unit area in the process of copying. In this case, it is possible to keep the write command waiting until the copying operation is finished, but the access speed of the host apparatus is then reduced. To prevent this, priority is given to the write command and the copying operation is suspended. FIG. 24 is a flow chart of such processing when a write command is issued to the control unit area in the process of copying.

When a write command is issued from the host apparatus CPU to the control unit in the process of copying (step 251), the channel adapter CA asks the resource manager RM for permission to access the access control unit (step 252). The resource manager RM judges whether or not the access control unit is in the process of copying, and if the answer is NO, the resource manager RM permits the channel adapter CA to access the access control unit (steps 253, 254). The channel adapter CA then executes the write command in accordance with the forking process.

On the other hand, if the access control unit is being copied at the step 253, the resource manager RM informs the service adapter SA that a write command is issued from the host apparatus to the control unit area in the process of copying (step 255). The service adapter SA then stops copying (step 256). Thereafter, the resource manager RM permits the channel adapter CA to access the access control unit area (step 257), and the channel adapter CA executes the write command in accordance with the forking process.

When the writing operation by the channel adapter CA is finished (step 258), the service adapter SA compares the access unit (number of tracks=Aw) for writing with the access unit (number of tracks=Ac) for copying (step 259).

If Aw≧Ac, the service adapter SA regards the access unit as the object of the write command as finished copying (step 260), and resumes copying as to the remaining portion.

On the other hand, if Aw<Ac, the service adapter SA regards the access unit as the object of the write command as not finished copying, and copies from the beginning or copies the control units except the access unit as the object of the write command (step 261). Thereafter, the service adapter SA resumes copying as to the remaining portion.

In this manner, since the copying operation is suspended so as to execute the write command from the host apparatus CPU, the access speed of the host apparatus is not reduced. When the access unit as the object of writing is larger than the access unit for copying, it is possible to regard the access unit portion as finished copying, so that the copying speed can be enhanced.

(a-6) Actual structure of semiconductor disk apparatus

Figure 25:
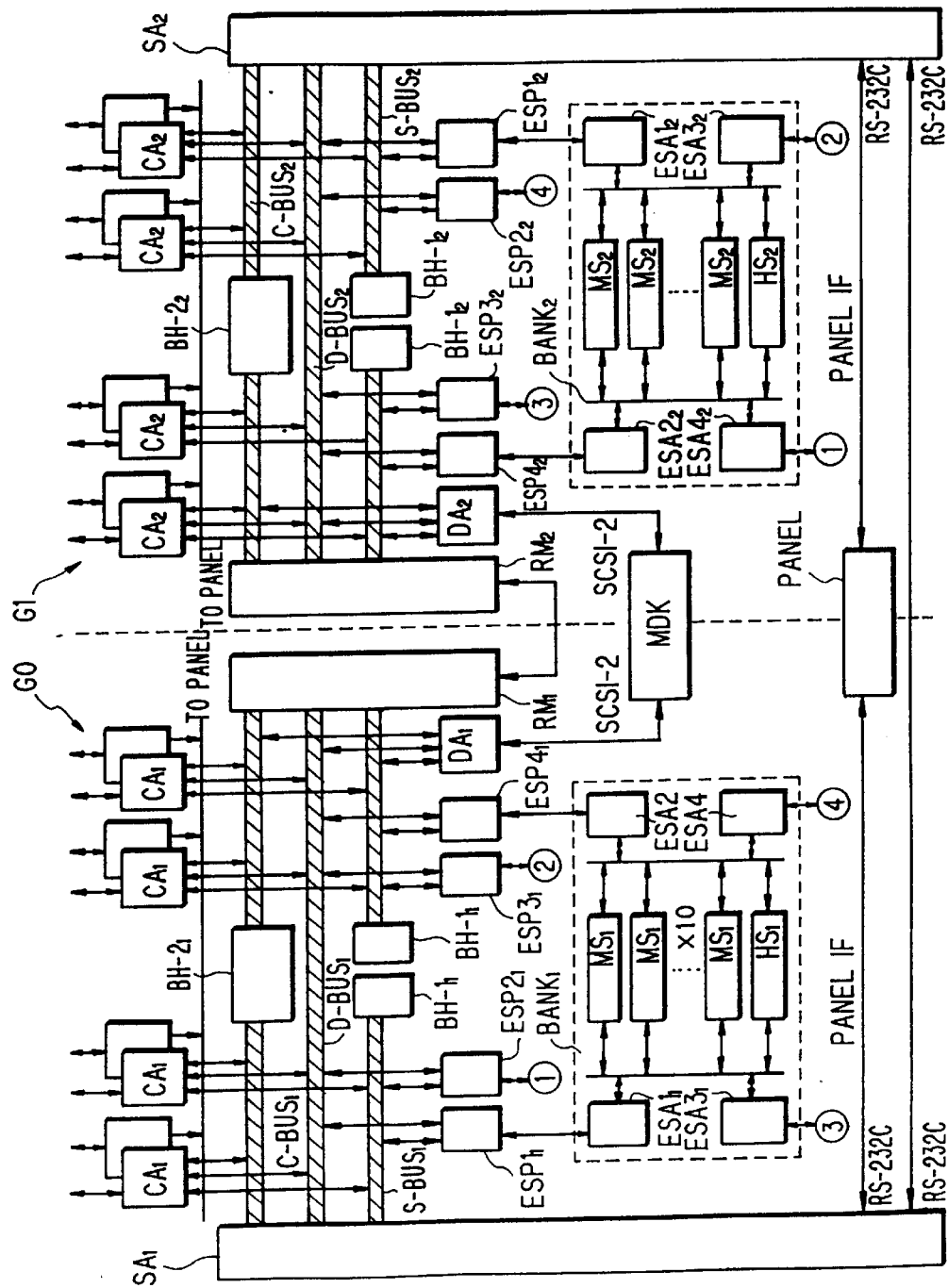
FIG. 25 shows the actual structure of a semiconductor disk apparatus.

FIG. 25 shows the entire structure of a semiconductor disk apparatus. The semiconductor disk apparatus has a duplicate structure, and a module having a subscript 1 is a module of a first semiconductor disk apparatus G0, a module having a subscript 2 is a module of a second semiconductor disk apparatus G2, and a module having no subscript is a common module. A control storage portion (control memory) CS is provided within each module.

The symbol CA represents the channel adapter for executing interface control to a channel of the host apparatus CPU. Various channel adapters which correspond to an electric channel, an optical channel and an OC link are appropriately connected to a host apparatus. The symbol RM represents the resource manager for conducting controlling operations such as exclusive control and logical path control and for controlling the resource of the system as a whole. The symbol SA denotes the service adapter which serves as a master so as to manage other units (modules).

The symbol C-BUS denotes a control bus for conducting message communication and access of control information, D-BUS a data transfer bus for transmitting and receiving data between each unit and the semiconductor disk, and S-BUS a service bus through which the service adapter as a master monitors the situation of each unit. The symbol BH-1, BH-2 represent bus handler for controlling the contention of buses and distributing bus clocks, MDK a magnetic disk apparatus (option) for temporarily backing up the contents of a memory when the memory has a trouble, DA a device adapter for conducting interface control to the magnetic disk apparatus, and BANK the semiconductor disk (common memory) on which semiconductor memory modules MS and a spare semiconductor memory module HS are mounted. The symbols $ESP_1$ to $ESP_4$ denote ports (Extended Storage Ports) for controlling the access to the semiconductor disk, $ESA_1$ to $ESA_4$ memory interface adapters for controlling the timing between the semiconductor memory modules MS, refreshing a memory and correcting data on the basis of error check code, and PANEL a maintenance panel.

The first and second semiconductor disk apparatuses G0, G1 have a symmetrical structure with respect to the dotted line at the center. The host apparatus CPU is symmetrically connected to the channel adapters $CA_1$, $CA_2$ of the first and second semiconductor disk apparatuses, and the ports ESP2 and ESP3 of each semiconductor disk apparatus are connected to the memory adapters ESA3 and ESA4 of the other semiconductor disk apparatus. Accordingly, even if there is a trouble in one channel adapter, the CPU can access the semiconductor disk apparatus from the other channel adapter. In addition, even if there is a trouble in one semiconductor disk apparatus, the CPU can access the other semiconductor disk apparatus. In this manner, the reliability is enhanced.

Figure 26:
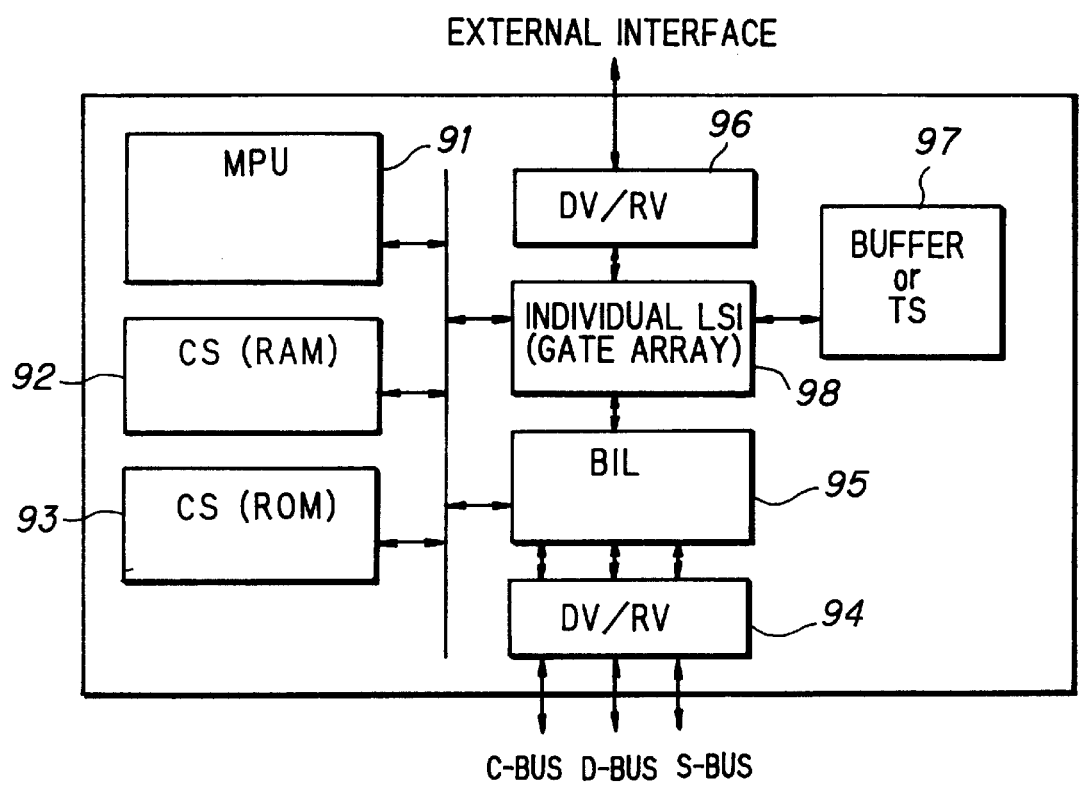
FIG. 26 shows the structure of each module.

A module such as the channel adapter CA, the resource manager RM and the service adapter SA is composed of a microprocessor, which has substantially the same structure as that shown in FIG. 26. In FIG. 26, the reference numeral 91 represents a microprocessor (MPU), 92 a control storage portion (CS) having a RAM structure, 93 a control storage portion (CS) having a ROM structure, 94 a driver/receiver (DV/RV) connected to an internal bus, 95 a bus interface logic (BIL), 96 a driver/receiver (DV/RV) connected to an external interface, 97 a buffer or a table storage portion (TS), and 98 an individual LSI (gate array). The number of drivers/receivers (DV/RV) connected is different depending upon the number of external interfaces connected thereto.

(b) Second embodiment
(b-1) Entire structure

When the power switch of a semiconductor disk apparatus is turned off, the contents of the memory are lost. To prevent this, a backup disk apparatus is sometimes connected to a semiconductor disk apparatus.

Figure 27:
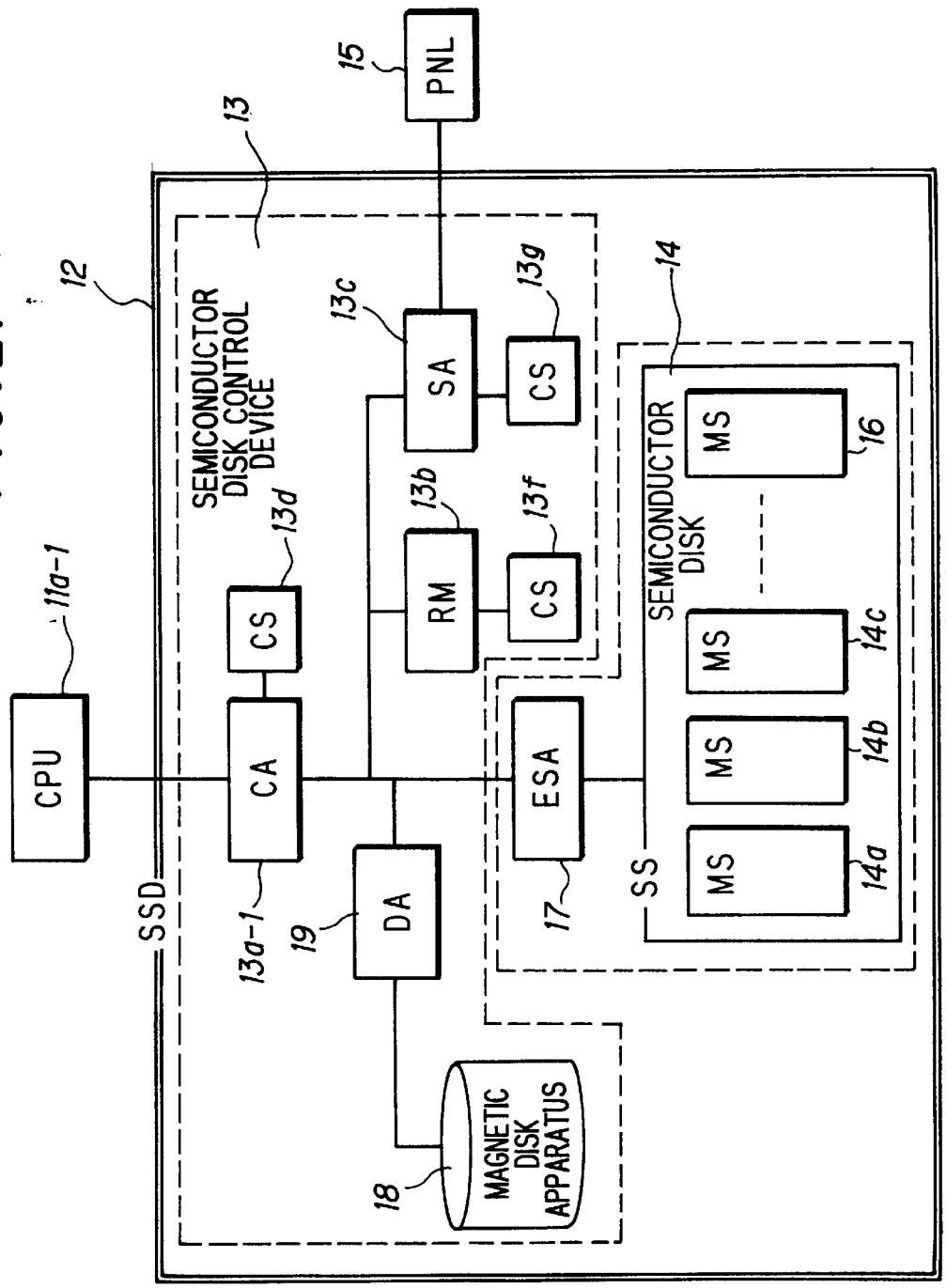
FIG. 27 shows the structure of another semiconductor disk apparatus (second embodiment) according to the present invention.

FIG. 27 shows the structure of a semiconductor disk apparatus provided with a backup disk apparatus. The same reference numerals are provided for the elements which are the same as those in FIG. 1. The reference numeral 11a-1 represents a CPU (host apparatus), 12 a semiconductor disk apparatus (SSD), 13 a semiconductor disk control device, 14 a semiconductor disk and 15 a maintenance panel (PNL) for issuing various instructions to a service adapter (SA) so as to execute maintenance.

The semiconductor disk 14 includes semiconductor memory modules (MS: Main Storage) 14a, 14b, 14c and 16 a spare semiconductor memory module (HS: Hot Spare Memory) for serving as a substitute of the semiconductor memory module until it is replaced by a new semiconductor memory module when an error is produced in the semiconductor memory module. The reference numeral 17 represents a memory interface adapter.

In the semiconductor disk apparatus 12, the reference numerals 13a-1 represents a channel adapter (CA), 13b a resource manager (RM), 13c a service adapter (SA), and 13d, 13f and 13g control storage portions for storing a control table CTL and various programs. The reference numeral 18 denotes a backup magnetic disk apparatus for storing the data stored in the semiconductor disk 14 while the power is off, and 19 a disk adapter for evacuating the data stored in the semiconductor disk 14 to the magnetic disk apparatus 18 and restoring the evacuated data to the semiconductor disk 14 by reading it from the magnetic disk apparatus 18.

(b-2) Logical drive structures in the semiconductor disk and the magnetic disk apparatus Each of the semiconductor memory modules (MS) 14a to 14c which constitute the semiconductor disk 14 is composed of one printed board which is inserted into a slot of a memory bank. Each of the semiconductor memory modules (MS) 14a to 14c is divided into a plurality of logical drives having a predetermined size, and the host apparatus CPU designates a predetermined logical drive by issuing a Start I/O command. If the designated logical drive is usable, the CPU accesses a predetermined position of the logical drive.

Figure 28:
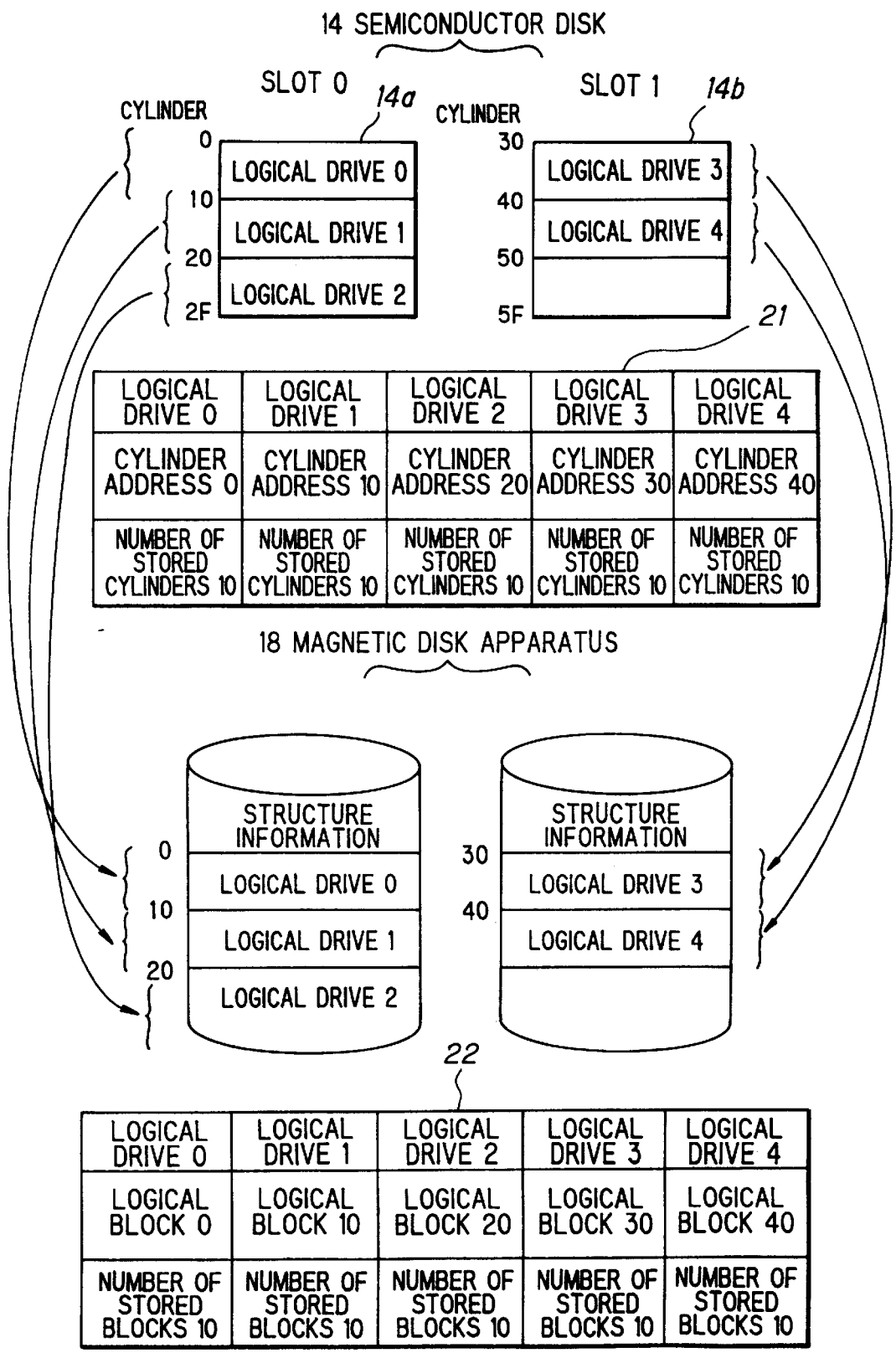
FIG. 28 shows the logical drive structures in the semiconductor disk and the magnetic disk apparatus of the second embodiment.

FIG. 28 shows the logical drive structures in the semiconductor disk 14 and the magnetic disk apparatus 18. It is assumed that the semiconductor disk 14 is composed of two semiconductor memory modules 14a and 14b. The first semiconductor memory module 14a is provided with three logical drives 0 to 3, each having a size of 10 cylinders. The second semiconductor memory module 14b is provided with two logical drives 3 and 4, each having a size of 10 cylinders.

The logical drive structure in the magnetic disk apparatus 18 has a one-to-one correspondence with the logical drive structure in the semiconductor disk 14, as indicated by the arrows in FIG. 28. In other words, the logical drive structure in the magnetic disk apparatus 18 is the same as that in the semiconductor disk 14.

A first structure information table 21 which shows the structure of the logical drives of the semiconductor disk 14 stores the head address (cylinder address) and the capacity of each of the logical addresses 0 to 4, and it is stored in a predetermined semiconductor memory module (master module) 14a. A second structure information table 22 which shows the structure of the logical drives of the magnetic disk apparatus 18 has the same structure as the first structure information table, and is stored in the magnetic disk apparatus 18.

In the case of evacuating the data stored in the semiconductor disk 14 to the magnetic disk apparatus 18, the disk adapter (DA) 19 reads the first and second structure information tables 21, 22. The disk adapter 19 then reads the data in the i-th (i=0 to 4) logical drive from the semiconductor disk 14 by reference to the first structure information table 21, and stores the data in the i-th (i=0 to 4) logical drive of the magnetic disk apparatus 18 by reference to the second structure information tale 22.

In the case of restoring the data evacuated to the magnetic disk apparatus 18 to the semiconductor disk 14, the disk adapter (DA) 19 reads the first and second structure information tables 21, 22. The disk adapter 19 then reads the data in the i-th (i=0 to 4) logical drive of the magnetic disk apparatus 18 by reference to the second structure information table 22, and stores the data in the i-th (i=0 to 4) logical drive of the semiconductor disk 14 by reference to the first structure information tale 21.

(b-3) Problems in the case of changing the logical drive structure in the semiconductor disk 14

Figure 29A:
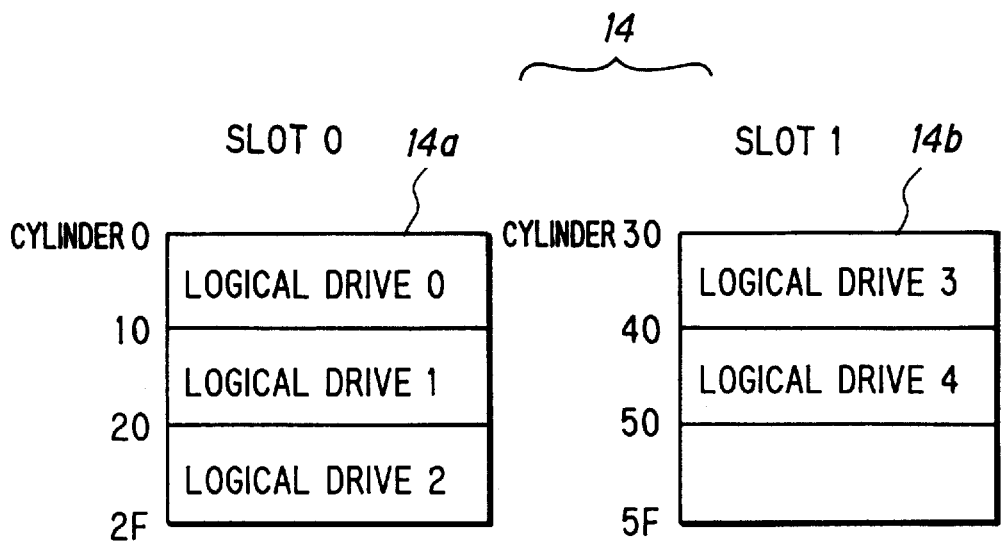
FIGS. 29A and 29B are explanatory view of a change in the logical drive structure.
Figure 29B:
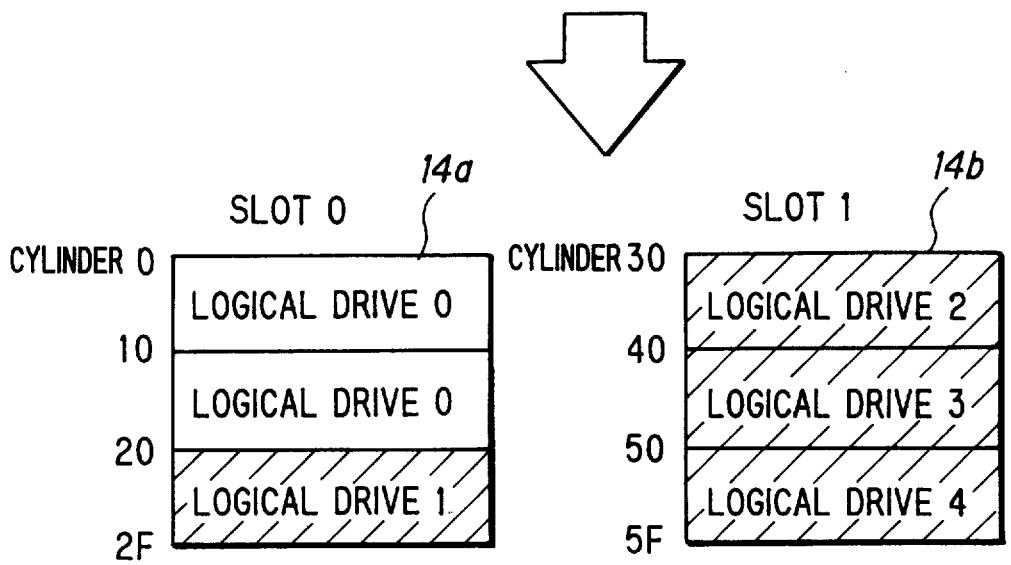

After evacuating the data in the semiconductor disk 14 to the magnetic disk apparatus 18, some users want to change the logical drive structure in the semiconductor disk 14. FIGS. 29A and 29B are explanatory views of a change in the logical drive structure. FIG. 29A shows the structure before change and FIG. 29B shows the structure after change, wherein the size of the logical drive 0 is increased from 10 cylinders to 20 cylinders and the head addresses of the logical drives 1 to 4 are changed.

Figure 30:
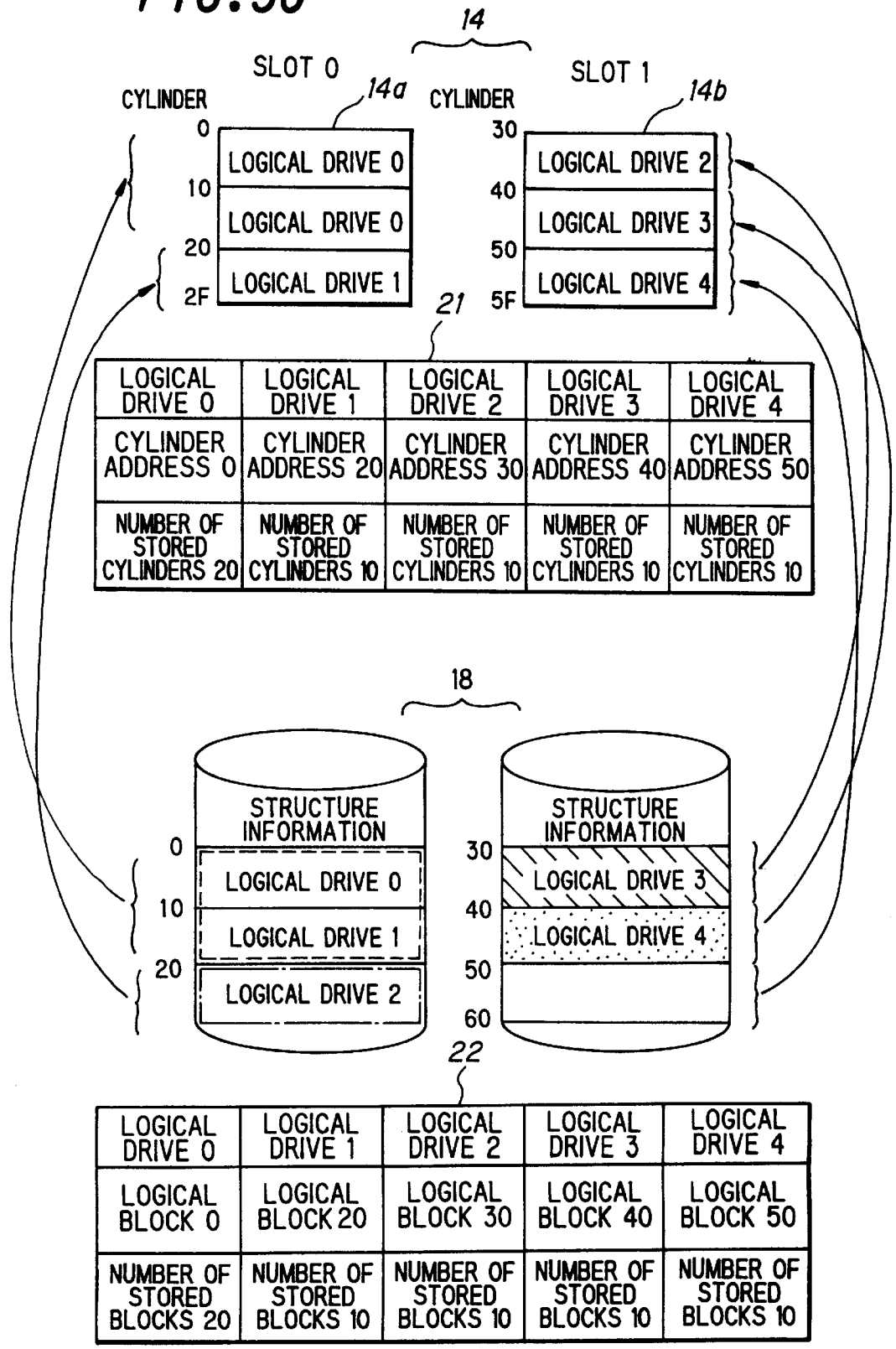
FIG. 30 is an explanatory view of a problem in a conventional apparatus at the time of a change in the logical drive structure in a conventional apparatus.

When the structure of the semiconductor disk 14 is changed as described above, the first and second structure information tables 21, 22 are changed as shown in FIG. 30 in a conventional semiconductor disk apparatus. As a result, at the time of restoration, the data evacuated to the magnetic disk apparatus 18 is restored as indicated by the arrows. In other words, the correct data restoration is impossible. More specifically, the data (circled by the dotted line) evacuated to the logical drives 0 and 1 of the magnetic disk apparatus 18 are restored to the logical drive 0 of the semiconductor disk 14, the data evacuated to the logical drive 2 of the magnetic disk apparatus 18 is restored to the logical drive 1 of the semiconductor disk 14, the data evacuated to the logical drive 3 of the magnetic disk apparatus 18 is restored to theological drive 2 of the semiconductor disk 14, and the data evacuated to the logical drive 4 of the magnetic disk apparatus 18 is restored to the logical drive 3 of the semiconductor disk 14. As a result, the evacuated data are not usable.

Figure 31:
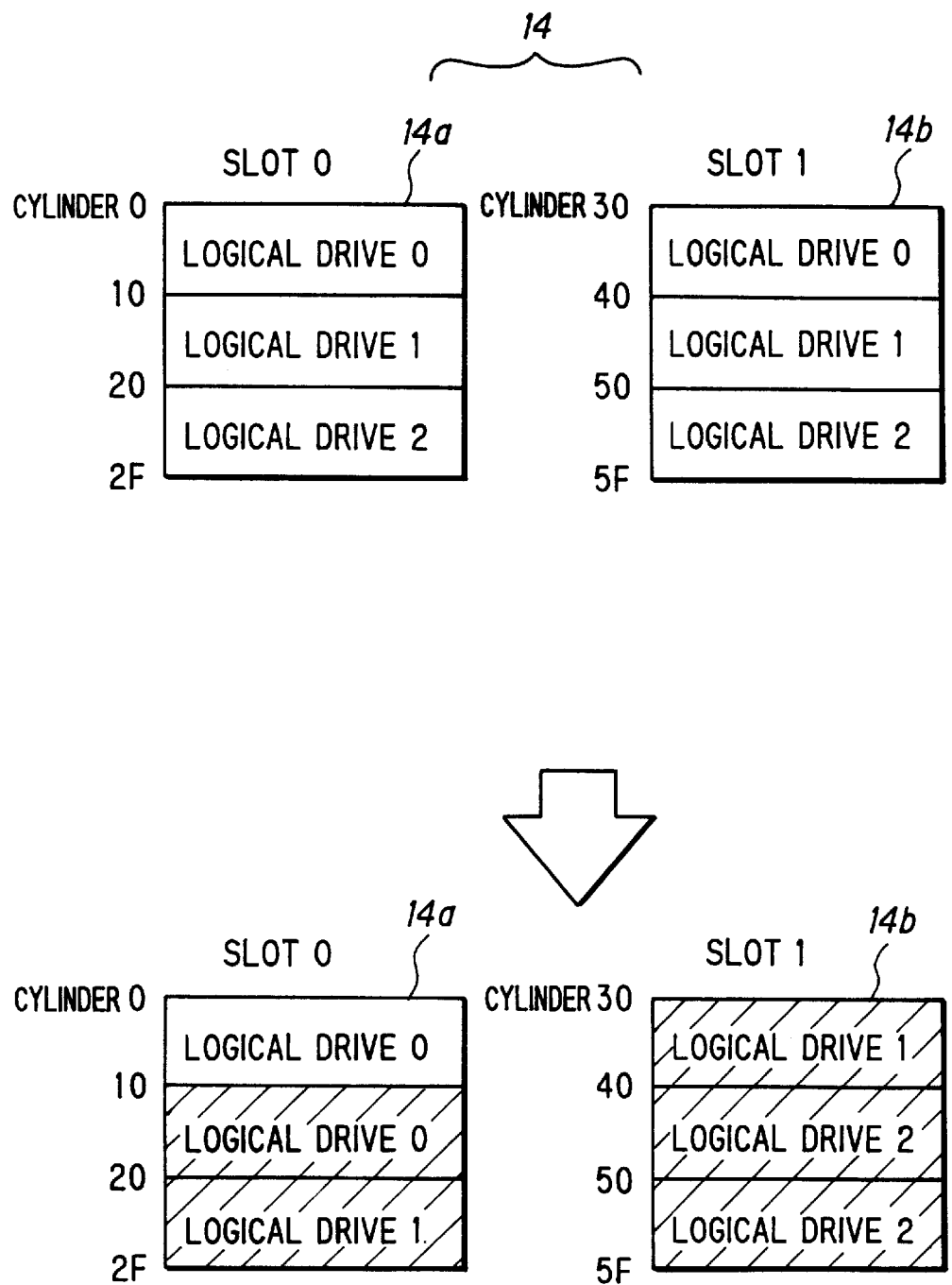
FIG. 31 is an explanatory view of another problem in a conventional apparatus at the time of a change in the logical drive structure in a conventional apparatus.

This is the case in which the size of a logical drive is changed, but when the arrangement of logical drives is changed, a similar problem is produced, as shown in FIG. 31.

(b-4) Summary of data restoration process

Figure 32:
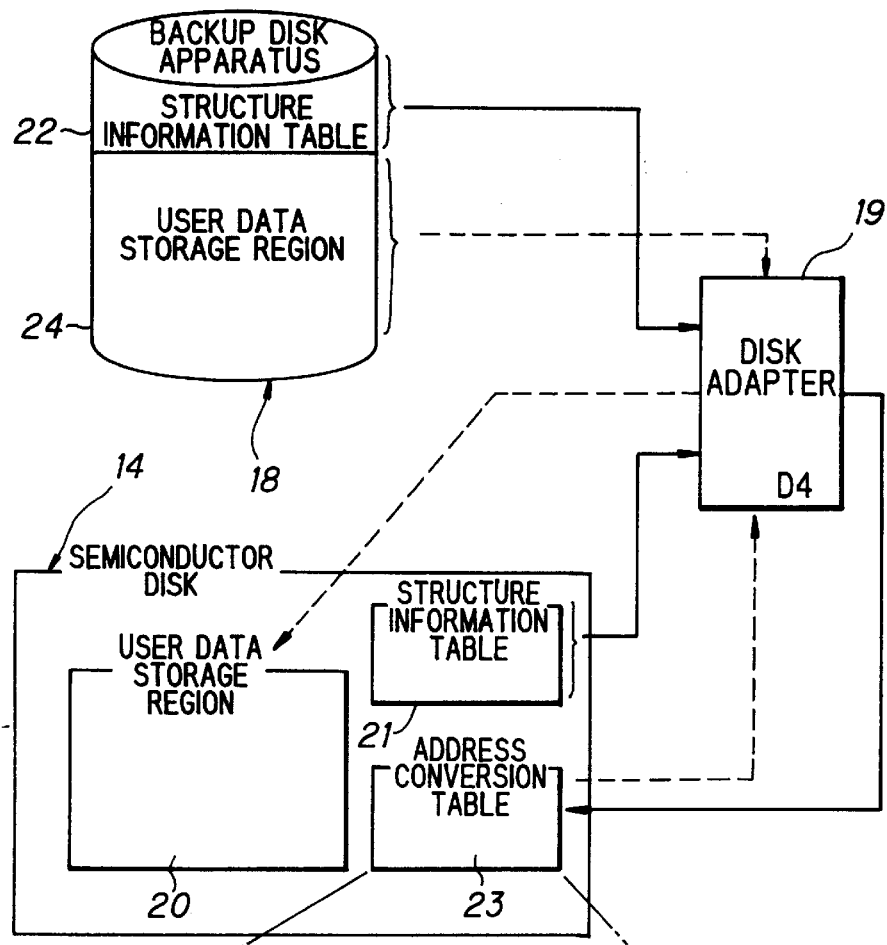
FIG. 32 is an explanatory view for schematically explaining a data restoration process in the present invention.

FIG. 32 schematically explains a data restoration process when the logical drive structure in the semiconductor disk 14 is changed after evacuation of data in the present invention. The reference numeral 14 represents the semiconductor disk, 18 the magnetic disk apparatus and 19 the disk adapter. In the semiconductor disk 14, the reference numeral 20 represents a user data storage region, 21 the first structure information table for holding the logical drive structure of the semiconductor disk 14, and 23 an address conversion table which will be described later. In the magnetic disk apparatus 18, the reference numeral 22 represents the second structure information table for holding the logical drive structure of the magnetic disk apparatus 18, and 24 a user data storage region. The semiconductor disk 14 and the magnetic disk apparatus 18 have the structure shown in FIG. 28 at the time of initiation.

After the data in the semiconductor disk 14 are evacuated to the magnetic disk apparatus 18, the logical drive structure is changed to the structure shown in FIG. 29B in accordance with the instruction from the maintenance panel (PNL) 15. The resulting first structure information table 21 is shown in FIG. 30.

When the maintenance panel PNL instructs data restoration, the disk adapter (DA) 19 reads the first and second structure information tables 21, 22 from the semiconductor disk 14 and the magnetic disk apparatus 18, and creates the address conversion table 23 (see FIG. 33) for converting the disk address into the address of the semiconductor memory module for each logical drive by using the first and second structure information tables 21, 22. In the address conversion table 23 are written (1) the head address and the number of cylinders of the semiconductor disk 14, and (2) the head address and the number of cylinders of the magnetic disk apparatus 18 for each logical drive.

Thereafter, the disk adapter DA reads the data in the i-th (i=0 to 4) logical drive from the magnetic disk apparatus 18 by reference to the address conversion table 23, as shown in FIG. 34, and stores the data in the i-th (i=0 to 4) logical drive of the semiconductor disk 14 which is designated by the address conversion table 23. In this manner, it is possible to restore the data evacuated to each logical drive of the magnetic disk apparatus 18 to the corresponding logical drive of the semiconductor disk 14 after the logical drive structure thereof is changed, so that the data are usable.

After the completion of restoration, the second structure information table 22 of the magnetic disk apparatus 18 is made coincident with the first structure information table 21 of the semiconductor disk 14.

(b-5) Data restoration process

Figure 35:
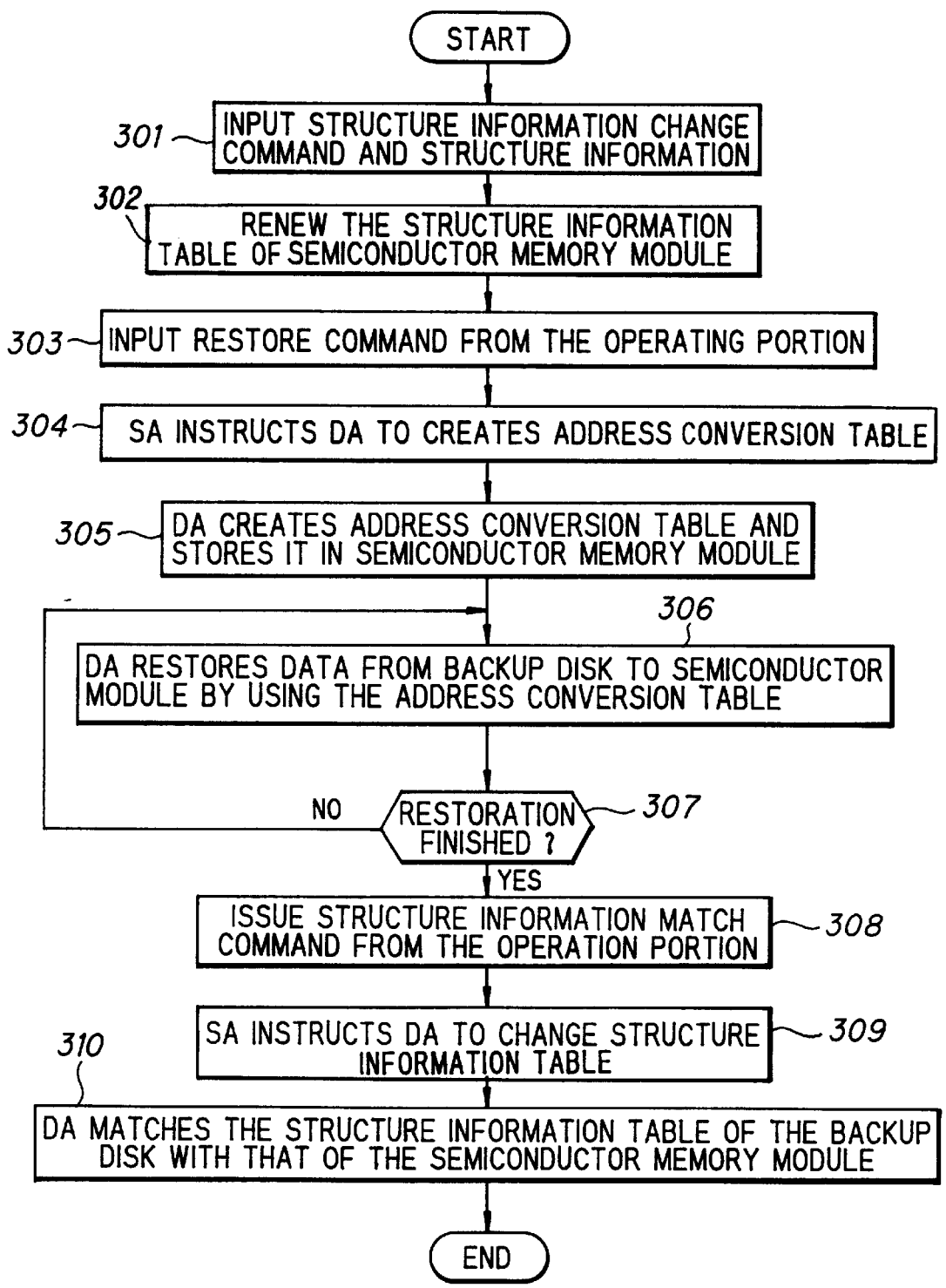
FIG. 35 is a flow chart of a data restoration process in the present invention.

FIG. 35 is a flow chart of a data restoration process in the present invention.

In order to change the logical drive structure in the semiconductor disk 14 after data are evacuated to the magnetic disk apparatus 18, a structure information change command and logical drive structure information are input from the maintenance panel (PNL) 15 (step 301). The service adapter SA then updates the first structure information table 21 which is stored in the semiconductor disk 14 (step 302). Thereafter, a restore command is input from the maintenance panel (PNL) 15 in order to restore the data evacuated to the magnetic disk apparatus 18 to the semiconductor disk 14 (step 303). When the restore command is input, the service adapter SA instructs the disk adapter (DA) 19 to create the address conversion table 23 (step 304).

The disk adapter DA reads the first and second structure information tables 21, 22 from the semiconductor disk 14 and the magnetic disk apparatus 18, creates the address conversion table 23 (see FIG. 32 or FIG. 33) by using the first and second structure information tables 21, 22, and stores the address conversion table 23 in the semiconductor disk 14 (step 305). The disk adapter DA then reads the data in the i-th (i=0 to 4) logical drive from the magnetic disk apparatus 18 by reference to the address conversion table 23, and stores the data in the i-th (i=0 to 4) logical drive of the semiconductor disk 14 which is designated by the address conversion table 23 (steps 306, 307).

If the restoration of all data to the semiconductor disk 14 is completed, a structure information match command is issued from the maintenance panel PNL (step 308). When the structure information match command is issued, the service adapter SA instructs the disk adapter DA to change the second structure information table 22 (step 309). The disk adapter DA then reads the first structure information table 21 from the semiconductor disk 14, creates the second structure information table 22 so as to have a one to one correspondence, and updates the contents stored in the magnetic disk apparatus 18 (step 310).

In this manner, even if the logical drive structure of the semiconductor disk is changed, it is possible to correctly restore the data evacuated to the backup device before the change of the logical drive structure to the semiconductor disk after the change, and the user data before the change are usable.

(c) Third embodiment (c-1) Structure of track format, directory and count portion Track format In a semiconductor disk apparatus, a directory (control information portion) is provided at a head of each track field. When the channel adapter CA accesses the user data in a designated track field, the channel adapter CA reads the directory of the track field and accesses the user data by using the directory.

FIG. 36 shows an example of a track format in a semiconductor disk. A directory is disposed at the head of each track, and a home address (HA) is disposed thereafter, and variable-length records (RECORD-0, RECORD-1, . . . ) are arranged thereafter in accordance with a CKD format. The home address (HA) represents a track address CCHH, and each record is composed of a count portion C, a key portion K and a data portion D.

Directory

Figure 37:
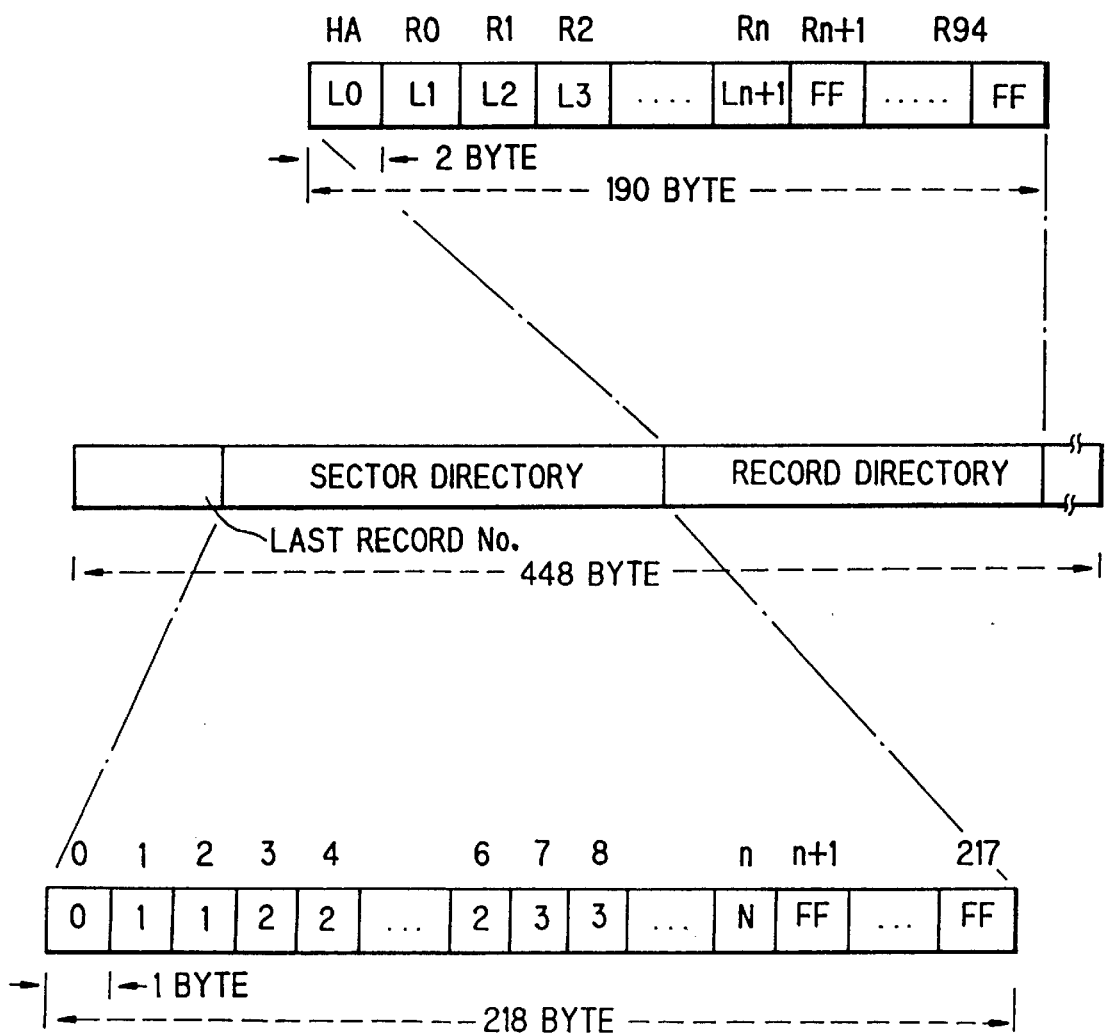
FIG. 37 shows the structure of a directory.

The directory has 448 bytes, as shown in FIG. 37, and it is composed of (1) a last record number of 1 byte, (2) a sector directory of 218 bytes, (3) a record directory of 190 bytes, (4) an area such as an ID portion for confirming the validity, and (5) an unused area.

The last record number shows the record number of the last record that is written in the track field. An end mark (EOF) is written immediately after the last record in each track, so that the last record is a record immediately before the end mark is read. The record number of the last record is the last record number.

The sector directory stores the physical record numbers which can be read first after set sector processing for the respective sector values. The physical record number is obtained by adding 1 to a logical record number with the home address HA as 0. Each track is divided into, for example, 218 sectors, and sector values 0 to 217 are allocated to the respective sectors. The sector value 217 is the last sector when the track is divided by a sector of a predetermined size, namely, it is the maximum sector value. The sector directory is used for set sector processing executed in accordance with a set sector command in order to indicate the record number of the record which is read out first in the set sector processing. Actually, there exist 0 to 221 sectors, but since no record comes after the sector value 217 because of the arrangement of records, the sector directory does not have sector values 218 to 221.

The record directory shows the offset address of each record from the head of the track by 2 bytes. It is possible to obtain the memory address of the count portion of a target record by adding the offset address of the target record to the head address of the track. There are record 0 to record 94 in the record directory. In other words, 94 is the maximum number of records that are written in the track. The record directory is used when the field of the record number obtained by sector processing is read or when the record directly designated by the record number is read.

Count portion

Figure 38:
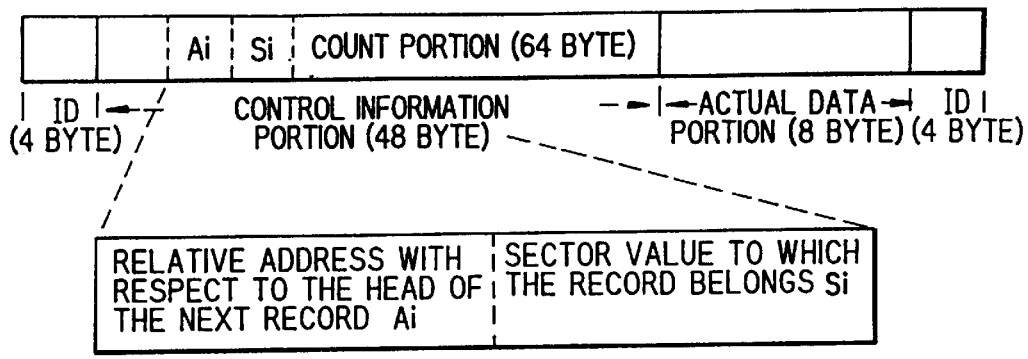
FIG. 38 shows the structure of a count portion.

Each record is composed of the count portion C, the key portion K (which is not essential) for recording a retrieval key, and the data portion D for recording user data, as described above. The count portion C has 64 bytes, as shown in FIG. 38, and it is composed of (1) an actual data portion of 8 bytes provided by the host, (2) an ID portion of 4 bytes which is added before and after the data so as to guarantee the data and (3) a control information portion of 48 bytes for accessing the track field. In the actual data portion are recorded a track address (CCHH), a record number (R), the length (KL) of the key portion subsequent to the count portion C, and the length (DL) of the data portion D. In the ID portion are recorded a code for identifying the head of the record, the latest time (time stamp) at which the data has been written, and so on. In the control information portion is recorded directory restoring data (control information restoring data) in order to enable a target record to be retrieved and a part of the directory to be restored even if the directory is lost. The directory restoring data includes (1) the relative address (offset address) $A_i$ from the head of the record to the head of the next record, and (2) the sector value $S_i$ of the sector at which the record is situated.

Since the lengths of the directory, the home address and the count portion of each record are fixed, the directory, the home address HA and the count portion of RECORD-0 are situated at fixed relative positions with respect to the head of the track. It is now assumed that the offset address from the head of the track to the home address HA is L0, and the offset address to a record Ri−1 is $L_i$. These offset addresses $L_i$ (i=0, 1, 2, . . . ) are recorded in the record directory (see FIG. 37). In this case, it is assumed that the offset address from the record Ri−1 to the record Ri is $A_i$, and the offset data $A_i$ is recorded in the count portion C of the record Ri−1 as the directory restoring data. The following relationship holds between $A_i$ and $L_i$:

$$L_i + A_i \rightarrow L_{i+1}.$$

Figure 39A:
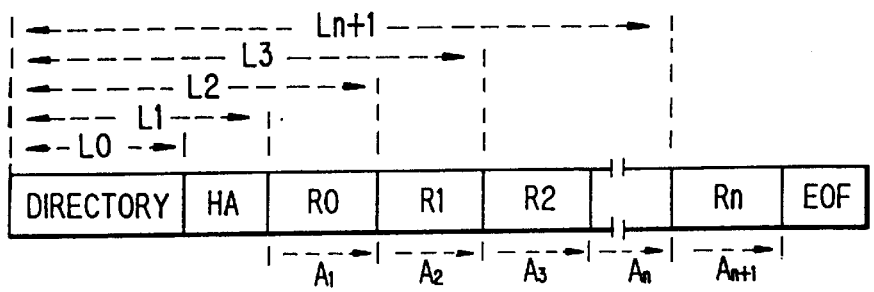
FIGS. 39A and 39B are explanatory views of the structure of a track field.
Figure 39B:
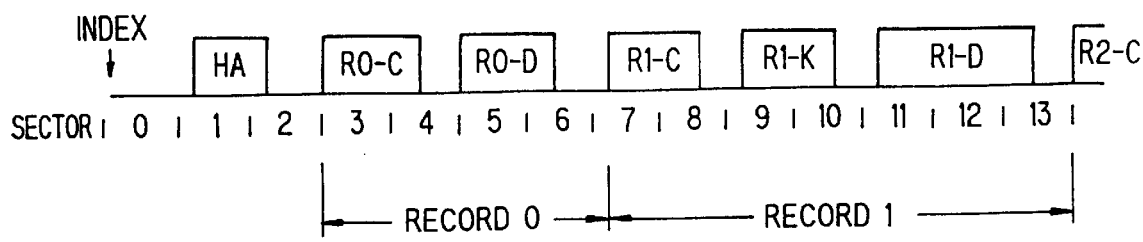

If it is assumed that the sector and the record have the relationship shown in FIG. 39B, record number 0 (HA) is recorded in correspondence with the sector value 0 in the sector directory, record number 1 (=record R0) in correspondence with the sector values 1 and 2, record number 2 (=record R1) in correspondence with the sector values 3 to 6, record number 3 (=record R2) in correspondence with the sector values 7 to 13, . . . . In other words, if the record Rj exists in the sector i, the record number of the next record Rj+1 is recorded in correspondence with the sector i. When the record Rj exists from the sectors i to (i+m), the sector values i to (i+m) are recorded in the count portion of the record Rj+1 as the directory restoring data.

(c-2) Record reading and writing sequences

Figure 40:
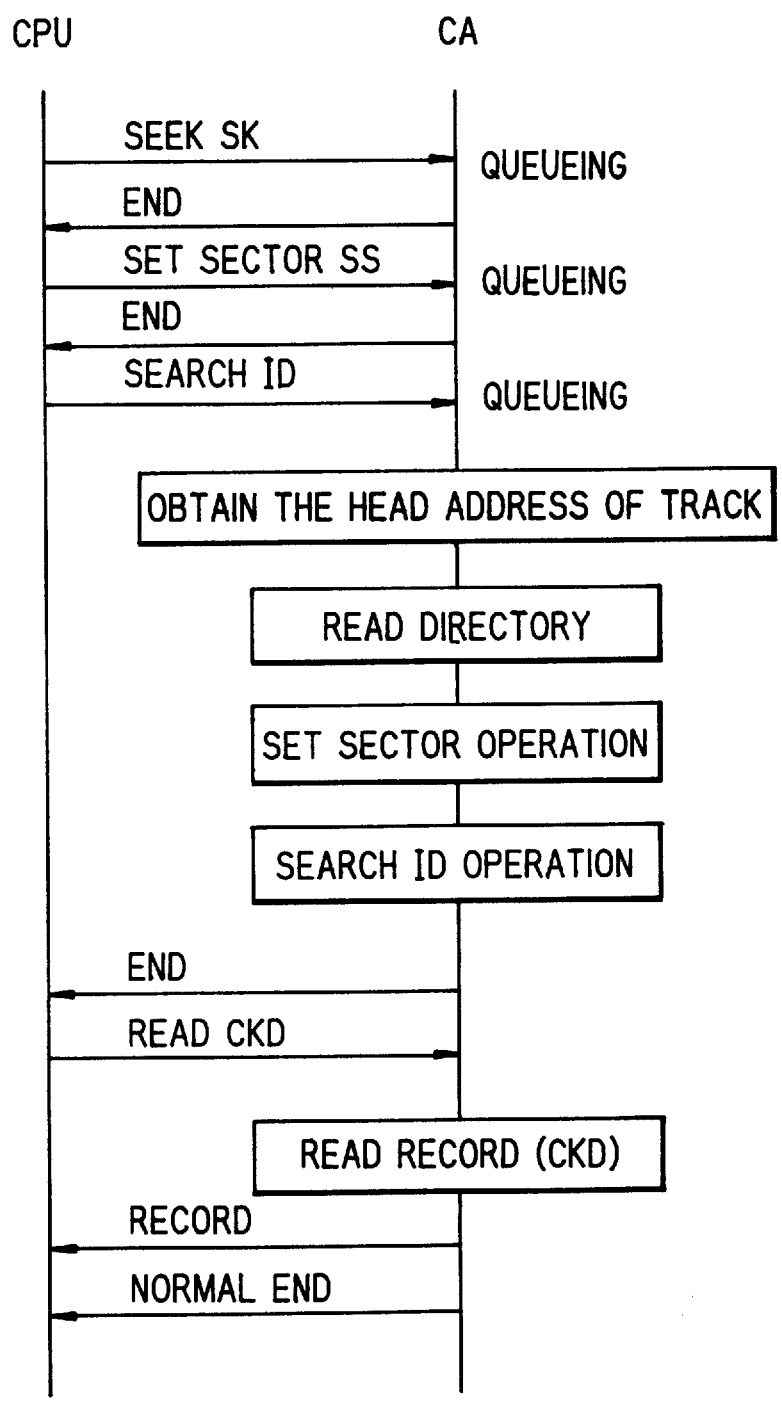
FIG. 40 is an explanatory view of a record reading sequence.

FIG. 40 shows a record reading sequence in the semiconductor disk apparatus. It is assumed that the semiconductor disk apparatus has the same structure as that shown in FIG. 1.

When a seek command SK is issued from the host apparatus CPU, the channel adapter CA immediately returns an operation end signal to the host apparatus CPU. When the host apparatus CPU receives the operation end signal, the host apparatus CPU issues a set sector command SS. Thereafter, the host apparatus CPU similarly issues a search ID command SID. The channel adapter receives these commands.

When the channel adapter CA receives the search ID command, the channel adapter CA converts the logical address (track address CCHH) designated by the seek command into the physical address of the semiconductor disk. Since the physical address indicates the head address of the track, in other words, the head address of the directory, the channel adapter CA reads the directory from the semiconductor disk.

The channel adapter CA then obtains the record number corresponding to the sector value designated by the set sector command from the sector directory (set sector operation). Thereafter, the channel adapter CA obtains the address of the record number from the record directory and reads the count portion of the record from the address. The channel adapter CA judges whether or not the CCHHR of the record included in the count portion is coincident with the CCHHR of the target record which is designated by the search ID command, and if the answer is YES, the search ID operation is finished. If the answer is NO, the CCHHR of the record of the next record number is read and similar processing is executed.

If the target record is obtained, the channel adapter CA returns an operation end signal to the host apparatus. The host apparatus then issues a record read command (READ CKD) to the channel adapter CA. The channel adapter CA sequentially reads and transfers the count portion C, the key portion K and the data portion D of the target record to the host apparatus CPU, and finally transfers a normal end signal to the host apparatus CPU, thereby finishing a series of record reading processing.

Figure 41:
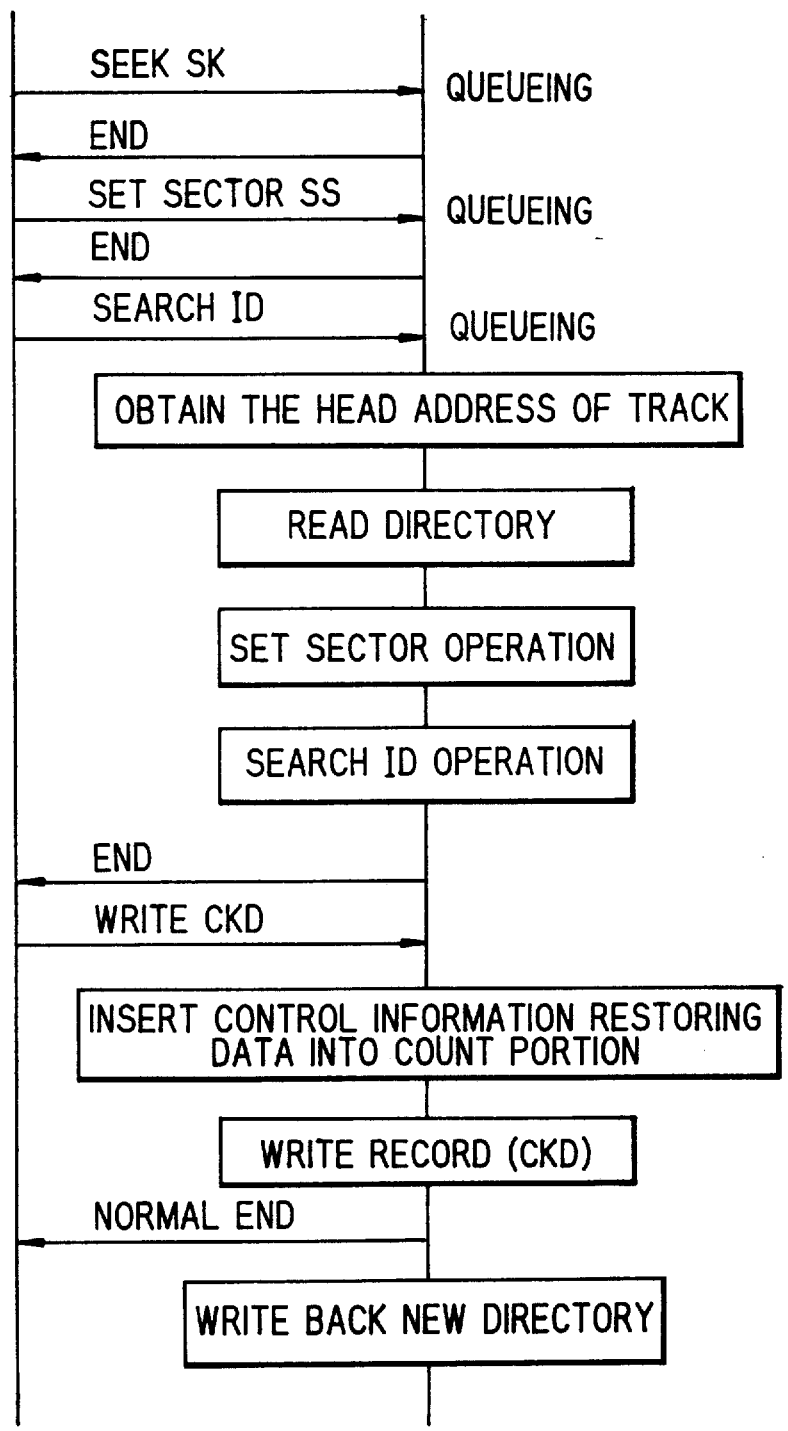
FIG. 41 is an explanatory view of a record writing sequence.

FIG. 41 shows a record writing sequence in the semiconductor disk apparatus. The same processing as the processing in the record reading sequence is executed until the end of the search ID operation.

If the target record is obtained by the search ID operation, the channel adapter CA returns an operation end signal to the host apparatus. The host apparatus then issues a record write command (WRITE CKD) to the channel adapter CA. The channel adapter CA obtains the directory restoring data (control information restoring data) Ai, Si and inserts the data Ai, Si into the count portion of the record to be written, and then stores the record.

After the end of the recording operation, the channel adapter CA reports the end of the writing operation to the host apparatus CPU. The channel adapter CA then updates the contents of the directory and writes back the directory to the position of the semiconductor disk at which the directory has been recorded.

(c-3) Processing when directory read error occurs (1) Skip search processing

When the channel adapter CA cannot read the directory at the time of reading or writing a record, the channel adapter CA searches the target record by using the directory restoring data recorded in the count portion of each record (skip search). The case in which the directory cannot be read is, for example, the occurrence of a 2-bit error and the occurrence of an ID error (error in writing the directory). If such an error occurs, the channel adapter CA cannot obtain the directory, which makes normal access impossible.

Figure 42:
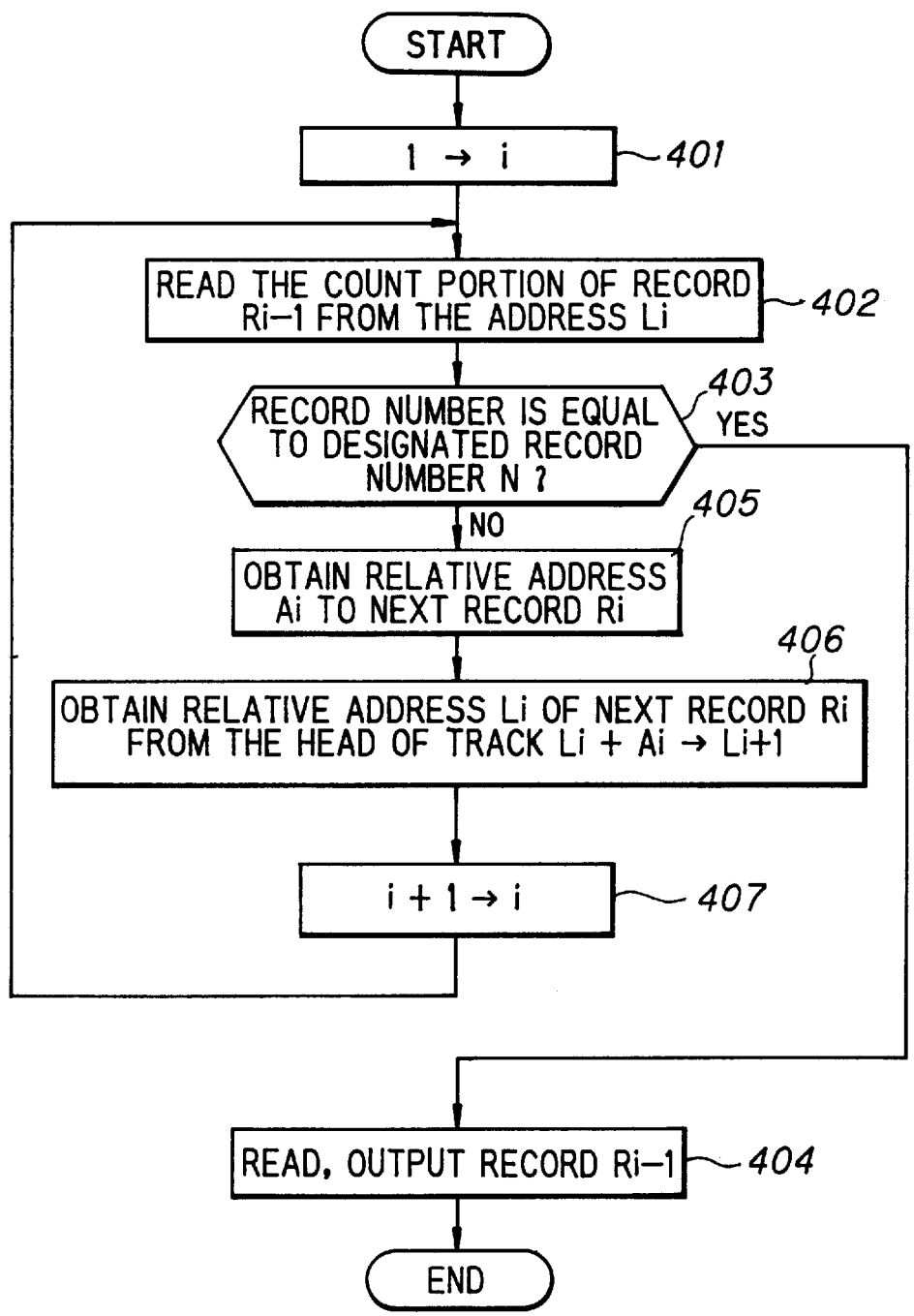
FIG. 42 is a flow chart of skip search processing utilizing control information restoring data when the channel adapter CA cannot read the directory.
Figure 43:
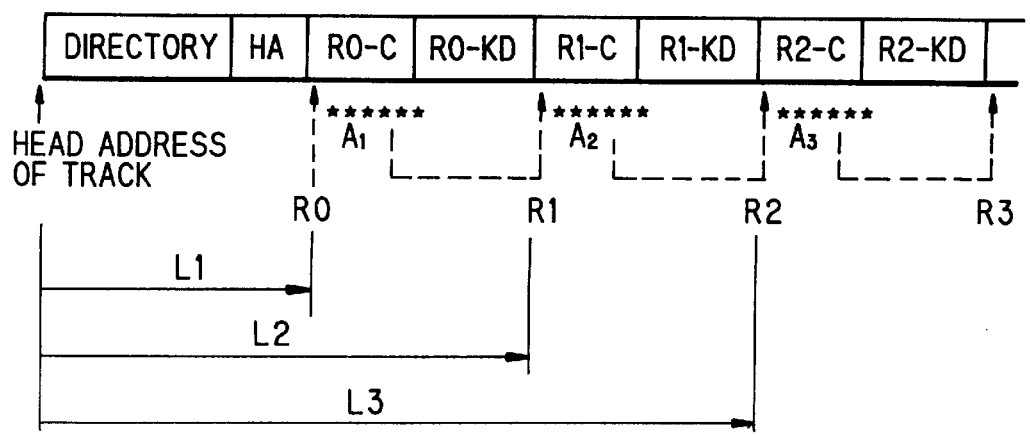
FIG. 43 is an explanatory view of the skip search processing shown in FIG. 42.

FIG. 42 is a flow chart of skip search processing when the channel adapter CA cannot read a directory, and FIG. 43 is an explanatory view of the skip search processing.

The channel adapter CA first sets i to 1 (step 401). The channel adapter CA then reads the count portion C0 of the record Ri−1 (=R0) from the address L1 (=L1) (step 402). The position of the record R0 from the head of the track is fixed at L1, which is a known value.

After reading the count portion, the channel adapter CA judges whether or not the record number included in the count portion is equal to the record number N which is designated by the access command (step 403). If the answer is in the affirmative, the record Ri−1 is the target record, so that the channel adapter CA reads or renews the record (step 404).

However, if the answer is in the negative at the step 403, the relative address (offset address) Ai to the next record Ri which is recorded in the count portion of the record Ri−1 is obtained (step 405).

The offset address Li+1 of the record Ri from the head of the track is next calculated from the following formula:

$$Li+Ai \rightarrow Li+1 \text{(step 406)},$$

and thereafter 1 is added to i (i+1→i, step 407). The processing at the step 402 and thereafter is repeated. Finally, at the step 403 the record number recorded in the count portion becomes equal to the record number N which is designated by the access command, the target record is obtained and the record is read or renewed.

In this manner, it is possible to automatically search the target record designated by the host apparatus by using the directory restoring data recorded in each record and to read or renew the target record at the time of reading or writing the record under the instruction from the host apparatus even if the directory cannot be read.

(2) Reconstruction of directory

When the directory cannot be read, it is possible to search the target record by the above-described skip search processing. In this case, it is also possible to reconstruct the directory by using the directory restoring data in parallel with the skip search processing.

Record directory reconstruction processing

Figure 44:
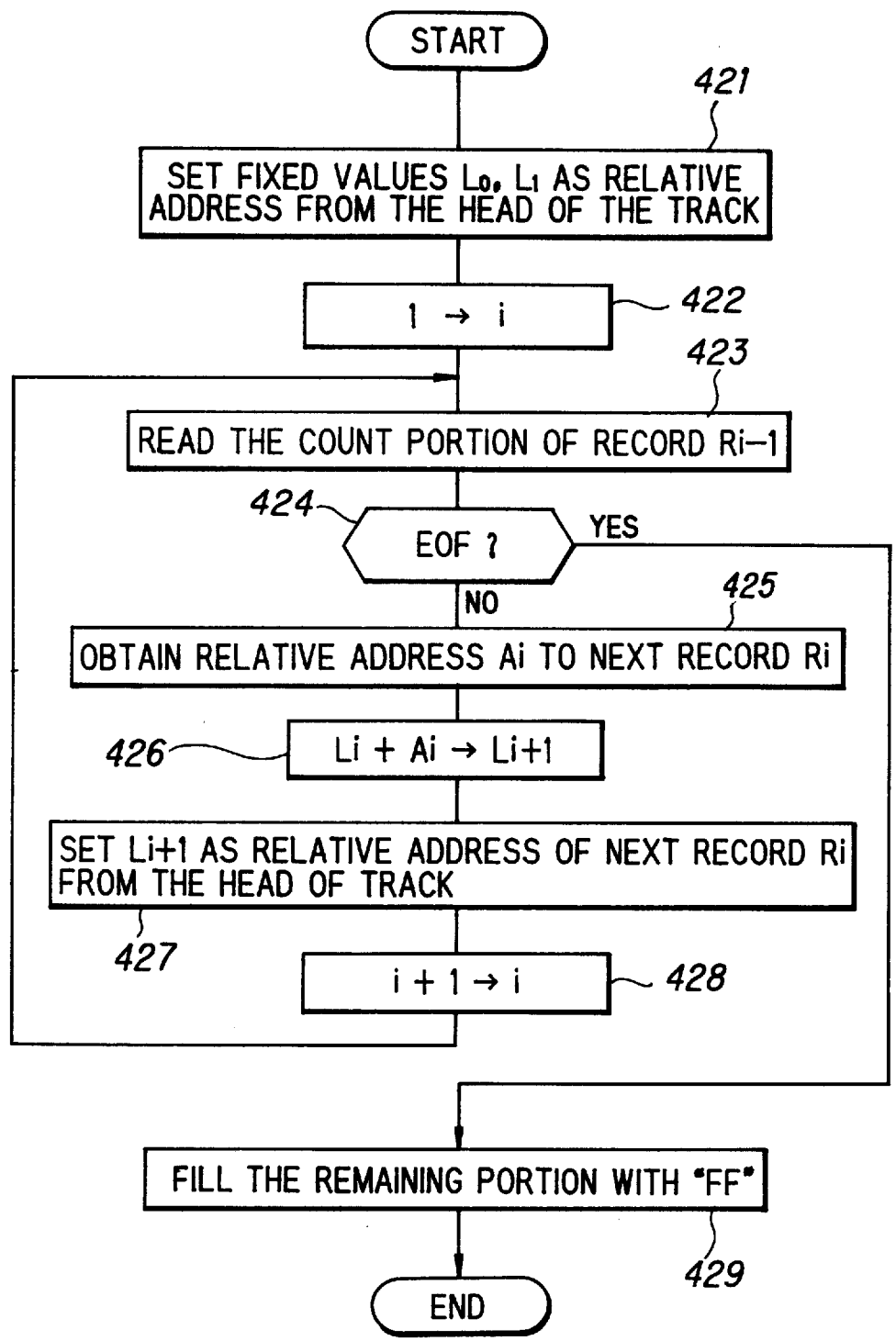
FIG. 44 is a flow chart of record directory reconstruction processing.

FIG. 44 is a flow chart of record directory reconstruction processing. The values (fixed values) L0 and L1 are set in the record directory as the offset address of the home address HA and the record R0, the count portion of the record Ri−1 is read (steps 422, 423).

Judgement is made as to whether or not the read information is the end mark (EOF) (step 424), and if the answer is in the negative, the relative address (offset address) Ai from the count portion of the record Ri−1 to the next record Ri is obtained (step 425).

When Ai is obtained, the offset address Li+1 of the record Ri from the head of the track is calculated from the following formula:

$$Li+Ai \rightarrow Li+1 \text{(step 426)}.$$

The value Li+1 is set in the record directory as the offset address Li+1 of the record Ri from the head of the track (step 427), and 1 is added to i (i+1→i, step 428). The processing at the step 423 and thereafter is repeated.

Finally, at the step 424, the end mark EOF is detected. When the end mark EOF is detected, the remaining portion of the record directory is filled with "FF" (step 429).

In this manner, it is possible to restore the re cord directory.

Sector directory reconstruction processing

Figure 45:
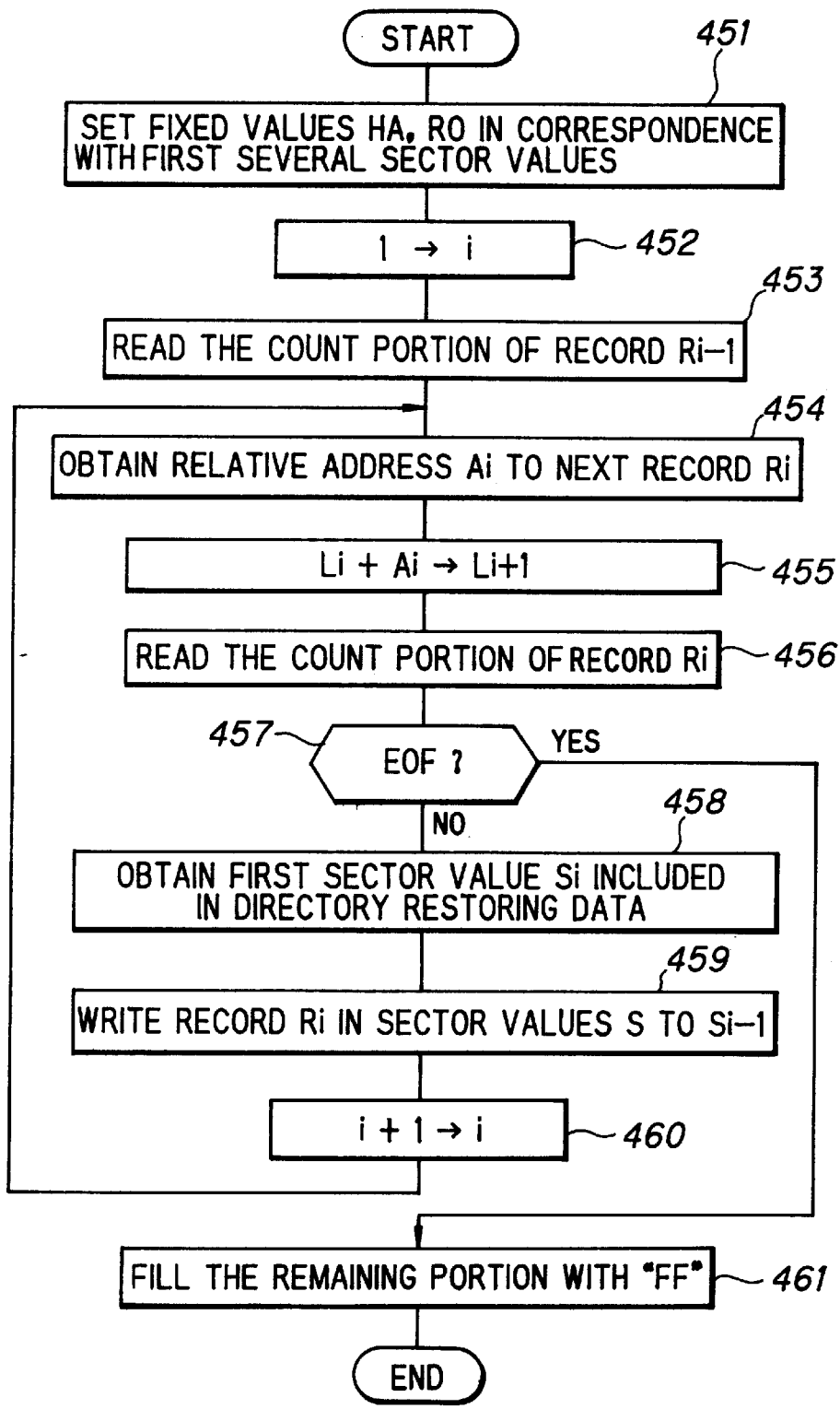
FIG. 45 is a flow chart of sector directory reconstruction processing.

FIG. 45 is a flow chart of sector directory reconstruction processing. The positions of the home address HA and the count portion of the record R0 are fixed. Therefore, the numbers 0, 1 which specifies HA and R0 are set in correspondence with first several sector values in the sector directory (step 451). It is assumed that the value obtained by adding 1 to the sector value of the last sector at which number 1 corresponding to the record R0 is set is S.

Thereafter, i is set to 1 and the count portion of the record Ri−1 is read (steps 452, 453) The relative address (offset address) Ai from the count portion of the record R−1 to the next record Ri is obtained (step 454).

When Ai is obtained, the offset address Li+1 of the record Ri from the head of the track is calculated from the following formula:

$$Li+Ai \rightarrow Li+1 \text{ (step 455)}.$$

The count portion of the record Ri is then read (step 456) and judgement is made as to whether or not the read information is the end mark (EOF) (step 457), and if the answer is in the negative, the first sector value Si to which the record Ri belongs is obtained from the count portion of the record Ri (step 458). The number (i+1) of the record Ri is then written in correspondence with the sector values S to Si−1 in the sector directory (step 459). Thereafter, 1 is added to i (i+1→i, step 460). The processing at the step 454 and thereafter is repeated by setting the value Si as S.

Finally, at the step 457, the end mark EOF is detected. When the end mark EOF is detected, the remaining portion of the record directory is filled with "FF" (step 461).

In this manner, it is possible to restore the sector directory.

According to this structure, since it is possible to automatically reconstruct a directory by the channel adapter CA by using the directory reconstructing data at the time of reading or writing the record under the instruction from the host apparatus even if there is an error which makes it impossible to read the directory, high-speed access is possible at the next access by using the directory.

Figure 46:
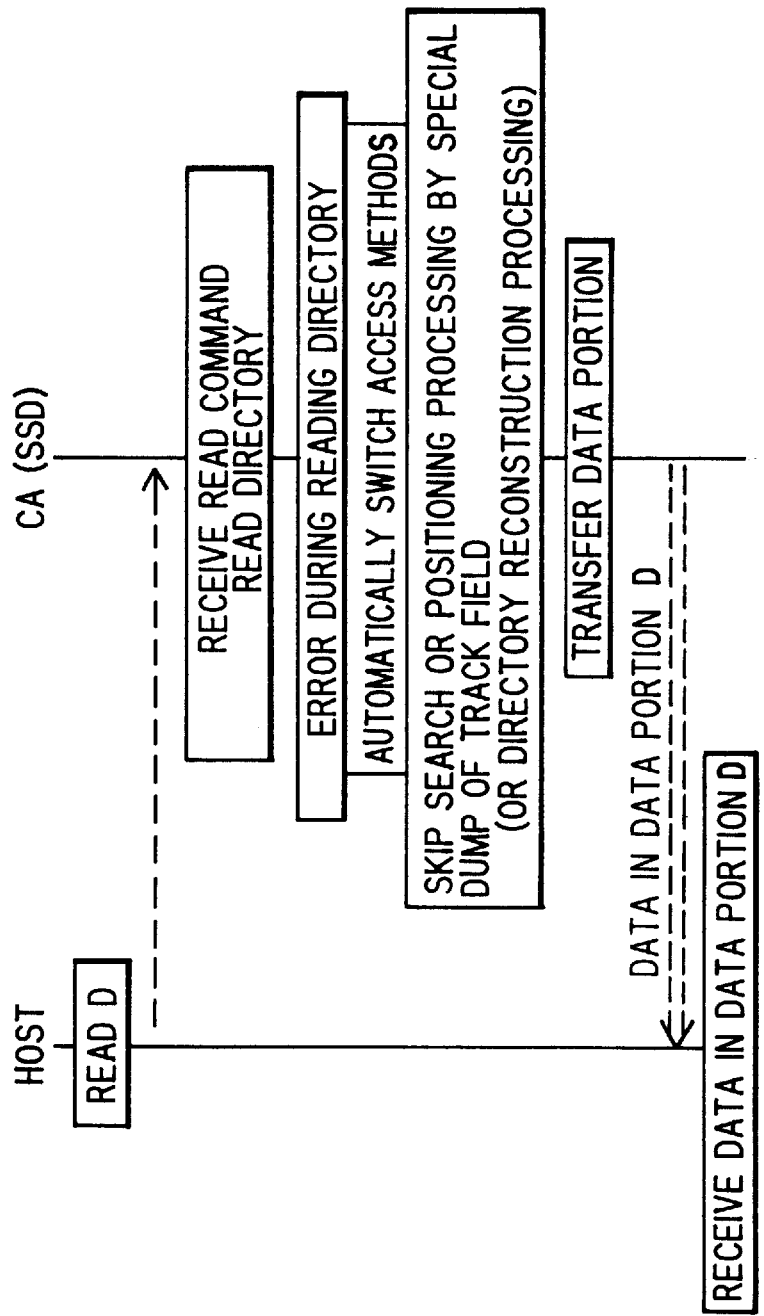
FIG. 46 is an explanatory view of the entire processing sequence when an error is caused in the directory.

FIG. 46 schematically explains the entire processing sequence when an error occurs in the directory. When a record read command READ D is issued from the host apparatus CPU, the channel adapter CA receives the command and reads the directory. When there is an error in the process of reading the directory, the channel adapter CA switches the access method from a normal access method using the directory into a skip search method. Thereafter, the target record is searched in accordance with the skip search processing shown in FIG. 42, and when the target record is obtained, it is transferred to the host apparatus. In this case, it is possible to reconstruct the record directory and the sector directory by the executing the reconstruction processing shown in FIGS. 44 and 45 in parallel with the skip search processing. Alternatively, it is possible to execute positioning processing under a special dump command which will be described later in place of the skip search processing.

(c-4) An other processing when there is an error in the directory

In the above explanation, when there is an error in the directory, the target record is automatically searched and read/written, and the directory is reconstructed. Alternatively, the search of the target record and the reconstruction of the directory may be executed in accordance with the instruction from the host apparatus CPU.

Figure 47:
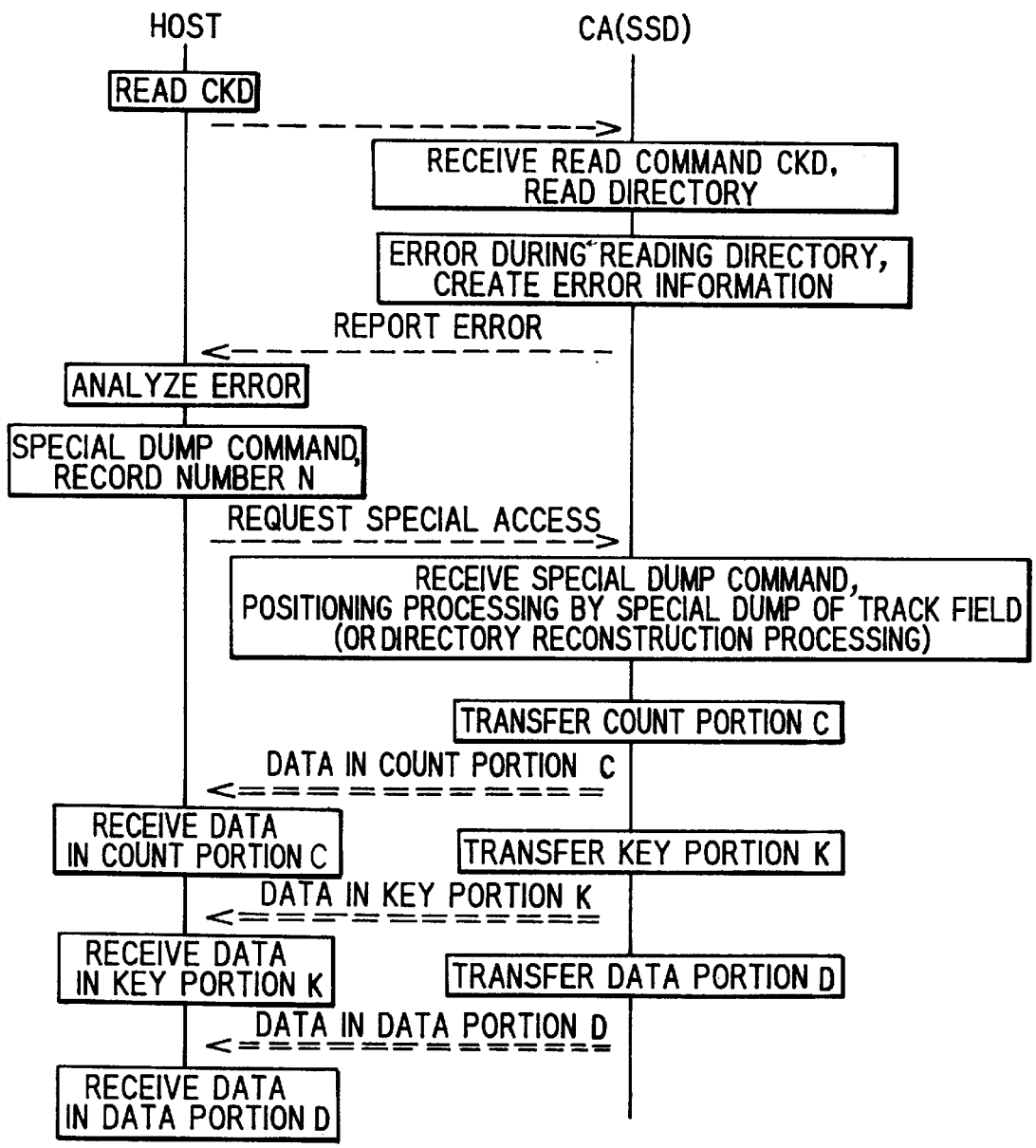
FIG. 47 is an explanatory view of the record read processing adopting a special track access method.

FIG. 47 is an explanatory view of record read processing in such a case.

When a record read command READ CKD is issued from the host apparatus CPU, the channel adapter CA receives the command and reads the directory. When there is an error in the process of reading the directory, the channel adapter CA creates error information and reports it to the host apparatus.

The host apparatus CPU analyzes the error and issues a special dump command and the record number N to the channel adapter CA. When the channel adapter CA receives the special dump command, it searches the target record in accordance with the processing shown in FIG. 42. When the target record is obtained, the channel adapter CA sequentially reands and transfers the count portion C, the key portion K and the data portion D of the target record to the host apparatus CPU.

In this case, the directory reconstruction processing is not included in the special dump command. If the directory reconstruction processing is included, the record directory reconstruction processing and the sector directory reconstruction processing shown in FIGS. 44 and 45 are executed, and the reconstructed directories are written at the head of the corresponding track.

(c-5) Processing when directory error occurs during copying operation

When there is a trouble in a semiconductor disk apparatus, the contents of the semiconductor memory module in which the error has occurred are copied to the spare semiconductor memory module HS, and thereafter the semiconductor memory module having the trouble is replaced by another semiconductor memory module under the control of the service adapter SA (first embodiment, see FIG. 1).

In this case, the portion except the track in which the error has occurred is copied by the service adapter SA and with respect to the track field in which the error has occurred, the service adapter SA requests the corresponding channel adapter CA to copy the data there. This is because, the service adapter SA cannot process for each field of the count portion the key portion and the data portion and only copies data for each block having a fixed length (64 bytes). For this reason, even if the data in the track field in which the error has occurred are copied by the service adapter SA, it is impossible to add error occurrence information to the directory or the count portion, so that it cannot be guaranteed that the user data are accessible. To prevent this, the service adapter SA requests the channel adapter CA to copy the data in the track field in which the error has occurred, and the channel adapter CA copies the data for each field from the directory to the end mark EOF.

When the channel adapter CA detects the field (count portion, key portion, data portion) in which there is a memory error during a copying process, the channel adapter CA regards only that field (if it is the count portion, the record as a whole) as invalid and rewrites the necessary control information in the count portion. In the case of there is a memory error in the directory, however, if th e directory is dealt with as invalid, all the records in the track field also become invalid. In addition, since the channel adapter CA cannot read the directory, it is impossible to judge the format of the track.

To solve this problem, the channel adapter CA copies the fixed positions, i.e., the field HA and the record R0, and with respect to the fields of the record R1 and thereafter, the channel adapter CA copies the data to the end mark while obtaining the address of the next record field by the skip search processing. That is, if the count portion of the current record is read, it is possible to obtain the offset address Ai to the next record, which is necessary for the reconstruction of the directory, and the sector value Si, the key length KL and the data length DL of the current record, so that it is possible to copy the current record field and then move to the next processing. By continuing this operation until the detection of the end mark, it is possible to copy all the fields except the directory. In addition, since this copying process includes the directory restoring data reading processing for all the records that are necessary for the reconstruction of the directory, it is naturally possible to reconstruct the directory. In this manner, it is possible to prevent the user data from being lost at the time of replacing the memory by executing the directory reconstruction processing simultaneously with the copying processing for each field and finally writing the reconstructed directory in the directory region of the copy receiver.

Figure 48:
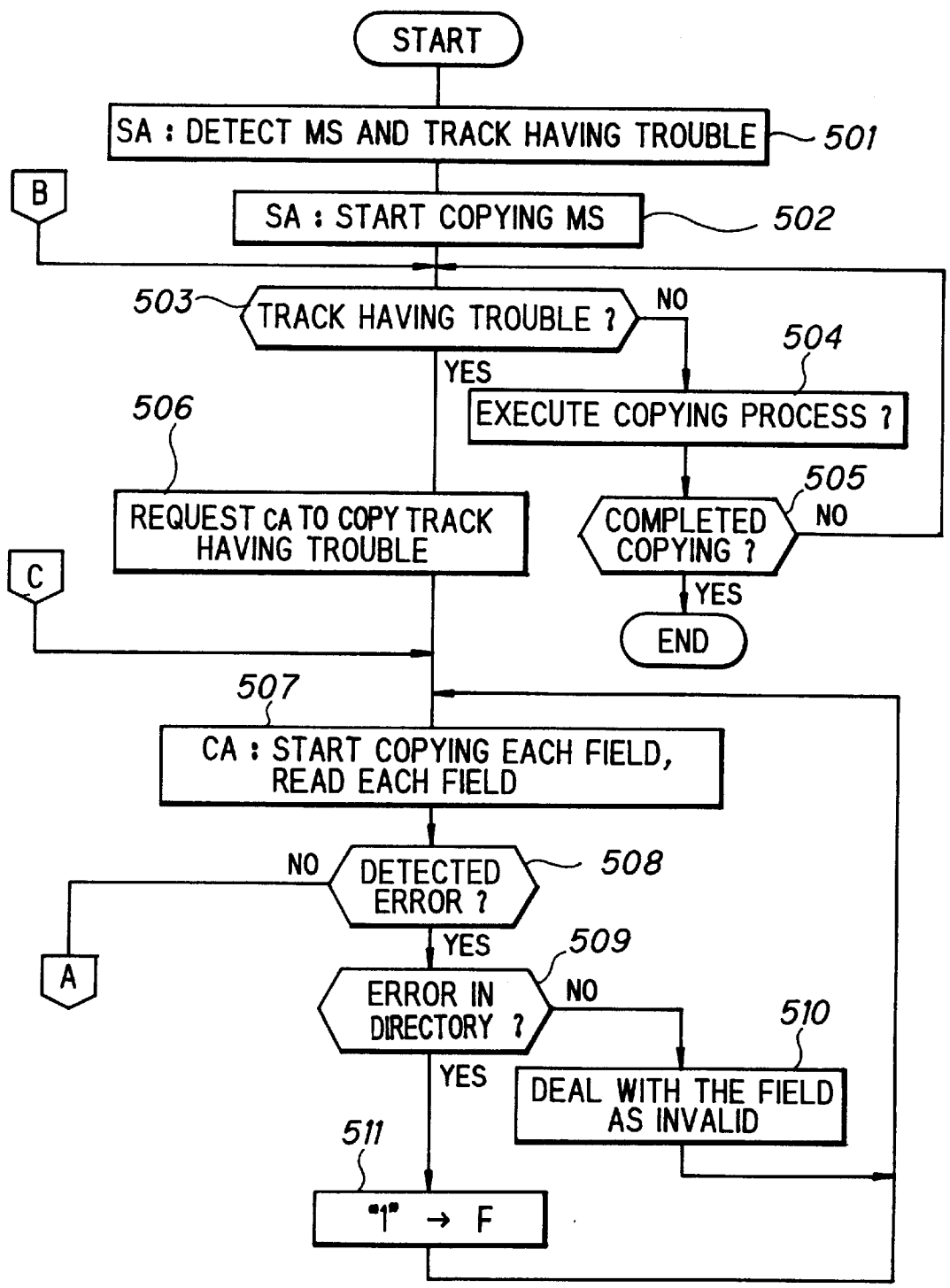
FIG. 48 is a flow chart 1 of a copying process when a memory error occurs in a semiconductor memory.
Figure 49:
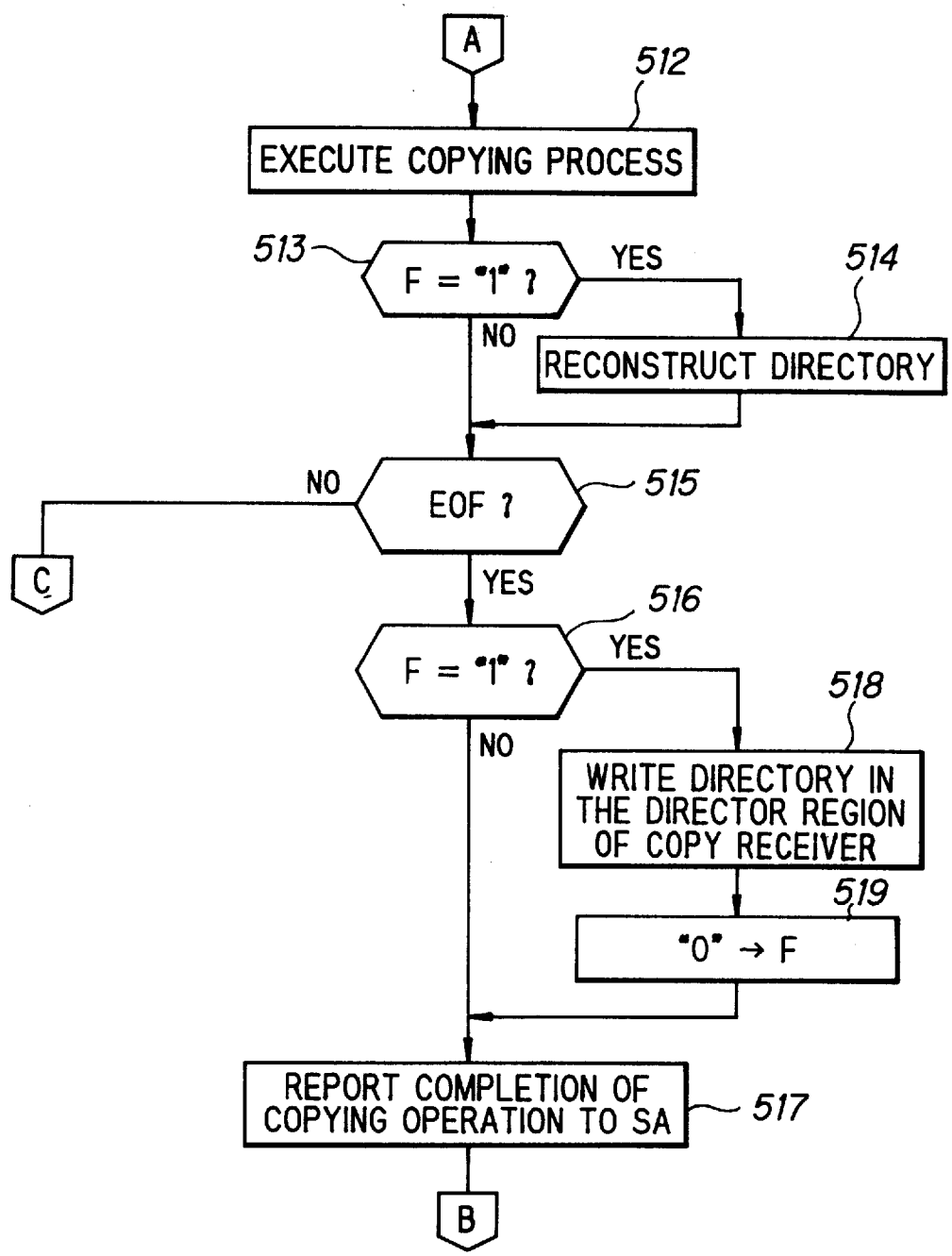
FIG. 49 is a flow chart 2 of a copying process when a memory error occurs in a semiconductor memory.

FIGS. 48 and 49 are flow charts of a copying process when a memory error occurs in a semiconductor memory. It is assumed that the semiconductor disk device has the structure shown in FIG. 1.

When the service adapter SA detects the semiconductor memory module MS and the track in which an error has occurred (step 501), the service adapter SA starts copying the semiconductor memory module MS (step 502).

Judgement is made as to whether or not the track being copied is the track in which the error has occurred (step 503), and if the answer is in the negative, the track copying processing is executed (step 504). After copying the track, the service adapter SA judges whether or not the MS copying operation is finished (step 505), and if the answer is in the negative, the processing at the step 503 and thereafter is repeated with respect to the next track.

If the track being copied is the track in which the error has occurred at the step 503, the service adapter SA requests the channel adapter CA to copy the track (step 506). The channel adapter CA starts copying and reading each field (step 507). If an error is detected in a field (step 508), whether or not the error is an error in the directory is judged (step 509). If the answer is NO, the field is dealt with as invalid (step 510) and the process is returned to the step 507. If the answer is YES at the step 509, the flag F is set at "1" ("1"→F, step 511) and the process is returned to the step 507.

If there is no error at the step 508, the field is copies (step 512), and thereafter whether or not F="1" is judged (step 513). If F="1", the directory reconstruction process is executed (step 514).

Thereafter, judgement is made as to whether or not the end mark EOF is detected (step 515), and if the answer is in the negative, the process is returned to the step 507 so as to copy the subsequent fields.

If the end mark EOF is detected at the step 515, whether or not F="1" is judged (step 516). If F="0", the channel adapter CA reports the end of the copying operation to the service adapter SA (step 517). The service adapter SA repeats the copying processing at the step 503 and thereafter with respect to the next track.

If F="1" at the step 516, the reconstructed directory is written in the directory region of the copy receiver (step 518), and the flag F is set at "0" ("0"→F, step 519). The channel adapter CA then reports the end of the copying operation to the service adapter SA (step 517). The service adapter SA repeats the copying processing at the step 503 and thereafter with respect to the next track.

As described above, according to the third embodiment, even if the directory cannot be read, it is possible to access the target record without using the directory designated by the host apparatus by using the control information restoring data which is included in each record. In addition, since it is possible to reconstruct the directory by using the control information restoring data, access using the reconstructed directory is enabled thereafter. The access speed is therefore not reduced.

Even if an error which makes it impossible to read the directory is detected during the copying process at the time of replacement of the semiconductor memory module due to a memory error, the position of the subsequent record is serially obtained from the control information restoring data included in the current record, it is possible to copy the record. In addition, it is also possible to reconstruct the directory and write the reconstructed directory in the directory region of the copy receiver.

(d) Fourth embodiment (d-1) Entire structure

Figure 50:
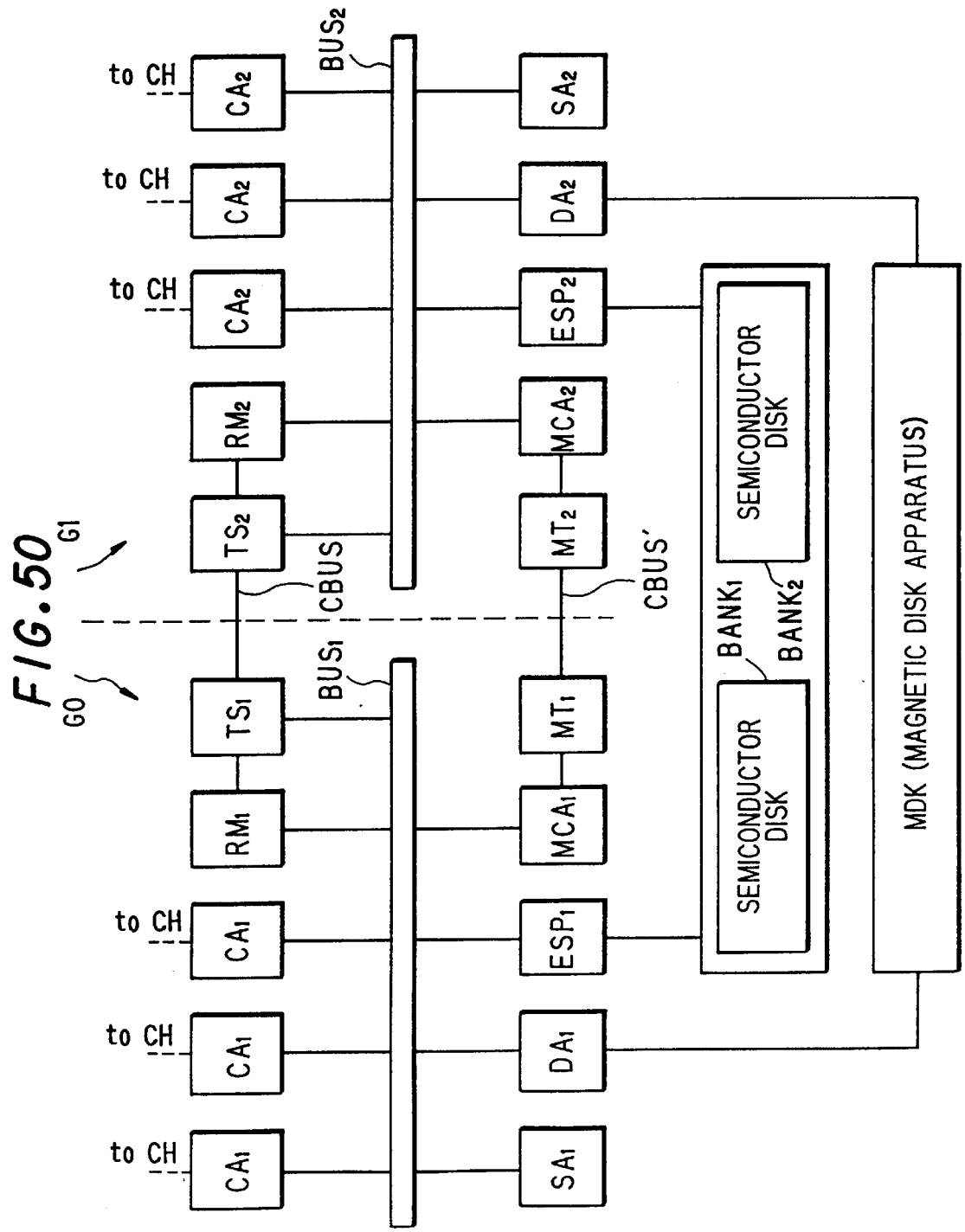
FIG. 50 shows the structure of a semiconductor disk apparatus (fourth embodiment)

FIG. 50 shows the structure of an embodiment of a semiconductor disk apparatus for compressing data and storing the compressed data in a semiconductor disk. The semiconductor disk apparatus has a duplicate structure, and a module having a subscript 1 is a module of a first semiconductor disk apparatus G0, a module having a subscript 2 is a module of a second semiconductor disk apparatus G2, and a module having no subscript is a common module.

The symbols $CA_1$, $CA_2$ represent channel adapters for executing an interface control to a host apparatus CPU or a channel. Each of the channel adapters $CA_1$, $CA_2$ is connected to the host apparatus (channel). The symbols $RM_1$, $RM_2$ represent resource managers for conducting controlling operations such as exclusive control and for controlling the resource of the system as a whole. The symbols $TS_1$, $TS_2$ denote table storage portions for storing a table such as an exclusive control table, $SA_1$, $SA_2$ service adapters, MDK a magnetic disk apparatus for temporarily backing up the contents of a memory, $DA_1$, $DA_2$ device adapters for conducting interface control to the magnetic disk apparatus, and $BANK_1$, $BANK_2$ semiconductor disks on which a plurality of semiconductor memory modules MS and a spare semiconductor memory module HS are mounted. The symbols $ESP_1$, $ESP_2$ denote ports for controlling the access to the semiconductor disk, $MT_1$, $MT_2$ semiconductor memory tables for storing whether each block is in use or not when a semiconductor memory is divided into a multiplicity of blocks having a predetermined size, and $MCA_1$, $MCA_2$ semiconductor memory control adapter for allocating an unused block to a channel adapter $CA_1$ ($CA_2$) at the request thereof and changing the unused block into a used block in the semiconductor memory table MT1 (MT2). The semiconductor memory control adapter $MCA_1$ ($MCA_2$) also changes a predetermined used block into an unused block in the semiconductor memory table MT1 (MT2) when a channel adapter $CA_1$ ($CA_2$) requests it to release the block.

The symbols $BUS_1$, $BUS_2$ represent buses including a control bus, a data transfer bus and a service bus. The symbol CBUS denotes a copy bus for immediately copying the contents of one table storage portion $TS_1$ ($TS_2$) to the other table storage portion $TS_2$ ($TS_1$) when the contents thereof are changed, and CBUS' a copy bus for copying the contents of one semiconductor memory table $MT_1$ ($MT_2$) to the other semiconductor memory table $MT_2$ ($MT_1$) when the contents thereof are changed.

The first and second semiconductor disk apparatuses G0, G1 have a symmetrical structure with respect to the dotted line at the center. The host apparatus CPU is symmetrically connected to the channel adapters $CA_1$, $CA_2$ of the first and second semiconductor disk apparatuses.

(d-2) Structure of semiconductor memory

Figure 51:
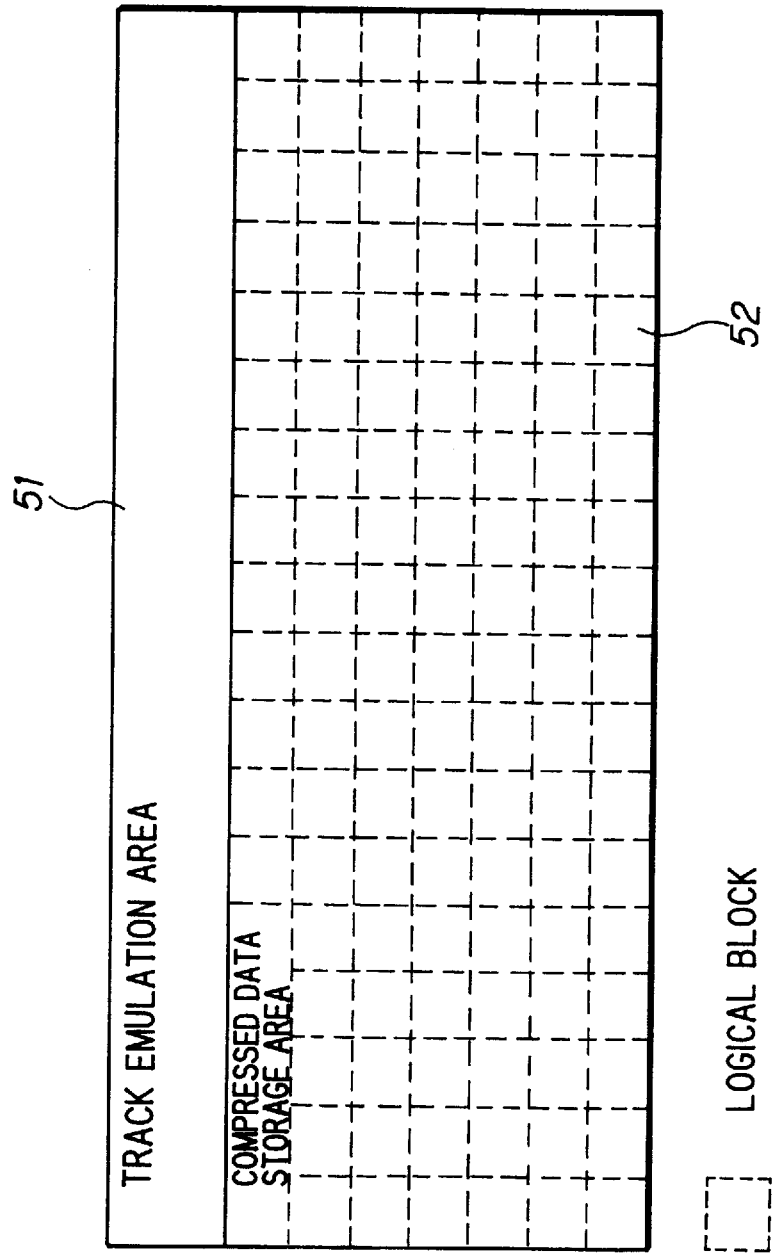
FIG. 51 is an explanatory view of a memory map.

The semiconductor memory BANK is divided into a track emulation area 51, and a compressed data storage area 52 for storing the data portion of each record in a compressed state, as shown in FIG. 51. The compressed data storage area 52 is divided into a multiplicity of blocks (logical blocks) having a predetermined size. The data portion of each record is compressed and the compressed data portions are stored in a necessary number of consecutive or dispersed blocks.

Figure 52:
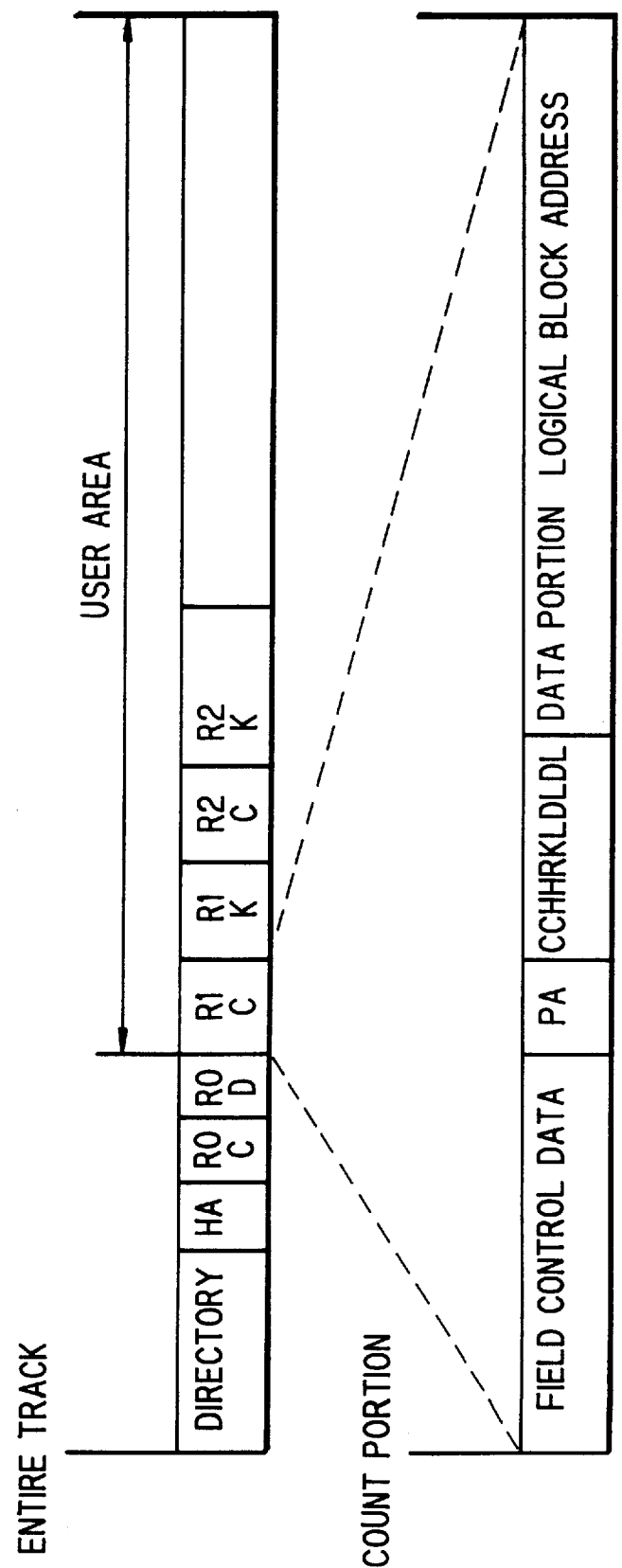
FIG. 52 is an explanatory view of a track emulation area.

Each track of the track emulation area 51 has the same track format as that shown in FIG. 36 except that the data portion of a record is not stored therein. A directory, a home address HA, the count portion and the data portion of a record 0, and the count portion and the key portion of each record are stored in each track field, as shown in FIG. 52. In the count portion C of each record Ri (i=1, 2 . . . ) are recorded control information (Field Control data) for controlling the field, a record number (CCHHR), a key length KL, a data length DL, and a block number (block address) of the compressed data storage area 52 for storing the data portion.

Figure 53:
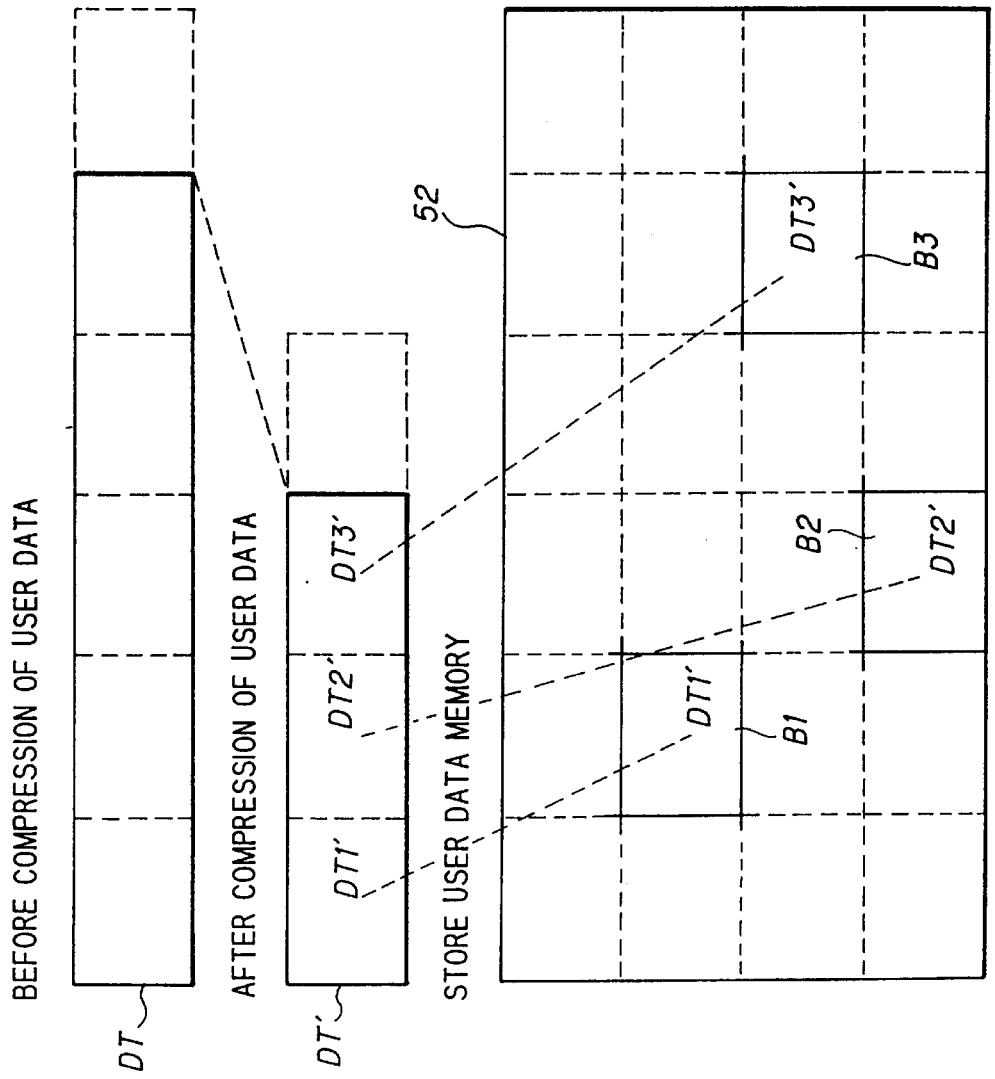
FIG. 53 is an explanatory view of a method of storing user data in logical blocks.

In writing a record, the data portion DT of the record is compressed to obtain compressed data DT', as shown in FIG. 53, and the number (3 in FIG. 53) of blocks which correspond to the size of the compressed data DT' are secured. First to third parts of the compressed data DT' are stored in the secured blocks B1 to B3, and the addresses of these blocks B1 to B3 are inserted into the count portion and stored in the track emulation area 51.

(d-3) Structure of channel adapter

Figure 54:
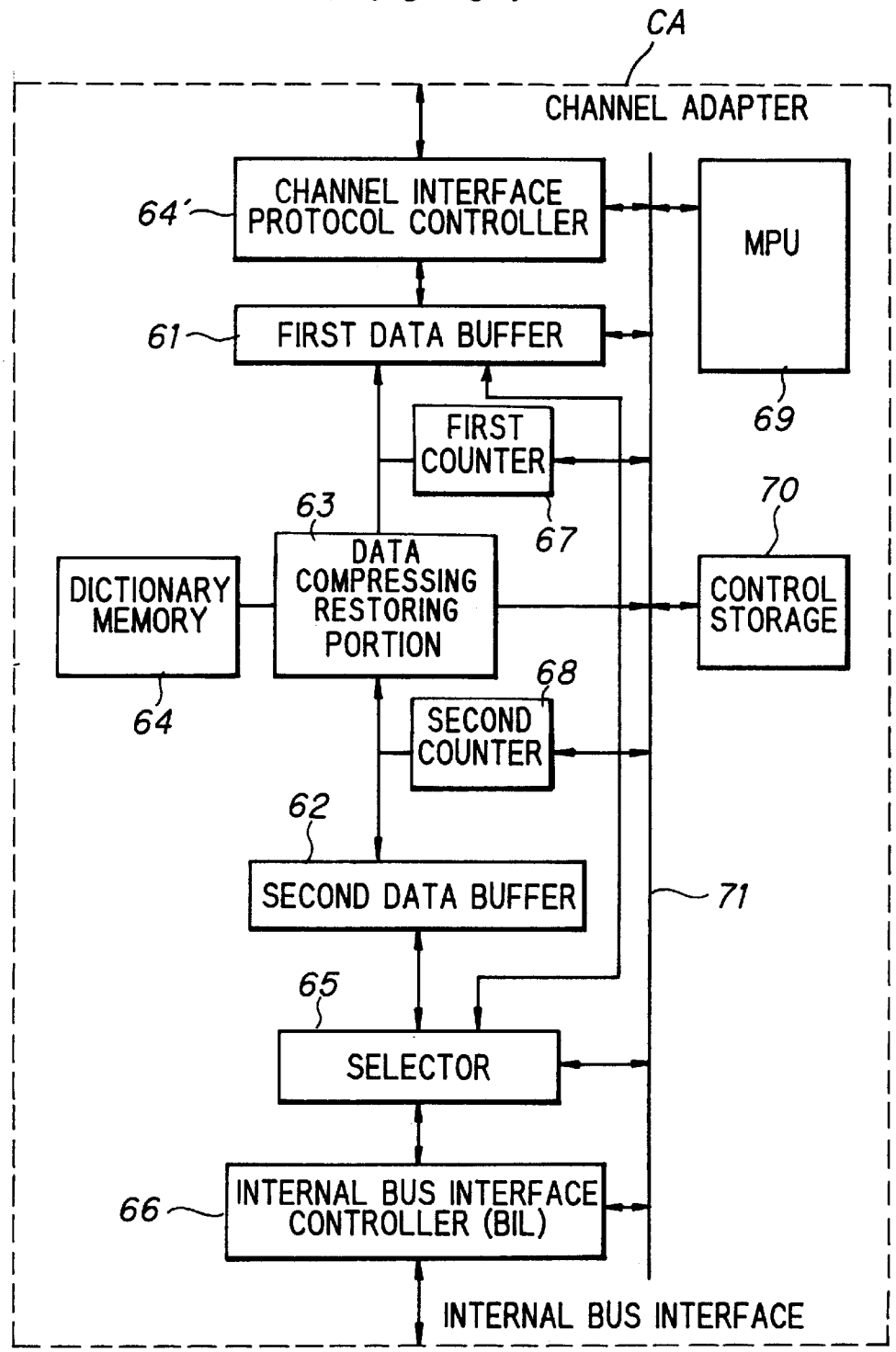
FIG. 54 shows the structure of a channel adapter.

FIG. 54 shows the structure of a channel adapter for executing a compression/restoration process. In the channel adapter, the reference numeral 61 represents a first data buffer having a large capacity (e.g., for 1 track) for storing uncompressed data, 62 a second data buffer having a large capacity (e.g., for 1 track) for storing compressed data, 63 a data compressing/restoring portion for compressing/restoring data, 64 a dictionary memory for assisting the data compressing/restoring portion 63 in the compressing/restoring operation, 64' a channel interface protocol controller, 65 a selector for selectively outputting data from the first and second data buffers 61, 62, and selectively inputting data to the first and second data buffers 61 and 62, 66 an internal bus interface controller BIL for controlling the internal bus which is connected to another unit within the semiconductor disk apparatus, 67 a first counter for counting the bytes of uncompressed data, 68 a second counter for counting the bytes of compressed data, 69 an MPU for controlling these hardware resources by a microprogram, 70 a control storage for storing a program, control table, etc., and 71 a bus.

(d-4) Record reading sequence

Figure 55:
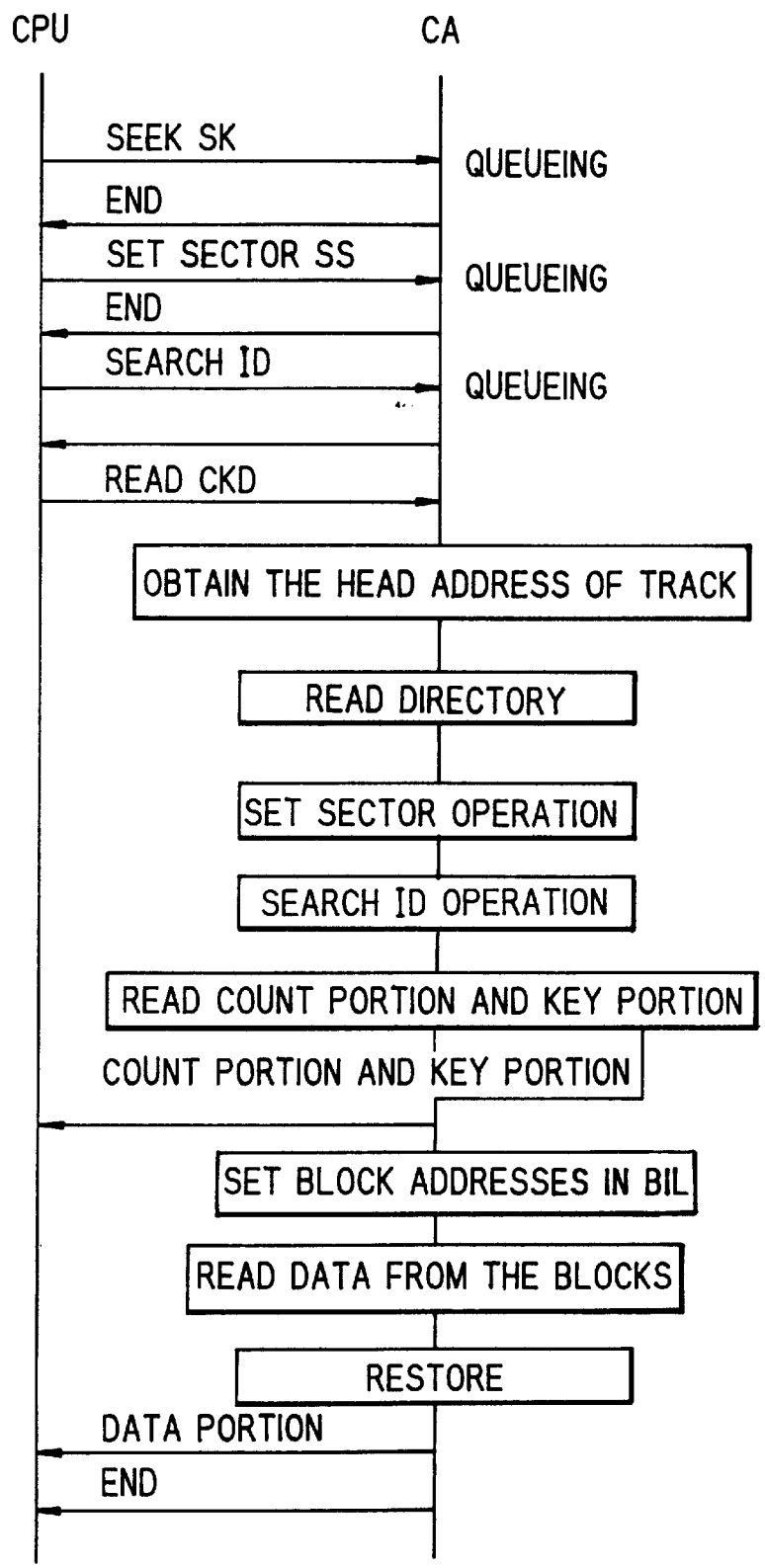
FIG. 55 is an explanatory view of a record reading sequence.

FIG. 55 is an explanatory view of a record reading sequence.

When a seek command SK is issued from the host apparatus CPU, the channel adapter CA (MPU 69) immediately returns an operation end signal to the host apparatus CPU. When the host apparatus CPU receives the operation end signal, the host apparatus CPU issues a set sector command SS. Thereafter, the host apparatus CPU similarly issues a search ID command SID and a read command READ CKD. The channel adapter receives these commands.

When the MPU 69 of the channel adapter CA receives the read command, the MPU 69 converts the logical address (track address CCHH) designated by the seek command into the physical address of the semiconductor disk by using the control table. Since the physical address indicates the head address of the corresponding track in the track emulation area 51, in other words, the head address of the directory, the MPU 69 reads the directory from the semiconductor disk.

The MPU 69 then obtains the record number corresponding to the sector value designated by the set sector command from the sector directory (set sector operation). Thereafter, the MPU 69 obtains the address of the record indicated by the record number from the record directory and reads the count portion of the record from the address. The MPU 69 judges whether or not the CCHHR of the record included in the count portion is coincident with the CCHHR of the target record which is designated by the search ID command, and if the answer is YES, the ID operation is finished. If the answer is NO, the record of the next record number is read and similar processing is executed.

If the target record is obtained, the MPU 69 reads the count portion C and the key portion K of the target record via the internal bus interface controller BIL 66. The selector 65 sets the count portion C and the key portion K in the first data buffer 61, and the channel interface protocol controller 64' transfers the count portion C and the key portion K to the host apparatus CPU.

The MPU 69 of the channel adapter CA next sets the block address (not restricted to one) written in the count portion C in the BIL 66. Thenceforth, the BIL 66 sequentially reads the data from the blocks designated by the block addresses and writes them in the second data buffer 62 via the selector 65. The data compressing/restoring portion 63 restores the compressed data, sets the restored data and transfers it to the channel interface protocol controller 64.

(d-5) Record rewriting process

Figure 56:
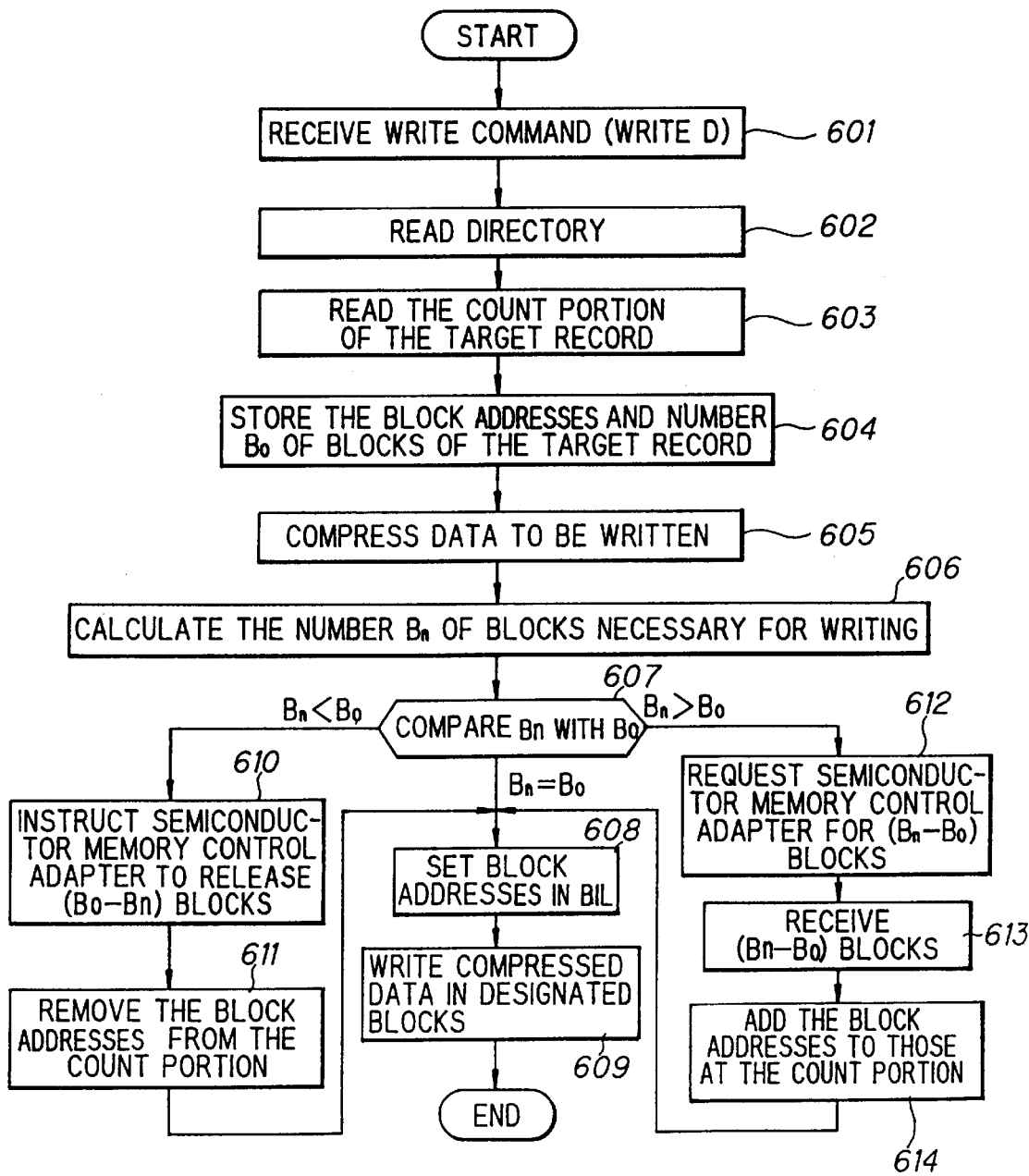
FIG. 56 is a flow chart of a record rewriting process.
Figure 57:
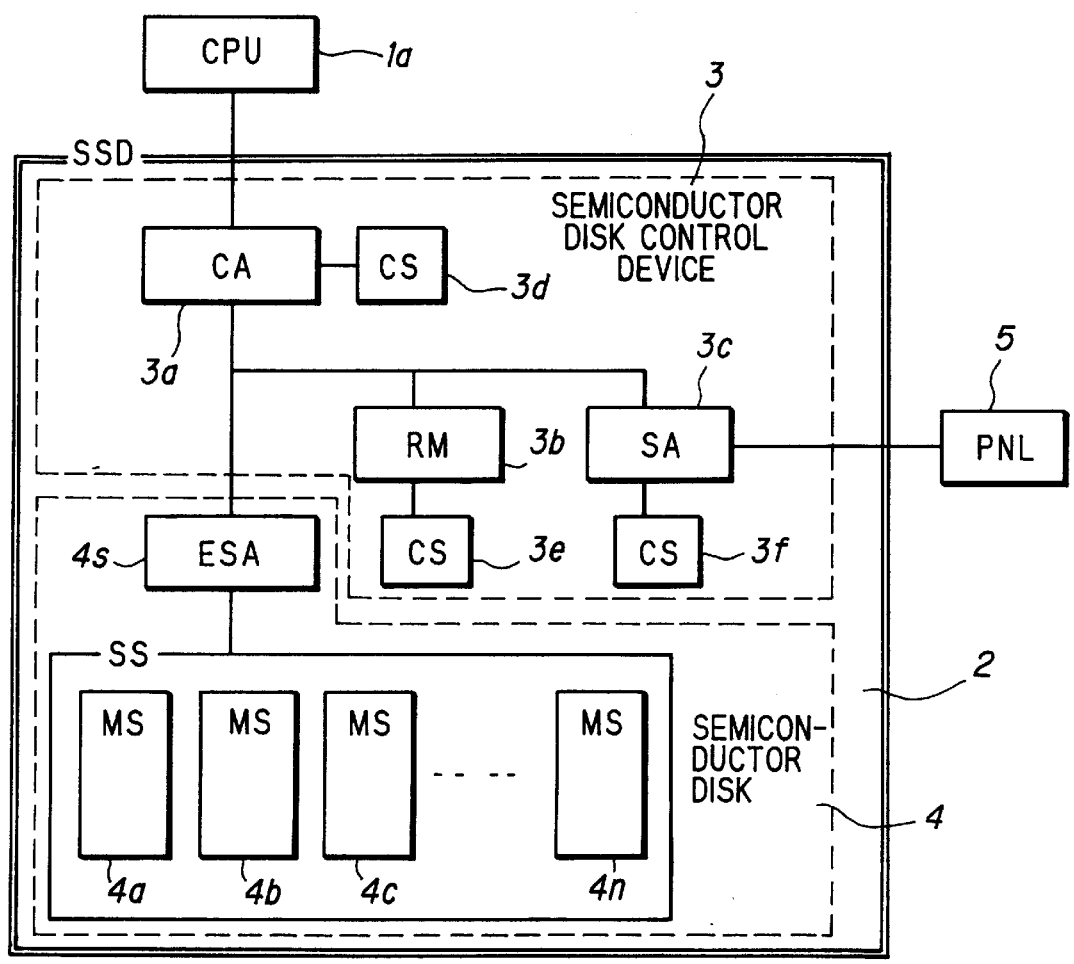
FIG. 57 shows the structure of a conventional semiconductor disk apparatus.

FIG. 56 is a flow chart of a record rewriting process. The same processing as in the record reading sequence is executed until the reception of a write command (WRITE D).

When the channel interface protocol controller 64' receives a write command (WRITE D) from the host apparatus, it temporarily stores the record in the first data buffer 61 having a large capacity (step 601). The MPU 69 of the channel adapter CA then converts the logical address (track address CCHH) designated by the seek command into the physical address of the semiconductor disk by using the control table (step 602). Since the physical address indicates the position of the directory of the corresponding track, the directory is read.

Then the address of the target record is obtained in the same way as in the case of a read command, and the count portion of the target record at the address is read (step 603).

The block addresses and the number $B_0$ of blocks included in the count portion are stored (step 604). The block addresses and the number $B_0$ of blocks indicate the addresses and the number of blocks in which the data portion of the target record are stored.

After storing the block addresses and the number $B_0$ of blocks, or in parallel with this operation, the data compressing/restoring portion 63 compresses the data portion of the record and stores the compressed data in the second data buffer 62 (step 605). Since the bytes of the compressed data are monitored by the second counter 68, it is possible to obtain the necessary number $B_n$ of blocks by dividing the bytes by the capacity of one block (step 606).

When the number $B_n$ of blocks is obtained, the number $B_n$ is compared with the number $B_0$ of blocks which stores the data portion of the target record (step 607), and if $B_n = B_0$ the current block addresses are set in the BIL 66 as they are (step 608), and the compressed data are written in the blocks designated by the block addresses (step 609).

On the other hand, if $B_n < B_0$, the MPU 69 designates $(B_0 - B_n)$ block addresses which become unnecessary to a semiconductor memory control adapter MCA. The semiconductor memory control adapter MCA then changes the contents of the memory table MT so that the designated block addresses are not in use (step 610). The MPU 69 eliminates the block addresses which are designated to be released, from the count portion of the target record (step 611). The MPU 69 of the channel adapter CA then sets the necessary number of block addresses in the BIL 66 (step 608) and writes the compressed data in the blocks designated by the block addresses (step 609).

If $B_n > B_0$, the MPU 69 requests the semiconductor memory control adapter MCT to allocate $(B_n - B_0)$ blocks, which is the deficiency (step 612). When the semiconductor memory control adapter MCA receives the request for blocks, it obtains the required number of unused blocks by reference to the memory table MT, changes the unused blocks to used blocks in the memory table MT and informs the channel adapter CA of the block addresses of the obtained unused blocks. When the MPU 69 of the channel adapter CA receives the necessary number of block addresses from the semiconductor memory control adapter MCA (step 613), it adds the block addresses of the newly allocated blocks to the block addresses in the count portion of the target record (step 614). Thereafter, the MPU 69 of the channel adapter CA sets the necessary number of block addresses for writing a new record in the BIL 66 (step 608) and writes the compressed data in the blocks designated by the block addresses (step 609).

As described above, according to the fourth embodiment, since the user data are compressed before storage, the memory is effectively used, while since the control information is not compressed, no restoration process is necessary, thereby shortening the data access time of the host apparatus. In addition, according to the fourth embodiment, in writing compressed data in a semiconductor memory, it is possible to effectively release and allocate a memory region, thereby enabling the efficient use of the memory.

Advantages of the first embodiment

According to the first embodiment, it is possible to evacuate the contents of the memory of the semiconductor memory module in which a memory error has occurred without stopping the semiconductor disk apparatus simply by adding the spare semiconductor disk apparatus, so that a large-scale maintenance device is obviated.

Since the semiconductor memory module is minutely divided into access control units and the contents of the memory are copied one access control unit at a time, it is possible to conduct exclusive control one access control unit at a time, so that the host apparatus can access the access control unit which is not the object of copying even if the service adapter is in the process of copying another access control unit. In other words, the copying operation exerts no deleterious influence on the access of the host apparatus.

In addition, since every time one access control unit is finished copying, the service adapter SA changes the physical address in the copy management table CTL provided in the channel adapter CA, etc. to the physical address of the copy receiver, it is possible to access the copied access control unit (in the spare semiconductor memory module) immediately after the copy.

Furthermore, the copy management table for recording whether or not copy has been normally finished is provided, and each module including the channel adapter CA, etc. refers to the copy management table at the time of reading data, and when the region (track) being accessed is normal, the module accesses the region. On the other hand, if the region is abnormal, the module deals with it as an error. As a result, when an error occurs during copying, the erroneous data is not read, thereby preventing malfunction.

In addition, according to the first embodiment, each module including the channel adapter CA, etc. writes data in the two storage areas designated by the original physical address and the physical address of the copy receiver in accordance with the forking process when the data are written in the semiconductor memory module which is in the process of copying. It is therefore possible to copy at high speed without the need for updating the control table every time one control unit is finished copying.

Furthermore, since the copying operation is suspended during the copying process so as to preferentially execute the write command from the host apparatus CPU, the access speed of the host apparatus is not reduced. In this case, if the access unit as the object of writing is larger than the access unit for copying, it is possible to regard the access unit portion as finished copying, so that the copying speed can be enhanced.

Advantages of the second embodiment

According to the second embodiment, even if the structure of the semiconductor disk is changed, it is possible to correctly restore the data evacuated to the backup device before the change of the structure to the semiconductor disk after the change, and the user data before the change are usable without being dealt with as invalid. Accordingly, it is possible to freely change the structure of the semiconductor disk as occasion demands.

Advantages of the third embodiment

According to the third embodiment, since the count portion of each records includes directory restoring data (control information restoring data), even if the directory cannot be read, it is possible to access the target record designated by the host apparatus by using the control information restoring data which is included in each record. In addition, since it is possible to reconstruct the directory by using the control information restoring data, access using the reconstructed directory is enabled thereafter. The access speed of the host apparatus is therefore not reduced.

In addition, even if an error is detected during the copying process at the time of replacement of the semiconductor memory module due to an error, the position of the subsequent record is serially obtained from the control information restoring data included in the current record, so that it is possible to copy the record. Furthermore, it is also possible to reconstruct the directory and write the reconstructed directory in the directory region of the copy receiver.

Advantages of the fourth embodiment

According to the fourth embodiment, since the user data are compressed before storage, the memory is effectively used, while since the control information is not compressed, no restoration process is necessary, thereby shortening the data access time of the host apparatus. In addition, according to the fourth embodiment, in writing compressed data in a semiconductor memory, it is possible to effectively release and allocate a memory region, thereby enabling the efficient use of the memory.

As many apparently widely different embodiments of the present invention can be made without departing from the spirit and scope thereof, it is to be understood that the invention is not limited to the specific embodiments thereof except as defined in the appended claims.

What is claimed is:

1. A semiconductor disk apparatus comprising:

a plurality of semiconductor memory modules, each of said semiconductor memory modules being divided into a plurality of access control units;

a spare semiconductor memory module being divided into a plurality of spare access control units;

first means including a control table for storing a correspondence between a logical address and a physical address for each of said access control units, for converting said logical address sent from a host apparatus into said physical address using said control table, and for controlling data writing and reading operations to a memory area of any of said semiconductor memory modules designated by said converted physical addresses;

an exclusive controller for executing exclusive control for each of said access control units with respect to the access to any of said semiconductor memory modules; and second means for detecting a memory error in said semiconductor memory modules and copying contents of a semiconductor memory module in which said memory error has occurred into said spare semiconductor memory module one of said access control units at a time, and for changing said physical address of each of said access control units copied into said spare semiconductor memory module in said control table to physical addresses of said spare semiconductor memory module each time said one of said access control units is copied into said spare semiconductor memory module;

wherein said second means copies said contents of said semiconductor memory module in which said memory error has occurred, to said spare semiconductor memory module one of said access control units at a time.

2. A semiconductor disk apparatus according to claim 1, further comprising a copy management table which indicates whether or not the copying operation for each access control unit has been normally finished;

wherein said first means refers to said copy management table at the time of reading data, and accesses a region of the access control unit when it is normal, while judging there is an error and not accessing said region when it is abnormal, and said first means writes data in a region being accessed at the time of writing data and deals with copy management data corresponding to said region as normal.

3. A semiconductor disk apparatus comprising:

a plurality of semiconductor memory modules, each of said semiconductor memory modules being divided into a plurality of access control units;

a spare semiconductor memory module being divided into a plurality of spare access control units;

first means including a control table for storing a correspondence between a logical address and a physical address for each of said access control units, for converting said logical address sent from said host apparatus into a physical address using said control table and for controlling data writing and reading operations to a memory area of any of said semiconductor memory modules designated by said converted physical address;

an exclusive controller for executing exclusive control for each of said access control units with respect to the access to any of said semiconductor memory modules; and second means for detecting a memory error in said semiconductor memory modules and copying contents of a failed semiconductor memory module in which said memory error has occurred to said spare semiconductor memory module;

wherein before copying said contents of said failed semiconductor memory module to said spare semiconductor memory module, said second means changes said control table so that an original physical address and a spare physical address of said spare semiconductor memory module correspond to a logical address of said failed semiconductor memory module, and instruct said first means to write data into two storage areas designated by said original physical address and said spare physical address of said spare semiconductor memory module, said second means copying said contents of said failed semiconductor memory module to said spare semiconductor memory module one of said access control units at a time and changing said control table after all said contents of said failed semiconductor memory module are copied into said spare semiconductor memory module so that only said spare physical address of said spare semiconductor memory module corresponds to said logical address of said failed semiconductor memory module.

4. A semiconductor disk apparatus according to claim 3, wherein said second means does not copy the access unit region in which said data are written in accordance with said write command when the access unit as the object of said write command is larger than the access unit for copying, while copying said access unit region again from the beginning one access unit for copying at a time when said access unit as the object of said write command is smaller than said access unit for copying.

5. A semiconductor disk apparatus according to claim 3, wherein said second means does not copy the access unit region in which said data is written in accordance with said write command when the access unit as the object of said write command is larger than the access unit for copying, while copying the portion except for said access unit region when said access unit as the object of said write command is smaller than said access unit for copying.

6. A semiconductor disk apparatus including a semiconductor disk to which a plurality of logical drives are allocated, controlling means for controlling data writing and reading operations to the semiconductor disk, a disk device to which a plurality of logical drives are allocated and which backs up the semiconductor disk, and a disk adapter for evacuating data of each of the logical drives which is stored in the semiconductor disk to a corresponding logical drive of the disk device, and for restoring each of the data evacuated to the corresponding logical disk drive of the disk device to a corresponding logical drive of the semiconductor disk, the semiconductor disk apparatus comprising:

a first structure information table disposed in the semiconductor disk for storing a head address and a capacity of each of the logical drives of the semiconductor disk;

a second structure information table disposed in the disk device for storing a head address and a capacity of each of the logical drives of the disk device;

instructing means for instructing a change in a structure of the semiconductor disk and a restoration of the data evacuated to the disk device to the semiconductor disk; and means for creating an address conversion table for converting a disk address into a semiconductor disk address for each of the logical drives of the semiconductor disk and the disk device by using said first structure information table after said change and said second structure information table when said first structure information table is changed by said instructing means during the evacuation of the data;

wherein the disk adapter restores the data evacuated to each of the logical drives of the disk device to the corresponding logical drives of the semiconductor disk by using said address conversion table, and after the data is restored, makes said second structure information table coincident with said first structure information table.

7. A semiconductor disk apparatus according to claim 6, wherein said means for creating said address conversion table is provided in said disk adapter, and said disk adapter creates said address conversion table when said disk adapter is instructed to restore said data.

8. A semiconductor disk apparatus including a semiconductor memory and a control device for controlling an operation of writing and reading records to the semiconductor memory, wherein a directory is provided for each memory region of the semiconductor memory which corresponds to a track of a magnetic disk apparatus so as to store control information of the records which are stored in the memory regions, and the control device rewrites the records in the memory regions or reads the records from the memory regions on the basis of the control information, the control information including a record directory for specifying an offset address of each of the records from a head of the track and a sector directory for specifying correspondence between each of the records and each of the sectors which is obtained by dividing the track into a plurality of sectors, the semiconductor disk apparatus comprising:

means for adding control information restoring data which is necessary for restoring a part of the control information stored in the directory to each of the records and storing each of the records in the memory region, the control information restoring data including the offset address from the head of a current record to the head of a next record and a sector value of a sector to which the current record belongs; and means for searching the record designated by a host apparatus by using the control information restoring data added to each of the records when an error occurs in said directory at the time of reading from or writing to the records.

9. A semiconductor disk apparatus according to claim 3 wherein said first means asks said exclusive controller for permission to access a region when it receives data write command from a host;

said exclusive controller notifies the second means that there is a write command if said region as the object of said write command is in the process of copying;

said second means stops copying by the notification; and then said first means writes data in said region.

10. A semiconductor disk apparatus according to claim 8, further comprising:

means for reconstructing said control information by using said control information restoring data of each record.

11. A semiconductor disk apparatus comprising:

a semiconductor disk; and a control device which controls the operation of writing and reading a record to said semiconductor disk in accordance with instructions from a host apparatus, said semiconductor disk including:

a control information storage region for storing control information contained in said record; and a data storage region which is divided into a multiplicity of blocks for storing a data portion contained in said record, said control device including:

a compression/restoration mechanism for compressing and restoring said data portion contained in said record;

means for storing said compressed data portion in a predetermined block of said data storage region at the time of reception of a write command from said host apparatus, and adding a block address of said predetermined block to which said compressed data portion is stored to said control information and storing said control information in said control information storage region;

a semiconductor memory controller for controlling each used/unused block;

means for obtaining at the time of rewriting said record, a number $B_o$ of blocks in which original data of said record are stored by reading said control information of said record from said control information storage region, and the necessary number of blocks $B_n$ for storing said compressed data which are obtained by compressing new data specified by the write command, and writing said compressed data to said blocks in which the original data have been stored if $B_n = B_o$;

means for requesting from said semiconductor memory controller for said blocks which are deficient if $B_n > B_o$, for writing said compressed data in the blocks in which the original data have been stored and the blocks which are designated by said semiconductor memory controller, and for adding the block addresses of the designated blocks to said control information; and means for reporting the existence of surplus blocks to said semiconductor memory controller, if $B_n < B_o$, for writing said compressed data in the blocks in which the original data have been stored except in the surplus blocks reported to said semiconductor memory controller, and for eliminating the block addresses of said surplus blocks from said control information.

* * * * *

UNITED STATES PATENT AND TRADEMARK OFFICE
CERTIFICATE OF CORRECTION

PATENT NO. : 5,859,960
DATED : January 12, 1999
INVENTOR(S) : Kurihara et al.

It is certified that error appears in the above-identified patent and that said Letters Patent is hereby corrected as shown below:

Column 18, line 18, delete "14bis" and insert --14b is-- therefor

Column 19, line 13, delete "theological" and insert --the logical-- therefor

Column 24, line 2, after "RO," insert --respectively (Step 421). Thereafter, I is set to 1 and--

Column 24, line 22, delete "re cord" and insert --record-- therefor

Column 24, line 34, delete "R-1" and insert --Ri - 1-- therefor

UNITED STATES PATENT AND TRADEMARK OFFICE
CERTIFICATE OF CORRECTION

PATENT NO. : 5,859,960
DATED : January 12, 1999
INVENTOR(S) : Kurihara et al.

It is certified that error appears in the above-identified patent and that said Letters Patent is hereby corrected as shown below:

Column 25, line 13, delete " an other" and insert --another-- therefor

Column 26, line 8, delete " if th e" and insert --if the-- therefor

Column 33, line 53, delete "3" and insert --9-- therefor

Column 33, line 62, delete "3" and insert --9-- therefor

Signed and Sealed this

Thirtieth Day of November, 1999

Attest:

Q. TODD DICKINSON

Attesting Officer

Acting Commissioner of Patents and Trademarks